US012787585B2

(12) United States Patent
Yamazaki et al.

(10) Patent No.: US 12,787,585 B2
(45) Date of Patent: Nov. 3, 2026

(54) DISPLAY DEVICE INCLUDING A DISPLAY PORTION, A FIRST COMMUNICATION PORTION, AND A WEARING PORTION, AND DISPLAY SYSTEM HAVING THE SAME

(71) Applicant: SEMICONDUCTOR ENERGY LABORATORY CO., LTD., Atsugi (JP)

(72) Inventors: Shunpei Yamazaki, Tokyo (JP); Takayuki Ikeda, Atsugi (JP); Satoshi Seo, Sagamihara (JP); Sachiko Kawakami, Atsugi (JP); Daiki Nakamura, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 405 days.

(21) Appl. No.: 18/566,876

(22) PCT Filed: May 25, 2022

(86) PCT No.: PCT/IB2022/054870
§ 371 (c)(1),
(2) Date: Dec. 4, 2023

(87) PCT Pub. No.: WO2022/259069
PCT Pub. Date: Dec. 15, 2022

(65) Prior Publication Data

US 2024/0276833 A1 Aug. 15, 2024

(30) Foreign Application Priority Data

Jun. 8, 2021 (JP) ................................ 2021-096219

(51) Int. Cl.
*H10K 59/35* (2023.01)
*H10K 50/00* (2023.01)
(Continued)

(52) U.S. Cl.
CPC .......... *H10K 59/351* (2023.02); *H10K 50/00* (2023.02); *H10K 59/353* (2023.02);
(Continued)

(58) Field of Classification Search
CPC .. H10K 59/879; H10K 59/351; H10K 59/353; H10K 59/771; H10K 59/8731;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 103779470 A 5/2014
CN 109937443 A 6/2019
(Continued)

OTHER PUBLICATIONS

International Search Report (Application No. PCT/IB2022/054870) Dated Aug. 9, 2022.
(Continued)

*Primary Examiner* — Phuc T Dang
(74) *Attorney, Agent, or Firm* — Fish & Richardson P.C.

(57) ABSTRACT

A display device with a high level of immersion or realistic sensation is provided. The display device includes a display portion capable of full-color display, a communication portion having a wireless communication function, and a wearing portion having a function of being worn on a head. The display portion includes a subpixel including a light-emitting device and a coloring layer transmitting blue light. The light-emitting device contains a first light-emitting material emitting blue light and a second light-emitting material emitting light having a longer wavelength than blue light. The light-emitting device includes a first light-emitting unit,
(Continued)

a charge-generation layer, and a second light-emitting unit that are stacked in this order. In an emission spectrum obtained with the display portion performing blue display at low luminance, when the intensity of a first emission peak at a wavelength higher than or equal to 400 nm and lower than 500 nm is regarded as 1, the intensity of a second emission peak at a wavelength higher than or equal to 500 nm and lower than or equal to 700 nm in the emission spectrum is lower than or equal to 0.5.

21 Claims, 34 Drawing Sheets

(51) Int. Cl.
*H10K 59/00* (2023.01)
*H10K 59/80* (2023.01)

(52) U.S. Cl.
CPC ..... *H10K 59/771* (2023.02); *H10K 59/80518* (2023.02); *H10K 59/8731* (2023.02); *H10K 59/878* (2023.02); *H10K 59/879* (2023.02)

(58) Field of Classification Search
CPC . H10K 59/878; H10K 59/80518; H10K 50/00
USPC ........................................................... 257/40
See application file for complete search history.

(56) References Cited

U.S. PATENT DOCUMENTS

| | | | |
|---|---|---|---|
| 7,248,232 | B1 | 7/2007 | Yamazaki et al. |
| 9,728,693 | B2 | 8/2017 | Hatano et al. |
| 11,785,827 | B2 | 10/2023 | Yamazaki et al. |
| 2002/0072139 | A1 | 6/2002 | Kashiwabara |
| 2004/0079941 | A1 | 4/2004 | Yamazaki et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2014/0103385 | A1 | 4/2014 | Hatano et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0057330 | A1 | 2/2020 | Yamazaki et al. |
| 2020/0203662 | A1 | 6/2020 | Mollard et al. |
| 2022/0057636 | A1 | 2/2022 | Hashimoto et al. |
| 2022/0209162 | A1 | 6/2022 | Seo et al. |
| 2022/0392982 | A1 | 12/2022 | Yamazaki et al. |

FOREIGN PATENT DOCUMENTS

| | | | | | |
|---|---|---|---|---|---|
| CN | 111326551 | A | * | 6/2020 | ............ H10P 74/277 |
| CN | 113272766 | A | | 8/2021 | |
| JP | 2000-002856 | A | | 1/2000 | |
| JP | 2000-036385 | A | | 2/2000 | |
| JP | 2003-059663 | A | | 2/2003 | |
| JP | 2008-098106 | A | | 4/2008 | |
| JP | 2008-147072 | A | | 6/2008 | |
| JP | 2008-251270 | A | | 10/2008 | |
| JP | 2009-058897 | A | | 3/2009 | |
| JP | 2012-160473 | A | | 8/2012 | |
| JP | 2014-022349 | A | | 2/2014 | |
| JP | 2014-082132 | A | | 5/2014 | |
| JP | 2014-120218 | A | | 6/2014 | |
| JP | 2014-135251 | A | | 7/2014 | |
| JP | 2014-164182 | A | | 9/2014 | |
| JP | 2014-232568 | A | | 12/2014 | |
| JP | 2015-026561 | A | | 2/2015 | |
| JP | 2015-115178 | A | | 6/2015 | |
| JP | 2016-197494 | A | | 11/2016 | |
| JP | 2018-189937 | A | | 11/2018 | |
| JP | 2019-179696 | A | | 10/2019 | |
| JP | 2020-160305 | A | | 10/2020 | |
| KR | 20190043085 | A | * | 4/2019 | ............ H10W 90/00 |
| KR | 2019-0076045 | A | | 7/2019 | |
| KR | 2020-0082920 | A | | 7/2020 | |
| WO | WO-2018/087625 | | | 5/2018 | |
| WO | WO-2019215530 | A1 | * | 11/2019 | ............ H05B 33/24 |
| WO | WO-2020016998 | A1 | * | 1/2020 | ............ H05B 33/12 |
| WO | WO-2020021399 | A1 | * | 1/2020 | ............ H05B 33/12 |
| WO | WO-2020/152828 | | | 7/2020 | |

OTHER PUBLICATIONS

Written Opinion (Application No. PCT/IB2022/054870) Dated Aug. 9, 2022.

Lamprecht.B et al., “Organic optoelectronic device fabrication using standard UV photolithography”, Phys. Stat. Sol. (RRL) (Physica Status Solidi. Rapid Research Letters.), Oct. 30, 2007, vol. 2, No. 1, pp. 16-18.

Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.

Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.

Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.

Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.

Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.

Papadopoulos.N et al., “AMOLED Displays with In-Pixel Photodetector”, Liquid Crystals and Display Technology, Jul. 9, 2020, pp. 1-19.

Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.

Malinowski.P et al., “Photolithographic patterning of organic photodetectors with a non-fluorinated photoresist system”, Organic Electronics, Jul. 12, 2014, vol. 15, No. 10, pp. 2355-2359.

Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.

Zakhidov.A et al., “Orthogonal processing: A new strategy for organic electronics”, Chem. Sci. (Chemical Science), Apr. 7, 2011, vol. 2, No. 6, pp. 1178-1182.

* cited by examiner

DISPLAY DEVICE INCLUDING A DISPLAY PORTION, A FIRST COMMUNICATION PORTION, AND A WEARING PORTION, AND DISPLAY SYSTEM HAVING THE SAME

CROSS REFERENCE TO RELATED APPLICATIONS

This application is a U.S. National Phase Application under 35 U.S.C. § 371 of International Application PCT/IB2022/054870, filed on May 25, 2022, which is incorporated by reference and claims the benefit of a foreign priority application filed in Japan on Jun. 8, 2021, as Application No. 2021-096219.

TECHNICAL FIELD

One embodiment of the present invention relates to a display device. One embodiment of the present invention relates to an electronic device. One embodiment of the present invention relates to a display system.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

As electronic devices provided with display devices for augmented reality (AR) or virtual reality (VR), wearable electronic devices are becoming widespread. Examples of wearable electronic devices include a head-mounted display (HMD) and an eyeglass-type electronic device.

When using an electronic device such as an HMD with a small distance between a display portion and a user, the user is likely to perceive pixels and strongly feels granularity, whereby the sense of immersion and realistic sensation of AR and VR might be diminished. Thus, an HMD is preferably provided with a display device that has minute pixels so that the pixels are not perceived by the user. Patent Document 1 discloses a method in which an HMD including minute pixels is achieved by using transistors capable of high-speed operation.

Organic EL devices are used in display portions of display devices and HMDs for AR or VR in some cases. Non-Patent Document 1 discloses a method employing standard UV photolithography for manufacturing an organic optoelectronic device, which is one of organic EL devices.

REFERENCE

Patent Document

[Patent Document 1] Japanese Published Patent Application No. 2000-2856

Non-Patent Document

[Non-Patent Document 1] B. Lamprecht et al., "Organic optoelectronic device fabrication using standard UV photolithography", phys. stat. sol. (RRL) 2, No. 1, pp. 16-18 (2008).

SUMMARY OF THE INVENTION

Problems to be Solved by the Invention

Reducing the size of a pixel included in a display device can increase the pixel density. Accordingly, more pixels can be provided in the display device to enhance the sense of immersion or realistic sensation. Defects in pixels (e.g., bright spots and dark spots) are preferably reduced to further enhance the sense of immersion or realistic sensation.

A further problem is that a heavy HMD or the like worn on a head might place a burden on the user.

An object of one embodiment of the present invention is to provide a display device with a high level of immersion or realistic sensation. An object of one embodiment of the present invention is to provide a display device or a display system with little burden on the user. An object of one embodiment of the present invention is to provide a display device with high display quality. An object of one embodiment of the present invention is to provide a display device, a display method, a communication method, or a display system with a novel structure.

An object of one embodiment of the present invention is to at least reduce at least one of problems of the conventional technique.

Note that the description of these objects does not preclude the existence of other objects. Note that one embodiment of the present invention does not have to achieve all these objects. Note that objects other than these can be derived from the description of the specification, the drawings, the claims, and the like.

Means for Solving the Problems

One embodiment of the present invention is a display device including a display portion, a first communication portion, and a wearing portion. The wearing portion has a function of being worn on a head. The first communication portion has a wireless communication function. The display portion is capable of full-color display. The display portion includes a first subpixel. The first subpixel includes a first light-emitting device and a first coloring layer transmitting blue light. The first light-emitting device includes a first pixel electrode, a first EL layer over the first pixel electrode, and a common electrode over the first EL layer. The first EL layer includes a first light-emitting material emitting blue light and a second light-emitting material emitting light having a longer wavelength than blue light. The first EL layer includes a first light-emitting unit over the first pixel electrode, a charge-generation layer over the first light-emitting unit, and a second light-emitting unit over the charge-generation layer. In an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5. The first luminance is any value higher than 0 cd/m$^2$ and lower than 1 cd/m$^2$.

In the above display device, the display portion preferably includes a second subpixel; the second subpixel preferably includes a second light-emitting device and a second coloring layer transmitting light having a different color from the first coloring layer; the second light-emitting device preferably includes a second pixel electrode, a second EL layer over the second pixel electrode, and the common electrode over the second EL layer; the first EL layer has the same structure as the second EL layer; and the first EL layer and the second EL layer are preferably separated from each other.

One embodiment of the present invention is a display device including a display portion, a first communication portion, and a wearing portion. The wearing portion has a function of being worn on a head. The first communication portion has a wireless communication function. The display portion is capable of full-color display. The display portion includes a first subpixel and a second subpixel. The first subpixel includes a first light-emitting device and a first coloring layer transmitting blue light. The second subpixel includes a second light-emitting device and a second coloring layer transmitting light having a different color from the first coloring layer. The first light-emitting device includes a first pixel electrode, a first EL layer over the first pixel electrode, and a common electrode over the first EL layer. The second light-emitting device includes a second pixel electrode, the first EL layer over the second pixel electrode, and the common electrode over the first EL layer. The first EL layer includes a first light-emitting unit over the first pixel electrode, a charge-generation layer over the first light-emitting unit, and a second light-emitting unit over the charge-generation layer. In an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5. The first luminance is any value higher than 0 $cd/m^2$ and lower than 1 $cd/m^2$.

One embodiment of the present invention is a display device including a display portion, a first communication portion, and a wearing portion. The wearing portion has a function of being worn on a head. The first communication portion has a wireless communication function. The display portion is capable of full-color display. The display portion includes a first subpixel and a second subpixel. The first subpixel includes a first light-emitting device and a first coloring layer transmitting blue light. The second subpixel includes a second light-emitting device and a second coloring layer emitting light having a different color from the first coloring layer. The first light-emitting device includes a first pixel electrode, a first EL layer over the first pixel electrode, and a common electrode over the first EL layer. The second light-emitting device includes a second pixel electrode, a second EL layer over the second pixel electrode, and the common electrode over the second EL layer. The first EL layer has the same structure as the second EL layer. The first EL layer and the second EL layer are separated from each other. The first EL layer includes a first light-emitting unit over the first pixel electrode, a charge-generation layer over the first light-emitting unit, and a second light-emitting unit over the charge-generation layer. In an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5. The first luminance is any value higher than 0 $cd/m^2$ and lower than 1 $cd/m^2$.

The first light-emitting device preferably includes a common layer between the first EL layer and the common electrode; the second light-emitting device preferably includes the common layer between the second EL layer and the common electrode; and the common layer preferably includes at least one of a hole-injection layer, a hole-transport layer, a hole-blocking layer, an electron-blocking layer, an electron-transport layer, and an electron-injection layer.

The display portion preferably includes a first insulating layer; the first insulating layer preferably covers a side surface of the first EL layer and a side surface of the second EL layer; and the common electrode is preferably positioned over the first insulating layer.

the display portion preferably includes a second insulating layer, the first insulating layer preferably contains an inorganic material, and the second insulating layer preferably contains an organic material and overlaps with the side surface of the first EL layer and the side surface of the second EL layer with the first insulating layer therebetween.

the display portion preferably has a resolution of 1000 ppi or more

The first subpixel preferably includes a lens overlapping with the first light-emitting device and the first coloring layer.

The first pixel electrode preferably contains a material reflecting visible light.

The first subpixel preferably includes a reflective layer, the first pixel electrode preferably contains a material transmitting visible light, and the first pixel electrode is preferably positioned between the reflective layer and the first EL layer.

An end portion of the first pixel electrode preferably has a tapered shape.

The first EL layer preferably covers the end portion of the first pixel electrode.

One embodiment of the present invention is a display system including a server, a terminal, and the display device according to any of the above structures. The terminal includes a second communication portion and a third communication portion. The second communication portion has a function of executing communication with the server through a network. The third communication portion has a function of executing communication with the first communication portion.

Effect of the Invention

According to one embodiment of the present invention, a display device with a high level of immersion or realistic sensation can be provided. Alternatively, a display device or a display system with little burden on the user can be provided. Alternatively, a display device with high display quality can be provided. Alternatively, a display device, a display method, a communication method, or a display system with a novel structure can be provided. Alternatively, at least one of problems of the conventional technique can be at least reduced.

Note that the description of these effects does not preclude the existence of other effects. Note that one embodiment of the present invention does not need to have all these effects. Note that effects other than these can be derived from the description of the specification, the drawings, the claims, and the like.

MODE FOR CARRYING OUT THE INVENTION

Figure 1:
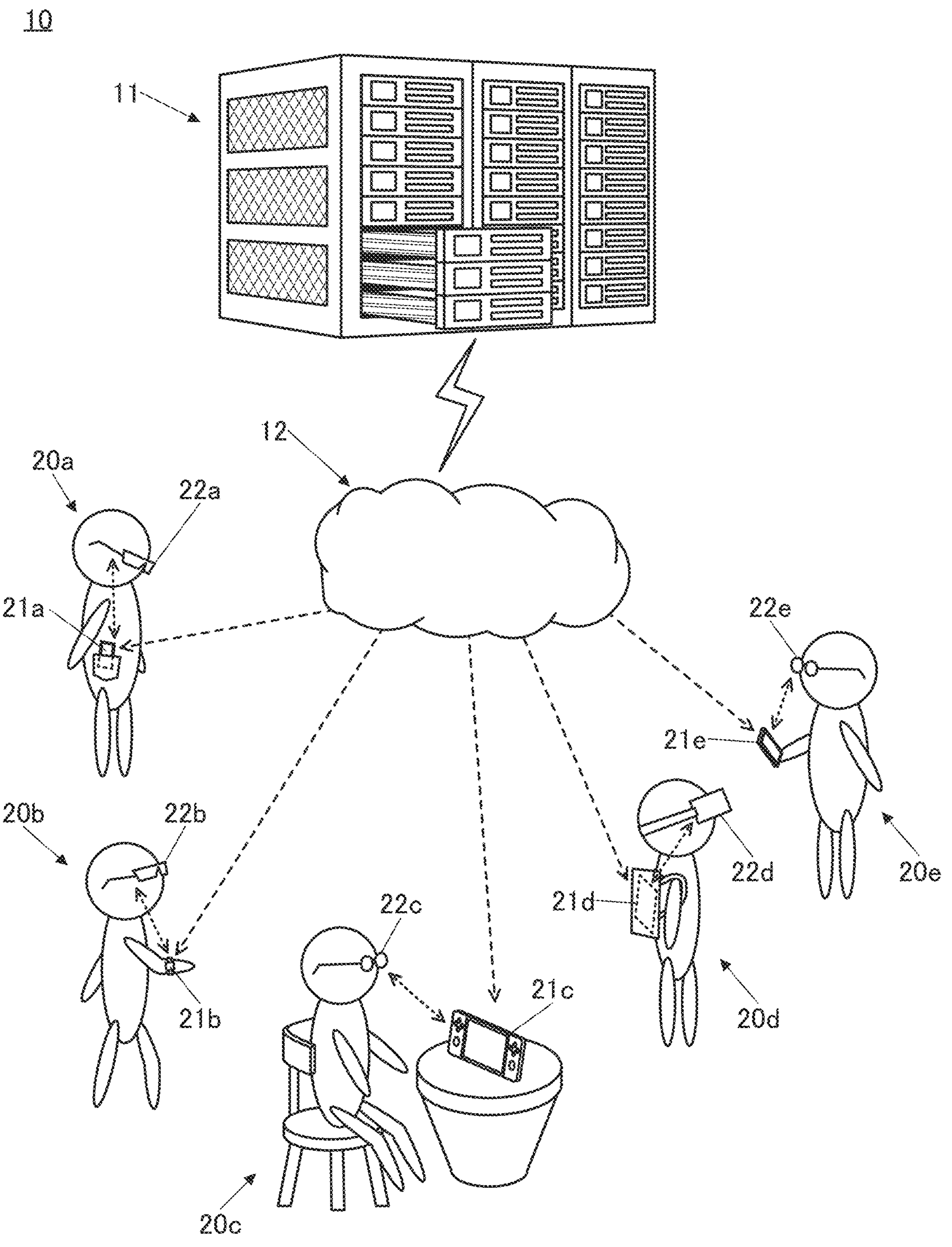
FIG. 1 is a diagram illustrating a structure example of a display system.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not necessarily limited to the illustrated scale.

Note that in this specification and the like, ordinal numbers such as "first" and "second" are used in order to avoid confusion among components and do not limit the number.

In this specification and the like, a display device may be rephrased as an electronic device.

In this specification and the like, a device fabricated using a metal mask or an FMM (a fine metal mask or a high-resolution metal mask) may be referred to as a device having an MM (metal mask) structure. In this specification and the like, a device manufactured without using a metal mask or an FMM may be referred to as a device having an MML (metal maskless) structure.

Embodiment 1

In this embodiment, structure examples of a display system, a display device, and the like of embodiments of the present invention are described.

The display system of one embodiment of the present invention includes a wearable display device typified by a head mounted display (HMD). An example of a display device that can be used for the display system is a non-transmissive display device that displays a picture while covering the entire field of view, such as a goggle-type display device. Alternatively, it is possible to use a transmissive display device that displays a picture so that the picture is superimposed on the actual scenery viewed through the screen.

The display system includes a terminal besides the wearable display device. The terminal includes a first communication portion for connection to a server through a network. The terminal further includes a second communication portion for communication with the wearable display device. Such a structure eliminates the need of any direct communication of the wearable display device with the server and allows near field communication with the terminal held by a user; thus, the structure can be simplified. This can the weight of the wearable display device and allows the user to wear the display device more comfortably.

A display panel included in the wearable display device has a high aperture ratio, high resolution, high definition (a large number of pixels), and high color reproducibility.

The aperture ratio (effective emission area ratio) of the display panel is higher than or equal to 10% and lower than or equal to 100%, preferably higher than or equal to 20% and lower than or equal to 95%, further preferably higher than or equal to 30% and lower than or equal to 93%, and still further preferably higher than or equal to 40% and lower than or equal to 90%. In particular, an increased aperture ratio makes the display portion, where images are magnified with a lens or the like for viewing, more immersive because the pixel graininess is rendered almost invisible.

The display panel preferably has a higher resolution. The resolution can be 500 ppi or higher, preferably 800 ppi or higher, further preferably 1000 ppi or higher, still further preferably 2000 ppi or higher, and yet further preferably 3000 ppi or higher, and 10000 ppi or lower, 8000 ppi or lower, or 6000 ppi or lower, for example. As the resolution increases, the sense of immersion can be enhanced.

The display panel preferably has a higher definition. For example, the display panel preferably has a definition as extremely high as HD (number of effective pixels: 1280×720), FHD (number of effective pixels: 1920×1080), WQHD (the number of effective pixels: 2560×1440), WQXGA (number of effective pixels: 2560×1600), 4K2K (number of effective pixels: 3840×2160), or 8K4K (number of effective pixels: 7680×4320 effective pixels). In particular, definition of 4K2K, 8K4K, or higher is preferable.

According to the display panel, there is preferably a small difference in color between low luminance display and high luminance display. In the display panel of one embodiment of the present invention, in an emission spectrum of blue display provided by a display portion at a first luminance, the intensity of a first emission peak at a wavelength higher than or equal to 400 nm and lower than 500 nm is assumed to be 1; in this case, the intensity of a second emission peak at a wavelength higher than or equal to 500 nm and lower than or equal to 700 nm in the emission spectrum is higher than or equal to 0 and lower than or equal to 0.5, and the first luminance is any value higher than 0 $cd/m^2$ and lower than 1 $cd/m^2$. In other words, when blue display is provided in the display panel of one embodiment of the present invention at a low luminance, blue light is mainly observed while light having a wavelength longer than blue light is less observed (including the case where substantially no light having a wavelength longer than blue light is observed). A display panel having such a structure can have high display quality. For specific structure examples of the display panel, Embodiment 2 to Embodiment 4, for example, can be referred to mainly.

More specific examples will be described below with reference to drawings.

[Display System]

FIG. 1 schematically illustrates a display system 10. The display system 10 includes a server 11, a network 12, and terminals and display devices that are held by users. In the display system 10 of one embodiment of the present invention, a plurality of users in remote places can experience the same content at the same time by simultaneous communication with the server 11. FIG. 1 illustrates five users (a user 20*a* to a user 20*e*).

In the following description, in the case where items common to components which are distinguished with use of alphabets, such as the user 20*a* to the user 20*e*, are described, a reference numeral without the alphabet is used in some cases.

A terminal 21 has a function of communication with the server 11 through the network 12, and a variety of devices can be used as the terminal 21. For example, a portable information terminal such as a smartphone, a tablet terminal, or a mobile phone can be used. The terminal 21 does not necessarily include a display portion.

A display device 22 has a function of communication with the terminal 21 with or without a wire and can be worn on the head of the user 20. For example, an immersive (non-transmissive) or transmissive HMD can be used. A goggle- or glasses-type structure, a structure worn on one eye, or the like can be used as the display device 22.

The user 20*a* has a terminal 21*a* and a display device 22*a*. The terminal 21*a* is in a clothes pocket of the user 20*a*. The terminal 21*a* functions as a smartphone, for example. The user 20*a* also wears the display device 22*a*. The user 20*b* has a terminal 21*b* worn on the arm and a display device 22*b* worn on the head. The terminal 21*b* functions as a watch-type information terminal. The user 20*c* wears a display device 22*c* while sitting on a chair, and a terminal 21*c* is put on a nearby table. The terminal 21*c* functions as a game machine. The user 20*d* has a terminal 21*d* in the user's backpack and also wears a display device 22*d*. The terminal 21*d* functions as a tablet terminal. The user 20*e* holds a terminal 21*e* in the user's hand and wears a display device 22*e*.

The terminal 21 held by the user 20 can communicate with the server 11 through the network 12. The server 11 has a function of offering some kind of processing in response to the need from clients. The server 11 may be composed of hardware such as a computer and software that runs on the hardware. Note that an external view of a large computer as an example of the server 11 is shown in FIG. 1. The server 11 may include a so-called supercomputer capable of large-scale arithmetic processing, in addition to a large-scale storage.

The terminal 21 and the display device 22 can perform mutual communication as indicated by the dotted lines. The terminal 21 can transmit visual data and audio data supplied from the server 11 to the display device 22. The terminal 21 can transmit input information from the user 20 to the server 11 through the network 12.

The information input by the user 20 can be obtained by a sensor included in the terminal 21 or the display device 22. Alternatively, an input device such as a controller, a stick, or a glove may be used besides the terminal 21 and the display device 22. Examples of the sensor include cameras, acceleration sensors, and touch sensors (including contactless sensors). Examples of the input information include information on touches (including contactless input), gestures with fingers or arms, the attitude or motion of part or the whole of the body, the number of steps, and positions.

The display system 10, which does not necessarily need any equipment, can be used at any place accessible to the network 12, such as user's home, for example. Alternatively, the display system 10 may be used in limited facilities such as amusement facilities, entertainment facilities, or recreation halls.

Examples of Contents

Examples of the contents that the user 20 can enjoy using the display system 10 are described.

Figure 2A:
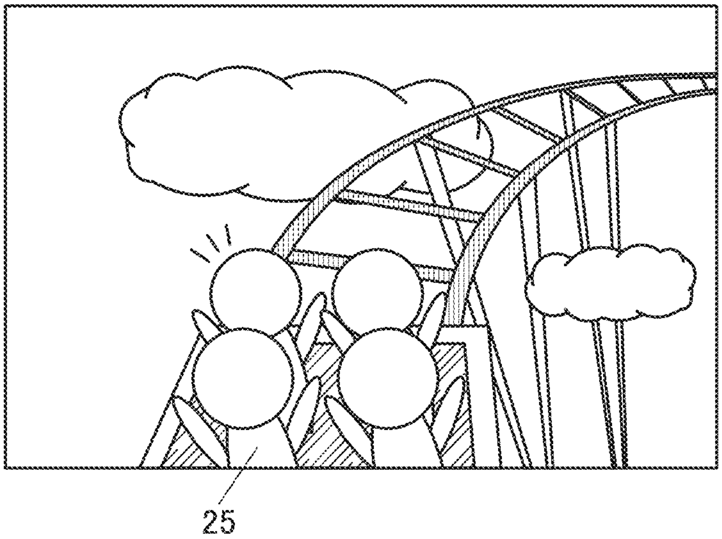
FIG. 2A and FIG. 2B are diagrams illustrating examples of contents.

FIG. 2A illustrates an example of contents for roller coaster experiences. In FIG. 2A, a plurality of avatars 25 are riding on a roller coaster running above clouds. The images presented to the user 20 correspond to the field of view of any of the plurality of avatars 25, so that the user 20 can have such an unreal experience of riding on the roller coaster running above the clouds. The plurality of avatars 25 are riding on the roller coaster and linked to the different users 20.

The avatar 25 preferably moves along with the input information from the user 20. The avatar 25 turns his/her eyes or changes the posture along with the motion of the user 20, such as turning his/her eyes, head, or body. The avatar 25 raises a hand when the user 20 raises a hand. In addition, when the user 20 speaks, the avatar 25 makes a sound in response thereto and the other users 20 linked to the other avatars 25 can hear the sound. This enables a scream uttered by another user 20 who is virtually riding on the same roller coaster to be heard in real time, encouraging a sense of reality.

Figure 2B:
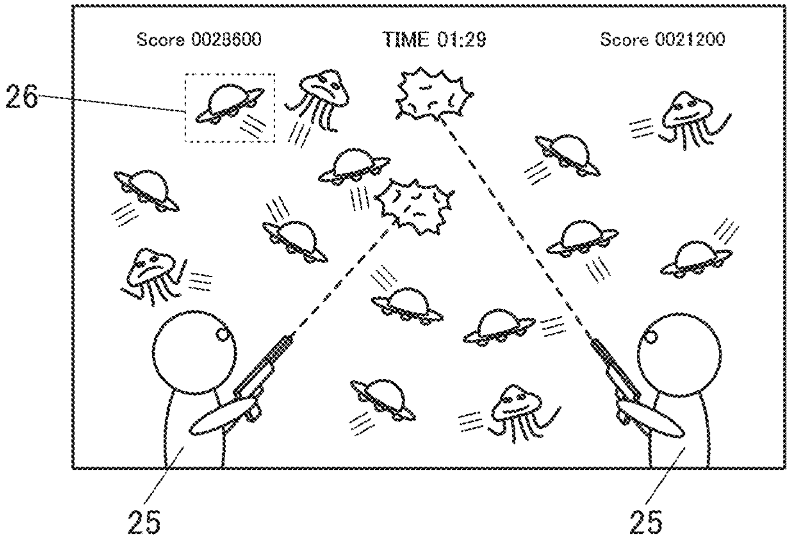

FIG. 2B illustrates an example of contents for a shooter game. The example in FIG. 2B shows contents of a match game in which the avatars 25 are operated to break a targeted object 26 to compete for points. In FIG. 2B, suspended airvehicles and strange living objects are examples of the object 26. The points (indicated as "Score") scored by the users 20 and the remaining time (indicated as "TIME") are displayed on the upper portion of the image. Although two avatars 25 are illustrated in FIG. 2B, three or more avatars 25 can join at the same time. Instead of the object 26, any of the avatars 25 may be targeted.

Structure Example of Display System

Hereinafter, a more specific structure example of the display system 10 is described.

Figure 3:
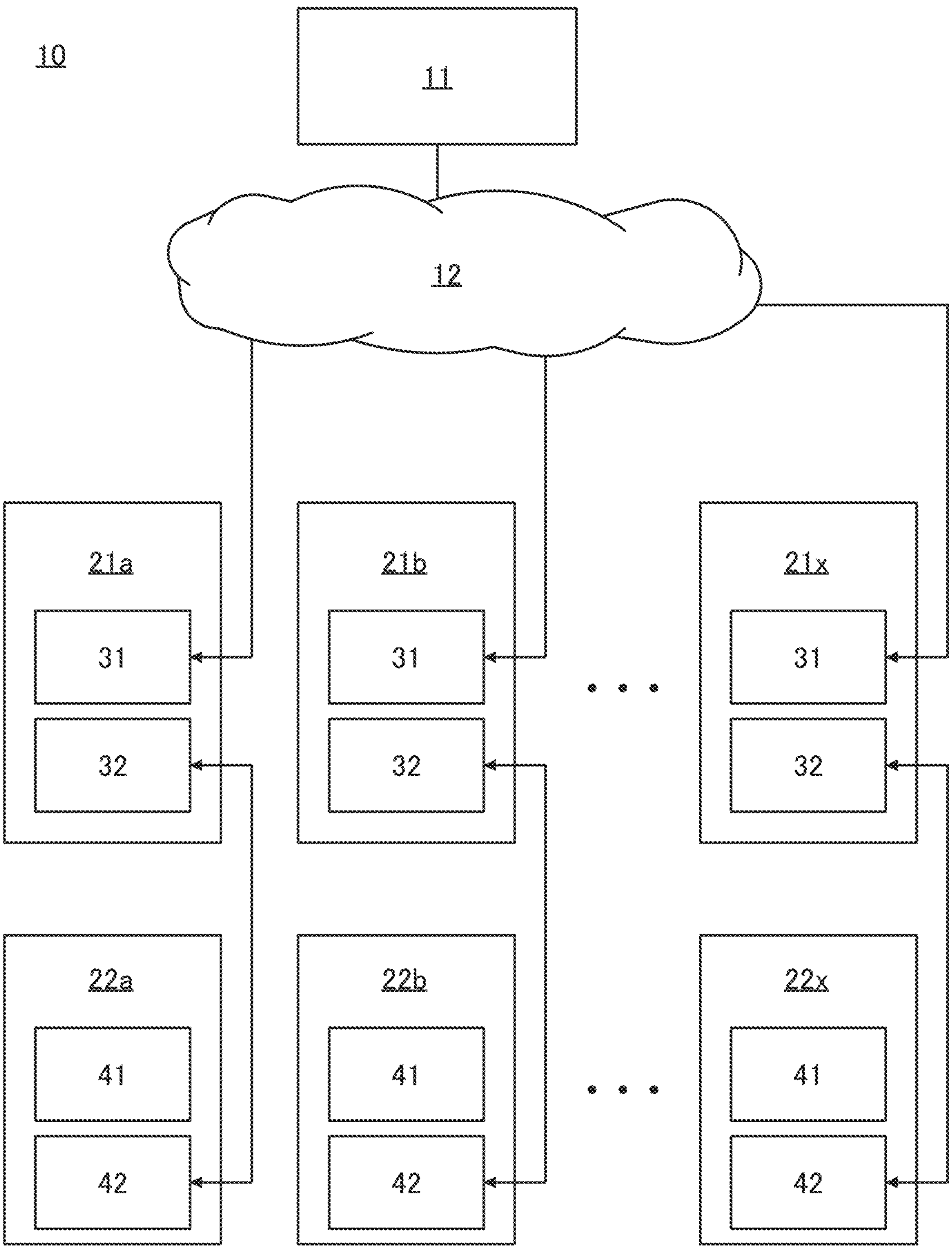
FIG. 3 is a diagram illustrating a structure example of a display system.

FIG. 3 is a block diagram illustrating the structure of the display system 10. The display system 10 includes the server 11, the network 12, one or more terminals 21, and one or more display devices 22 (the display device 22*a* to a display device 22*x*). In this example, x (x is a natural number) terminals 21 (the terminal 21*a* to a terminal 21*x*) are connected.

The terminal 21 includes a communication portion 31 for communication with the server 11 through the network 12 and a communication portion 32 for communication with the display device 22. The display device 22 includes a display portion 41 for displaying an image and a communication portion 42 for communication with the terminal 21.

For wireless communication between the communication portion 31 and the server 11 through the network 12, the communication portion 31 can have an antenna. Examples of the network 12 as a communication means (a communication method) between the communication portion 31 and the server 11 include computer networks such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), and a GAN (Global Area Network). For wireless communication, it is possible to use, as a communication protocol or a communication technology, such as the third-generation mobile communication system (3G), the fourth-generation mobile communication system (4G), or the fifth-generation mobile communication system (5G), or a communication standard developed by IEEE such as Wi-Fi (registered trademark) or Bluetooth (registered trademark).

A communication means similar to the above can be applied to the communication between the communication portion 32 and the communication portion 42. Note that the communication between the communication portion 32 and the communication portion 42 does not necessarily require a large-scale network because this is a relatively close-range communication. For example, a home area network such as a PAN or a LAN can be used for home use. With not through any network, an intercommunication function between the two devices may be used. Wired communication between the communication portion 32 and the communication portion 42 may be performed through a cable.

The display portion 41 of the display device 22 has one or both of a function of displaying AR contents and a function of displaying VR contents. Note that the display device 22 may also have a function of displaying contents of substitutional reality (SR) or contents of mixed reality (MR), in addition to contents of AR and VR. The display device 22 having a function of displaying contents of at least one of AR, VR, SR, MR, and the like enables the user to feel a higher level of immersion.

Specific Examples of Terminal and Display Device

Figure 4A:
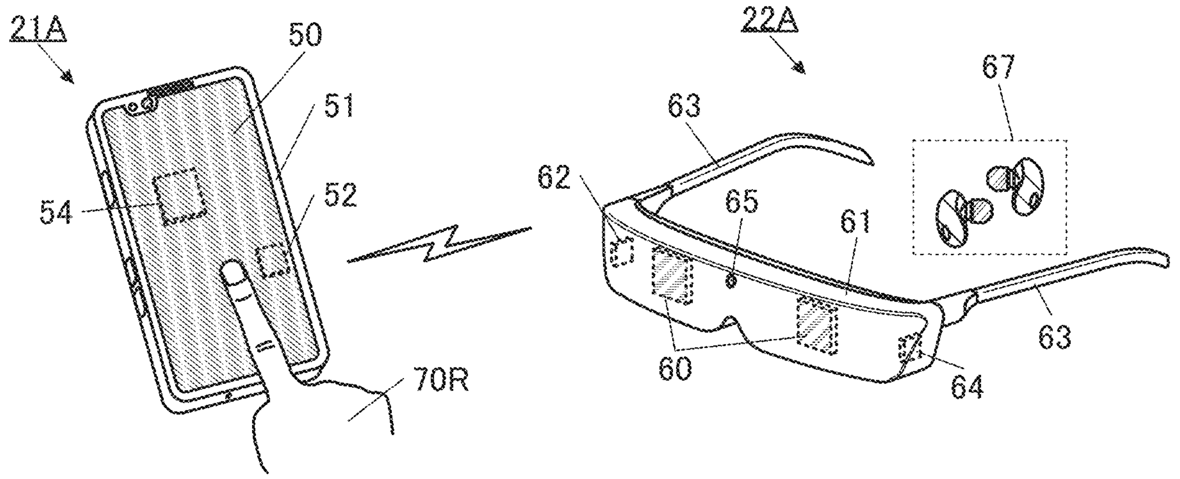
FIG. 4A to FIG. 4C are diagrams illustrating structure examples of a terminal and a display device.
Figure 4B:
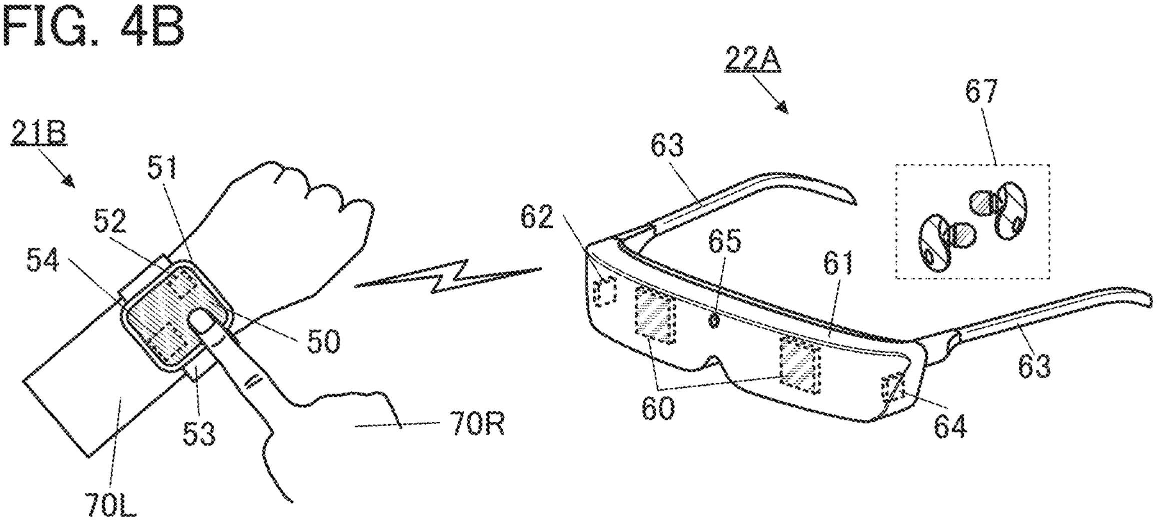
Figure 4C:
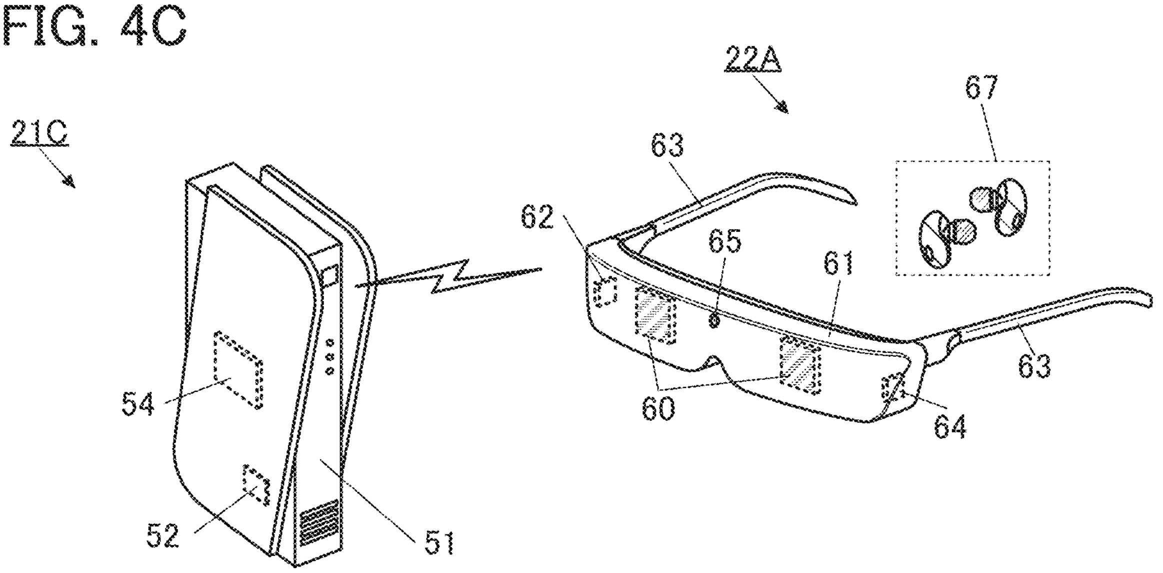

FIG. 4A to FIG. 4C illustrate specific examples of terminals and display device.

FIG. 4A illustrates a terminal 21A and a display device 22A. The terminal 21A and the display device 22A each have a wireless communication function. The display device 22A has a region where the pixel density is higher than that of the terminal 21A. With the use of the above wireless communication function, part or the whole of the image on the screen of the terminal 21A can be displayed on the display device 22A.

As illustrated in FIG. 4A, a display device may be used as a terminal in the display system of one embodiment of the present invention. That is, a plurality of display devices may be included in the display system. Between the display devices, data can be transmitted by wireless communication, and data in one display device can be partly processed, e.g., upconverted or downconverted to be displayed by another display device. Such a display system enables greater user convenience, image display with the most suitable image quality for an individual display device, or lower power consumption of the display devices.

The terminal 21A includes a display portion 50, a housing 51, a communication portion 52, and a control portion 54. Here, the communication portion 52 functions as the communication portion 31 and also as the communication portion 32. That is, the communication portion 52 has both a function of performing communication with the server 11 through the network 12 and a function of performing communication with the display device 22A. Note that a right hand 70R of the user is illustrated in FIG. 4A. The display device 22A includes a display portion 60, a housing 61, a communication portion 62, a wearing portion 63, a control portion 64, and a camera portion 65. Note that the wireless communication can be performed between the communication portion 52 and the communication portion 62, as illustrated in FIG. 4A. The communication portion 52 has a function of transmitting information to the display device 22A in accordance with the operation for the terminal 21A. The communication portion 62 has a function of transmitting information to the terminal 21A in accordance with the operation for the display device 22A.

The display device 22A is a goggle-type display device. The camera portion 65 of the display device 22A has a function of obtaining external information. For example, data obtained by the camera portion 65 can be output to the display portion 60 or the display portion 50 of the terminal 21A. The wearing portion 63 of the display device 22A enables the user to put the display device 22A on the head. Note that FIG. 4A shows an example where the wearing portion 63 has a shape like a temple of glasses; however, one embodiment of the present invention is not limited thereto. The wearing portion 63 can have any shape with which the user can wear the electronic device, for example, a shape of a helmet or a band.

The display device 22A has a function of outputting audio to an earphone 67. Here, an example in which audio information is output to the earphone by wireless communication is described. Note that one embodiment is not limited to this example; the earphone 67 and the display device 22A may be connected by a cable so that audio information can be output through the cable.

Although an example where the camera portion 65 is provided is shown here, a range sensor capable of measuring a distance between the user and an object (hereinafter also referred to as a detection portion) just needs to be provided. In other words, the camera portion 65 is one embodiment of the detection portion. As the detection portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

A terminal 21B illustrated in FIG. 4B includes the display portion 50, the housing 51, the communication portion 52, a band 53, and the control portion 54. The right hand 70R and a left hand 70L of the user are illustrated in FIG. 4B. The structure of the display device 22A illustrated in FIG. 4B is similar to that illustrated in FIG. 4A; thus, the description thereof is omitted here.

The terminal 21A illustrated in FIG. 4A functions as a so-called portable information terminal (typically, a smartphone), and the terminal 21B illustrated in FIG. 4B functions as a so-called watch-type portable information terminal. The terminal 21A and the terminal 21B each have at least one or both functions of calling and time display. The display device 22A has one or both of a function of displaying AR contents and a function of displaying VR contents. Note that the display device 22A may have a function of displaying SR or MR contents besides AR and/or VR contents. The display device 22A having a function of displaying contents of at least one of AR, VR, SR, MR, and the like enables the user to feel a higher level of immersion.

A terminal 21C illustrated in FIG. 4C functions as a game machine. The terminal 21C includes, at least in the housing 51, the communication portion 52 and the control portion 54. The structure of the display device 22A illustrated in FIG. 4C is similar to that illustrated in FIG. 4A; thus, the description thereof is omitted here.

The terminal 21C includes a processor, a storage, and the like. With the terminal 21C, the user can start an application and enjoy a variety of game contents. The terminal 21C is capable of executing not only game contents but also applications such as video replay, image reproduction, music replay, and an Internet browser. The terminal 21C can also be used as a personal computer.

Figure 5A:
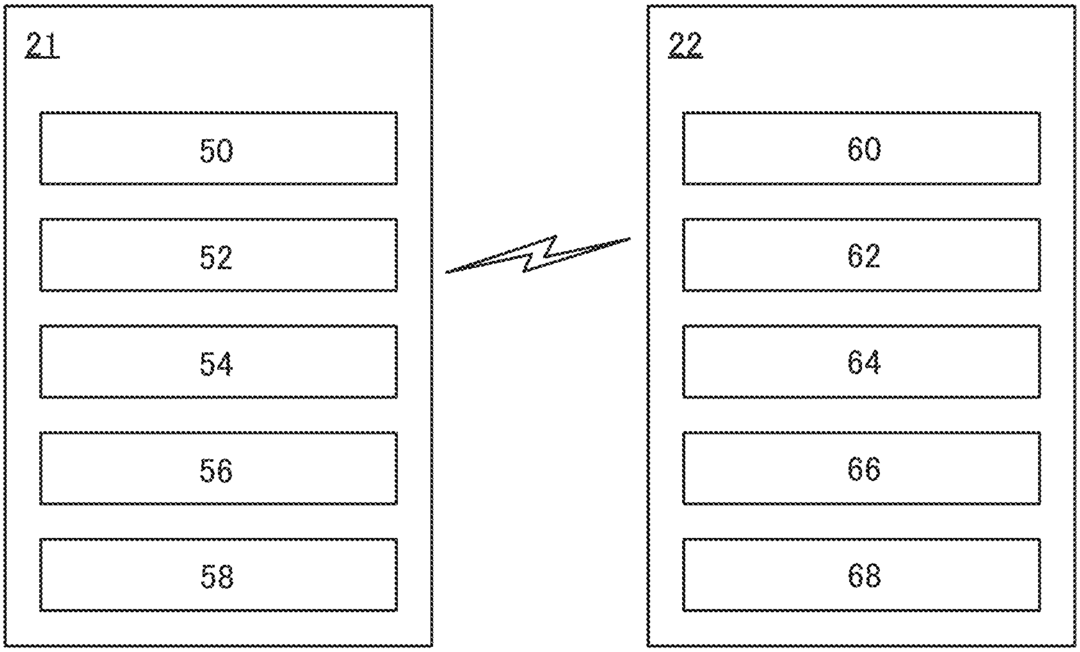
FIG. 5A and FIG. 5B are diagrams illustrating structure examples of a terminal and a display device.

FIG. 5A is a block diagram illustrating the structures of the terminal 21 and the display device 22. The terminal 21 includes the display portion 50, the communication portion 52, the control portion 54, a power supply portion 56, and a sensor portion 58. As illustrated in FIG. 5A, the display device 22 includes the display portion 60, the communication portion 62, the control portion 64, a power supply portion 66, and a sensor portion 68.

Although FIG. 5A illustrates the structure in which the terminal 21 and the display device 22 have the same function, one embodiment of the present invention is not limited thereto. For example, the terminal 21 and the display device 22 may have different functions, as illustrated in FIG. 5B.

Figure 5B:
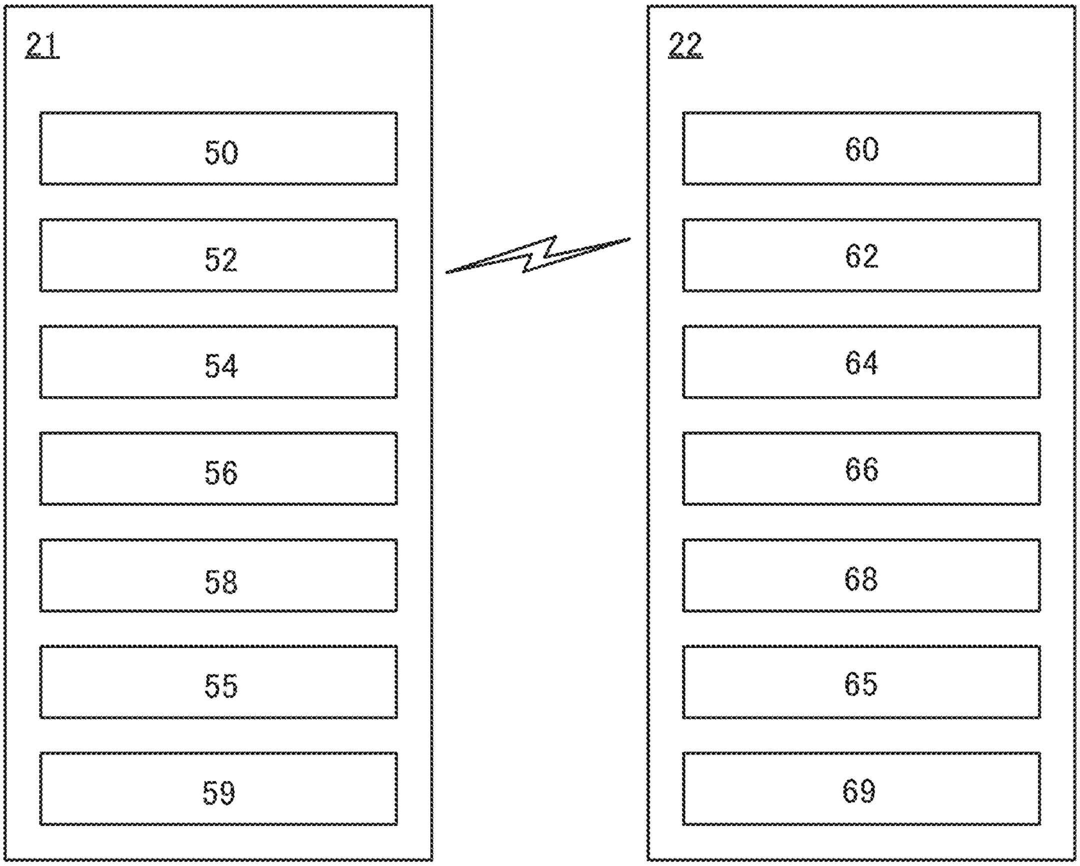

In FIG. 5B, the terminal 21 includes a camera portion 55 (also referred to as a detection portion) and a second communication portion 59 in addition to the components illustrated in FIG. 5A. The display device 22 includes the camera portion 65 and a headphone portion 69 in addition to the components illustrated in FIG. 5A. The camera portion 55 includes an imaging portion such as an image sensor. Moreover, a plurality of cameras may be provided so as to cover a plurality of fields of view, such as a telescope field of view and a wide field of view. The second communication portion 59 can have a communication function different from that of the communication portion 52. For example, the communication portion 52 has a function of performing communication with the communication portion 62, and the second communication portion 59 has a communication means that enables audio call, electronic payment, or the like utilizing the third-generation mobile communication system (3G), the fourth-generation mobile communication system (4G), the fifth-generation mobile communication system (5G), or the like.

The display portion 60 preferably has a higher definition than the display portion 50. For example, the definition of the display portion 50 can be HD (number of pixels: 1280×720), FHD (number of pixels: 1920×1080), or WQHD (number of pixels: 2560×1440). For example, the definition of the display portion 50 can be HD (number of pixels: 1280×720 pixels), FHD (number of pixels: 1920×1080 pixels), or WQHD (number of pixels: 2560×1440 pixels). In particular, definition of 4K2K, 8K4K, or higher is preferable.

The display portion 60 preferably has a higher pixel density (resolution) than the display portion 50. For example, the pixel density of the display portion 50 can be higher than or equal to 100 ppi and lower than 1000 ppi, preferably higher than or equal to 300 ppi and lower than or equal to 800 ppi. The pixel density of the display portion 60 can be higher than or equal to 1000 ppi and lower than or equal to 10000 ppi, preferably higher than or equal to 2000 ppi and lower than or equal to 8000 ppi, further preferably higher than or equal to 3000 ppi and lower than or equal to 6000 ppi.

The aperture ratio (effective emission area ratio) of each of the display portion 50 and the display portion 60 is higher than or equal to 10% and lower than or equal to 100%, preferably higher than or equal to 20% and lower than or equal to 95%, further preferably higher than or equal to 30% and lower than or equal to 93%, and still further higher than or equal to 40% and lower than or equal to 90%. In particular, an increased aperture ratio makes the display portion 60, where images are magnified with a lens or the like for viewing, more immersive because the pixel graininess is rendered almost invisible.

In each of the display portion 50 and the display portion 60, there is preferably a small difference in color between low luminance display and high luminance display. The display panel of one embodiment of the present invention is preferably used for one or both of the display portion 50 and the display portion 60. Specifically, in an emission spectrum obtained when the display panel of one embodiment of the present invention displays blue color at the first luminance, when the first emission peak at a wavelength higher than or equal to 400 nm and lower than 500 nm has an intensity of 1, the second emission peak at a wavelength higher than or equal to 500 nm and lower than or equal to 700 nm in the emission spectrum has an intensity higher than or equal to 0 and lower than or equal to 0.5, and the first luminance is any value higher than 0 cd/m$^2$ and lower than 1 cd/m$^2$. In other words, when blue display is provided in the display panel of one embodiment of the present invention at a low luminance, blue light is mainly observed while light having a wavelength longer than blue light is less observed (including the case where substantially no light having a wavelength longer than blue light is observed). When a display panel having such a structure is used for each of the display portion 50 and the display portion 60, high display quality can be achieved.

There is no particular limitation on the screen ratio (aspect ratio) of the display portion 50 and the display portion 60. For example, the display portion 50 and the display portion 60 are each compatible with a variety of screen ratios such as 1:1 (a square), 3:4, 16:9, and 16:10.

Preferably, the display portion 50 is formed over a glass substrate and the display portion 60 is formed over a silicon substrate. Forming the display portion 50 over a glass substrate reduces the manufacturing costs. However, forming the display portion 50 over a glass substrate might prevent an increase in the pixel density of the display portion 50 (to 1000 ppi or higher typically) due to the manufacturing apparatus. In the display device and the display system of one embodiment of the present invention, the pixel density of the display portion 60 can be increased (to 1000 ppi or higher typically) by forming the display portion 60 over a silicon substrate. In other words, an image with a resolution with which the display portion 50 is incompatible can be displayed on the display portion 60 complementarily.

With the display portion 60 with high definition or resolution, the pixels can be imperceptible (e.g., lines between pixels can be invisible) to the user and accordingly can provide a higher level of one or more of immersion, realistic sensation, and depth.

The terminal 21A has a period during which the display portion does not perform display and, in this period, can function as an input/output means (e.g., controller) for the display device 22. Such a function extends the usage period of the power supply portion 56 in the terminal 21A. In other words, the display system of one embodiment of the present invention can achieve power saving. As the power supply portion 56, a lithium-ion secondary battery or the like can be used, for example.

<Display Portion>

The display portion 50 and the display portion 60 each have a function of performing display. For the display portion 50 and the display portion 60, one or more of a liquid crystal display device, a light-emitting device including an organic EL device, and a light-emitting device including a light-emitting diode such as a micro LED can be used. Using a light-emitting device including an organic EL device for the display portion 50 and the display portion 60 is preferred in terms of productivity and emission efficiency.

<Communication Portion>

The communication portion 52 and the communication portion 62 each have a function of wireless or wired communication. The communication portion 52 and the communication portion 62 preferably have a function of wireless communication to reduce the number of components, such as a connection cable.

When having a wireless communication function, the communication portion 52 and the communication portion 62 can communicate through an antenna. Examples of the communication means (communication method) that can be used for the communication portion 52 and the communication portion 62 include computer networks such as the Internet, an intranet, an extranet, a PAN, a LAN, a CAN, a MAN, a WAN, and a GAN. For wireless communication, it is possible to use, as a communication protocol or a communication technology, such as the third-generation mobile communication system (3G), the fourth-generation mobile communication system (4G), or the fifth-generation mobile communication system (5G), or a communication standard developed by IEEE such as Wi-Fi (registered trademark) or Bluetooth (registered trademark).

<Control Portion>

The control portion 54 and the control portion 64 each have a function of controlling the display portion. As the Control Portion 54 and the Control Portion 64, an Arithmetic Processing device such as a central processing unit (CPU) or a graphics processing unit (GPU) can be used.

<Power Supply Portion>

The power supply portion 56 and the power supply portion 66 each have a function of supplying power to the display portion. As the power supply portion 56 and the power supply portion 66, a primary battery or a secondary battery can be used, for example. A preferred example of the secondary battery is a lithium-ion secondary battery.

<Sensor Portion>

The sensor portion 58 and the sensor portion 68 each have a function of obtaining information on one or more of the senses of sight, hearing, touch, taste, smell, and the like of the user. Specifically, the sensor portion 58 has a function of measuring at least one of force, displacement, position, speed, acceleration, angular velocity, rotational frequency, distance, light, magnetism, temperature, sound, time, electric field, current, voltage, electric power, radiation, humidity, gradient, oscillation, a smell, and infrared rays.

The sensor portion 68 preferably has a function of measuring brain waves in addition to the above function of the sensor portion 58. For example, the sensor portion 68 has a mechanism of measuring brain waves are measured from weak current flowing through electrodes in contact with the user's head. When the sensor portion 68 is capable of measuring brain waves, an image displayed on the display portion 50 or part of the image can be displayed on the user's intended position of the display portion 60. In this case, the user does not use both hands to operate the display device and can perform an input operation or the like with nothing in the hands (in the open-hand state).

At least part of any of the structure examples, the drawings corresponding thereto, and the like described in this embodiment can be implemented in combination with any of the other structure examples, the other drawings corresponding thereto, and the like as appropriate.

Embodiment 2

In this embodiment, a display panel of one embodiment of the present invention is described with reference to FIG. 6 to FIG. 11.

One embodiment of the present invention is a display panel including a display portion capable of full-color display. In a subpixel that is included in the display portion and emits blue light, a light-emitting device and a coloring layer transmitting blue light are provided. The light-emitting device includes a pixel electrode, an EL layer over the pixel electrode, and a common electrode over the EL layer. The EL layer contains a light-emitting material emitting blue light and a light-emitting material emitting light having a longer wavelength than blue light. In addition, the EL layer includes a first light-emitting unit over the pixel electrode, a charge-generation layer over the first light-emitting unit, and a second light-emitting unit over the charge-generation layer. That is, in the display panel of one embodiment of the present invention, a light-emitting device with a tandem structure including a plurality of light-emitting units is used. Note that the display portion capable of full-color display includes at least a subpixel emitting blue light and two or more kinds of subpixels emitting light other than blue light. An example of the blue light is light with a wavelength higher than or equal to 400 nm and lower than 500 nm.

According to the display panel of one embodiment of the present invention, in an emission spectrum with a display portion performing blue display at a first luminance, when the intensity of a first emission peak at a wavelength higher than or equal to 400 nm and lower than 500 nm is regarded as 1, the intensity of a second emission peak at a wavelength higher than or equal to 500 nm and lower than or equal to 700 nm in the emission spectrum is higher than or equal to 0 and lower than or equal to 0.5, and the first luminance is any value higher than 0 cd/$m^2$ and lower than 1 cd/$m^2$. In other words, when the display panel of one embodiment of the present invention performs blue display at a low luminance, blue light is mainly observed while light having a longer wavelength than blue light is less observed (including the case where substantially no light having a longer wavelength than blue light is observed).

In a light-emitting device having a single structure (including only one light-emitting unit) with a plurality of light-emitting layers, the carrier balance cannot be easily adjusted and the emission color at a low luminance might be different from that at a high luminance. By contrast, in a light-emitting device with the tandem structure, the carrier balance can be more easily adjusted and the emission color at a low luminance is less different from that at a high luminance than in a light-emitting device with a single structure. Consequently, the display panel of one embodiment of the present invention exhibits a small difference in color between low luminance display and high luminance display and can achieve high display quality.

In the display panel of one embodiment of the present invention, subpixels include light-emitting devices including EL layers having the same structure and coloring layers overlapping with the light-emitting devices. Coloring layers that can transmit visible light of different colors are provided for subpixels, whereby full-color display can be performed.

It is not necessary to form separate light-emitting layers for a plurality of subpixels when light-emitting devices with EL layers having the same structure are used in the subpixels. Thus, a layer other than a pixel electrode included in the light-emitting device (e.g., a light-emitting layer) can be common between (can be shared by) a plurality of subpixels. However, some layers included in the light-emitting device have relatively high conductivity; when such a layer having high conductivity is shared by a plurality of subpixels, leakage current might be generated between the subpixels. Particularly when the increase in resolution or aperture ratio of a display panel reduces the distance between subpixels, the leakage current might become too large to ignore and cause a decrease in display quality of the display panel or the like. In view of the above, in the display panel of one embodiment of the present invention, at least a part of the layers included in the EL layer is formed to have an island shape in each subpixel. When at least parts of the layers included in the EL layers are separately formed from each other in the subpixels, crosstalk between adjacent subpixels can be prevented from occurring. This enables the display panel to achieve both high resolution and high display quality.

For example, an island-shaped light-emitting layer can be formed by a vacuum evaporation method using a metal mask. However, this method causes a deviation from the designed shape and position of the island-shaped light-emitting layer due to various influences such as the accuracy of the metal mask, the positional deviation between the metal mask and a substrate, a warp of the metal mask, and the vapor-scattering-induced expansion of outline of the formed film; accordingly, it is difficult to achieve high resolution and high aperture ratio of the display panel. In addition, the outline of the layer may blur during vapor deposition, whereby the thickness of an end portion may be reduced. That is, the thickness of the island-shaped light-emitting layer may vary from area to area. In the case of manufacturing a display panel with a large size, high definition, or high resolution, the manufacturing yield might be reduced because of low dimensional accuracy of the metal mask and deformation due to heat or the like.

In view of the above, in manufacturing the display panel of one embodiment of the present invention, a pixel electrode is formed for each subpixel, and then, a light-emitting layer is formed across a plurality of pixel electrodes. After that, the light-emitting layer is processed by a photolithography method, for example, so that one island-shaped light-emitting layer is formed per pixel electrode. Thus, the light-emitting layer can be divided into island-shaped light-emitting layers for respective subpixels.

In the case of processing the light-emitting layer into an island shape, a structure is possible the processing is performed just above the light-emitting layer by a photolithography method. In such a structure, damage to the light-emitting layer (e.g., processing damage) might significantly degrade the reliability. In view of the above, in the manufacture of the display panel of one embodiment of the present invention, a sacrificial layer (which may be referred to as a mask layer) or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable display panel.

As described above, the island-shaped light-emitting layers formed in the method for manufacturing a display panel of one embodiment of the present invention are formed not by using a metal mask having a fine pattern but by processing a light-emitting layer deposited over the entire surface. Specifically, the size of the island-shaped light-emitting layers is obtained by division and scale down of the light-emitting layer by a photolithography method or the like. Thus, its size can be made smaller than the size of the light-emitting layer formed using a metal mask. Accordingly, a high-resolution display panel or a display panel with a high aperture ratio, which has been difficult to achieve, can be manufactured.

The small number of times of processing of the light-emitting layer with a photolithography method is preferable because a reduction in manufacturing cost and an improvement of manufacturing yield become possible. In the method for manufacturing the display panel of one embodiment of the present invention, the number of times of processing of the light-emitting layer with a photolithography method is one; thus, the display panel can be manufactured with high yield.

It is difficult to set the distance between adjacent light-emitting devices to be less than m with a formation method using a metal mask, for example. However, with the above method, the distance between adjacent light-emitting devices can be decreased to be less than 10 μm, less than or equal to 5 μm, less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of anon-light-emitting region that could exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the light-emitting layer itself (which can also be referred to as processing size) can be made much smaller than that in the case of using a metal mask. For example, in the case of using a metal mask for forming the light-emitting layers separately, a variation in the thickness occurs between the center and the edge of the light-emitting layer. This causes a reduction in an effective area that can be used as a light-emitting region with respect to the area of the light-emitting layer. In contrast, in the above manufacturing method, the film formed to have a uniform thickness is processed, so that island-shaped light-emitting layers can be formed to have a uniform thickness. Accordingly, even with a fine pattern, almost the all area can be used as a light-emitting region. Thus, a display panel having both a high resolution and a high aperture ratio can be manufactured.

Furthermore, in the method for manufacturing the display panel of one embodiment of the present invention, it is preferable to form a layer including a light-emitting layer (which can also be referred to as an EL layer or part of an EL layer) on the entire surface and subsequently form a sacrificial layer over the EL layer. Then, a resist mask is formed over the sacrificial layer, and the EL layer and the sacrificial layer are processed using the resist mask, whereby an island-shaped EL layer is preferably formed.

Provision of a sacrificial layer over an EL layer can reduce damage to the EL layer during the manufacturing process of the display panel and increase the reliability of the light-emitting device.

The island-shaped EL layer includes at least the light-emitting layer and preferably includes a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display panel and can reduce damage to the light-emitting layer. Thus, the reliability of the light-emitting device can be increased. Thus, the island-shaped EL layer preferably includes the light-emitting layer and a carrier-transport layer (an electron-transport layer or a hole-transport layer) over the light-emitting layer.

Note that in the light-emitting device, all layers included in the EL layer are not necessarily formed into island shapes, and some layers can be shared by (are common between) a plurality of light-emitting devices. Examples of layers in the EL layer include a light-emitting layer, carrier-injection layers (a hole-injection layer and an electron-injection layer), carrier-transport layers (a hole-transport layer and an electron-transport layer), carrier-blocking layers (a hole-blocking layer and an electron-blocking layer), and the like. In the method for manufacturing the display device of one embodiment of the present invention, some of the layers included in the EL layer are formed to have an island shape for each subpixel, and then, at least part of the sacrificial layer is removed and the other layer(s) included in the EL layer (e.g., a carrier-injection layer) and a common electrode (also referred to as an upper electrode) can be formed as shared layers by the plurality of light-emitting devices.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be distinguished from each other on the basis of the cross-sectional shape or properties in some cases. One layer may have two or three functions of the carrier-injection layer, the carrier-transport layer, and the carrier-blocking layer in some cases.

In contrast, the carrier-injection layer is often a layer having relatively high conductivity in the EL layer. Therefore, when the carrier-injection layer is in contact with the side surface of the island-shaped EL layer or the side surface of the pixel electrode, the light-emitting device might be short-circuited. Note that also in the case where the carrier-injection layer is formed in an island shape and the common electrode is formed to be shared by the plurality of light-emitting devices, the light-emitting device might be short-circuited when the common electrode is in contact with the side surface of the EL layer or the side surface of the pixel electrode.

Thus, the display panel of one embodiment of the present invention includes an insulating layer covering at least the side surface of the island-shaped light-emitting layer. Note that here, the side surface of the island-shaped light-emitting layer refers to the plane that is not parallel to the substrate (or the surface where the light-emitting layer is formed) among the interfaces between the island-shaped light-emitting layer and other layers. The side surface is not necessarily one of a flat plane and a curved plane in an exactly mathematical perspective.

Thus, at least some layers in the island-shaped EL layer and the pixel electrode can be inhibited from being in contact with the carrier-injection layer or the common electrode. Hence, a short circuit of the light-emitting device is inhibited, and the reliability of the light-emitting device can be increased.

The insulating layer preferably has a function of a barrier insulating layer against at least one of water and oxygen. Alternatively, the insulating layer preferably has a function of inhibiting the diffusion of at least one of water and oxygen. Alternatively, the insulating layer preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a targeted substance (also referred to as having low permeability). Alternatively, a barrier property refers to a function of capturing or fixing (also referred to as gettering) a targeted substance.

When the insulating layer has a function of the barrier insulating layer or a gettering function, entry of impurities (typically, at least one of water and oxygen) that would diffuse into the light-emitting devices from the outside can be inhibited. With this structure, a highly reliable light-emitting device, furthermore, a highly reliable display panel can be provided.

The display panel of one embodiment of the present invention includes a pixel electrode, a first light-emitting unit over the pixel electrode, a charge-generation layer (also referred to as an intermediate layer) over the first light-emitting unit, a second light-emitting unit over the charge-generation layer, an insulating layer provided to cover side surfaces of the first light-emitting unit, the charge-generation layer, and the second light-emitting unit, and a common electrode provided over the second light-emitting unit. Note that the light-emitting devices of different colors may include a common layer between the second light-emitting unit and the common electrode.

The hole-injection layer, the electron-injection layer, and the charge-generation layer, for example, often have relatively high conductivity in the EL layer. Since the side surfaces of these layers are covered with the insulating layer in the display panel of one embodiment of the present invention, these layers can be inhibited from being in contact with the common electrode or the like. Hence, a short circuit of the light-emitting device is inhibited, and the reliability of the light-emitting device can be increased.

The insulating layer that covers the side surface of the island-shaped EL layer may have a single-layer structure or a stacked-layer structure.

For example, an insulating layer having a single-layer structure using an inorganic material can be used as a protective insulating layer for the EL layer. In this way, the reliability of the display panel can be increased.

When the insulating layer has a stacked-layer structure, the first layer of the insulating layer is preferably formed using an inorganic insulating material because it is formed in contact with the EL layer. In particular, the first layer of the insulating layer is preferably formed by an atomic layer deposition (ALD) method, by which damage due to deposition is small.

Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In that case, a highly reliable display panel can be manufactured with high productivity. The second layer of the insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer.

In the case where the side surface of the EL layer and the organic resin film are in direct contact with each other, the EL layer might be damaged by an organic solvent or the like that might be contained in the organic resin film. When the first layer of the insulating layer is formed using an inorganic insulating film such as an aluminum oxide film by an ALD method, a structure in which the organic resin film and the side surface of the EL layer are not in direct contact with each other can be obtained. Thus, the EL layer can be inhibited from being dissolved by the organic solvent, for example.

In the display panel of one embodiment of the present invention, it is not necessary to provide an insulating layer that covers the end portion of the pixel electrode between the pixel electrode and the EL layer; thus, the distance between adjacent light-emitting devices can be made extremely small. Thus, a display panel with higher resolution or higher definition can be achieved. In addition, a mask for forming the insulating layer is not needed, which leads to a reduction in manufacturing cost of the display panel.

Furthermore, light emitted by the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display panel of one embodiment of the present invention can significantly reduce the viewing angle dependence. A reduction in the viewing angle dependence leads to an increase in visibility of an image on the display panel. For example, in the display panel of one embodiment of the present invention, the viewing angle (the maximum angle with a certain contrast ratio maintained when the screen is seen from an oblique direction) can be more than or equal to 100° and less than 180°, preferably more than or equal to 150° and less than or equal to 170°. Note that the viewing angle refers to that in both the vertical direction and the horizontal direction.

To prevent crosstalk, one embodiment of the present invention is not limited to the structure in which the island-shaped EL layers are formed for the respective light-emitting devices. For example, crosstalk can be prevented also by the structure in which a region where the EL layer is thinner is formed between adjacent light-emitting devices. The existence of the region where the EL layer is thinner between adjacent light-emitting devices prevents current flow through the outside of a region of the EL layer that is in contact with the pixel electrode. In the EL layer, the region in contact with the pixel electrode can be used mainly as a light-emitting region.

For example, the ratio of a thickness T1 of the pixel electrode to a thickness T2 of the EL layer, i.e., T1/T2, is preferably higher than or equal to 0.5, further preferably higher than or equal to 0.8, further preferably higher than or equal to 1.0, still further preferably higher than or equal to 1.5. In the region between adjacent light-emitting devices, the thickness T1 of the pixel electrode may be smaller in some cases when a depressed portion is formed in the insulating layer having surface where the pixel electrode is formed (refer to an insulating layer 255*c* described later in Embodiment 3 (FIG. 18A or the like)). Specifically, the ratio of T3, which is the sum of the thickness of the pixel electrode and the depth of the depressed portion, to the thickness T2 of the EL layer, i.e., T3/T2, is preferably higher than or equal to 0.5, further preferably higher than or equal to 0.8, further preferably higher than or equal to 1.0, still further preferably higher than or equal to 1.5. When T1 and T2, or T2 and T3 have the above relationship, the region where the EL layer is thinner can be formed easily between adjacent light-emitting devices. The EL layer may have a region where the EL layer is extremely thinner, so that part of the EL layer may be separated.

Each of the thickness T1 of the pixel electrode and the sum T3 is, for example, preferably greater than or equal to 160 nm, greater than or equal to 200 nm, or greater than or equal to 250 nm and less than or equal to 1000 nm, less than or equal to 750 nm, less than or equal to 500 nm, less than or equal to 400 nm, or less than or equal to 300 nm.

For example, the angle (also referred to as a taper angle) between the side surface of the pixel electrode and the substrate surface (or the a formation surface) is preferably greater than or equal to 60° and less than or equal to 140°, further preferably greater than or equal to 700 and less than or equal to 140°, still further preferably greater than or equal to 800 and less than or equal to 140°. When the taper angle of the pixel electrode has the above value, the region where the EL layer is thinner can be formed easily between adjacent light-emitting devices.

Structure Example 1 of Display Panel

FIG. 6 and FIG. 7 illustrate the display panel of one embodiment of the present invention.

Figure 6A:
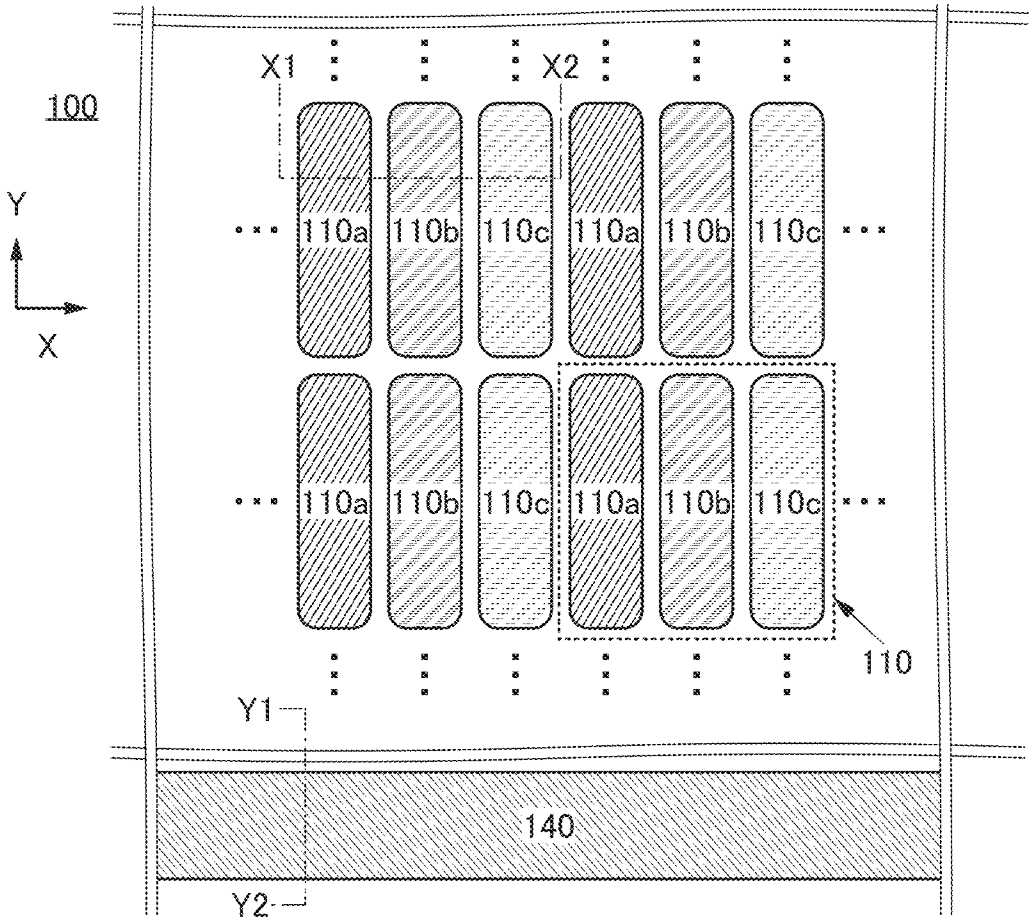
FIG. 6A is a top view illustrating an example of a display panel.

FIG. 6A is atop view of a display panel 100. The display panel 100 includes a display portion in which a plurality of pixels 110 are arranged, and a connection portion 140 outside the display portion. A plurality of subpixels are arranged in matrix in the display portion. FIG. 6A illustrates subpixels arranged in two rows and six columns, which form pixels in two rows and two columns. The connection portion 140 can also be referred to as a cathode contact portion.

The pixel 110 illustrated in FIG. 6A employs stripe arrangement. The pixel 110 illustrated in FIG. 6A is composed of three subpixels: a subpixel 110_a_, a subpixel 110_b_, and a subpixel 110_c_.

An example in which the subpixel 110_a_ emits red light, the subpixel 110_b_ emits green light, and the subpixel 110_c_ emits blue light is described in this embodiment. Note that in this embodiment, subpixels of three colors of red (R), green (G), and blue (B) are described as an example; however, subpixels of three colors of yellow (Y), cyan (C), and magenta (M) or the like may be used. The number of kinds of subpixels is not limited to three, and four or more kinds of subpixels may be used. As the four subpixels, subpixels of four colors of R, G, B, and white (W), subpixels of four colors of R, G, B, and Y, or four subpixels of R, G, B, and infrared light (IR) can be given, for example.

The top surface shapes of the subpixels illustrated in FIG. 6A correspond to the top surface shapes of light-emitting regions.

The range of the circuit layout for forming the subpixels is not limited to the range of the subpixels illustrated in FIG. 6A and may be placed outside the subpixels. For example, some or all of transistors included in the subpixel 110_a_ may be positioned outside the range of the subpixel 110_a_ illustrated in FIG. 6A. For example, transistors included in the subpixel 110_a_ may include a portion positioned within the range of the subpixel 110_b_, or may include a portion positioned within the range of the subpixel 110_c_.

Although the subpixels 110_a_, 110_b_, and 110_c_ have the same or substantially the same aperture ratio (also referred to as size or size of a light-emitting region) in FIG. 6A, one embodiment of the present invention is not limited thereto. The aperture ratio of each of the subpixels 110_a_, 110_b_, and 110_c_ can be determined as appropriate. The subpixels 110_a_, 110_b_, and 110_c_ may have different aperture ratios, or two or more of the subpixels 110_a_, 110_b_, and 110_c_ may have the same or substantially the same aperture ratio.

In this specification and the like, the row direction is referred to as X direction and the column direction is referred to as Y direction in some cases. The X direction and the Y direction intersect with each other and are, for example, orthogonal to each other (see FIG. 6A). FIG. 6A illustrates an example in which subpixels of different colors are arranged in the X direction and subpixels of the same color are arranged in the Y direction.

Although the top view of FIG. 6A illustrates an example in which the connection portion 140 is positioned in the lower side of the display portion, one embodiment of the present invention is not limited thereto. The connection portion 140 may be provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 6B:
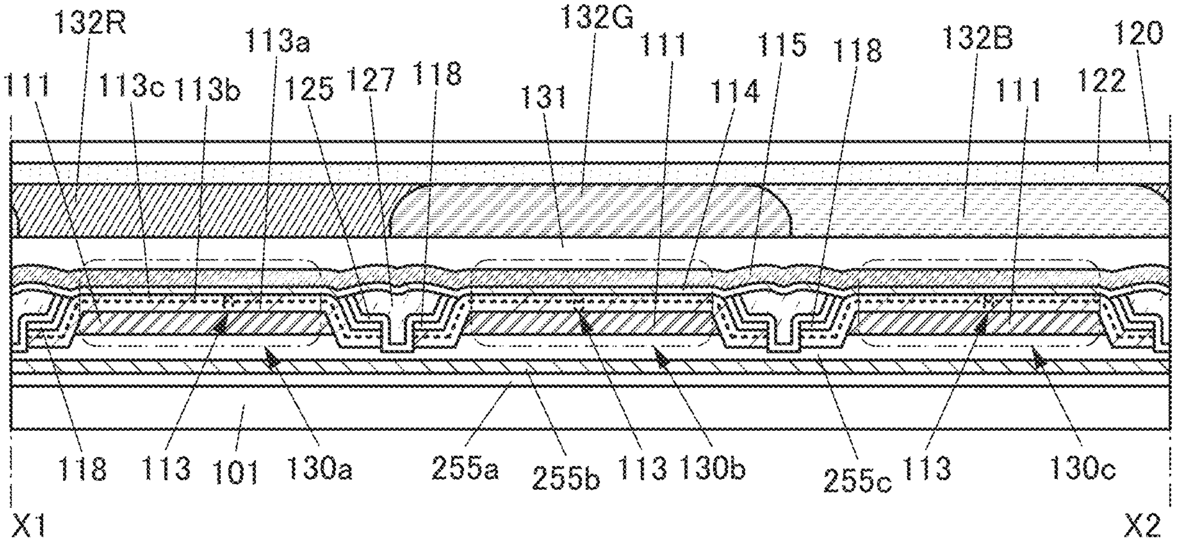
FIG. 6B is a cross-sectional view illustrating an example of a display panel.
Figure 7A:
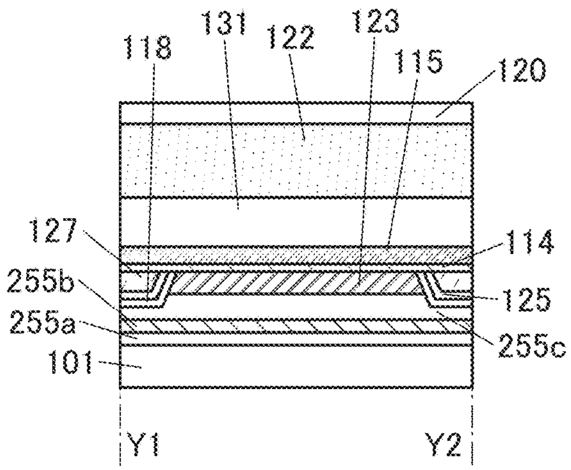
FIG. 7A to FIG. 7D are cross-sectional views illustrating examples of a display panel.
Figure 7B:
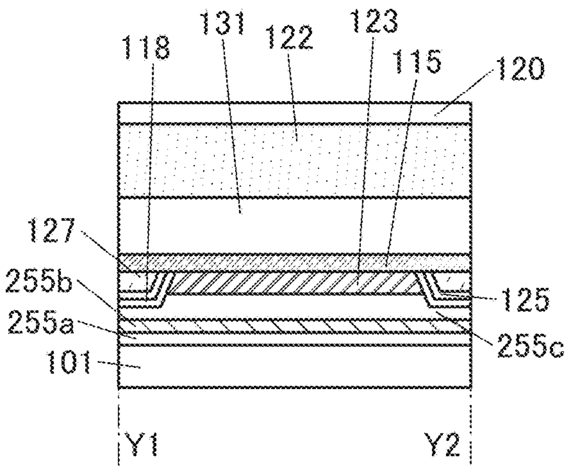
Figure 7C:
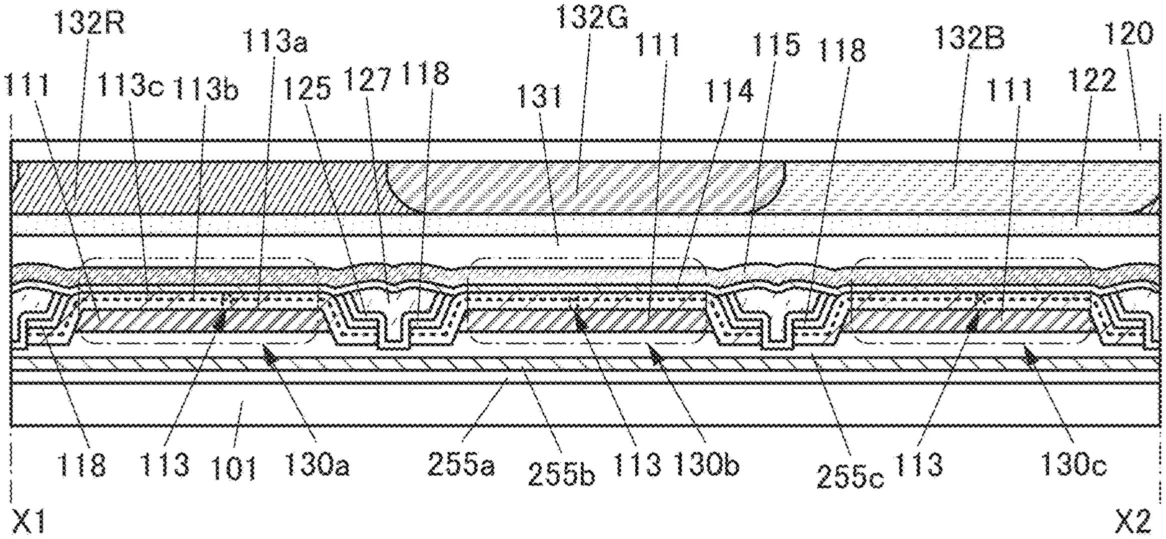
Figure 7D:
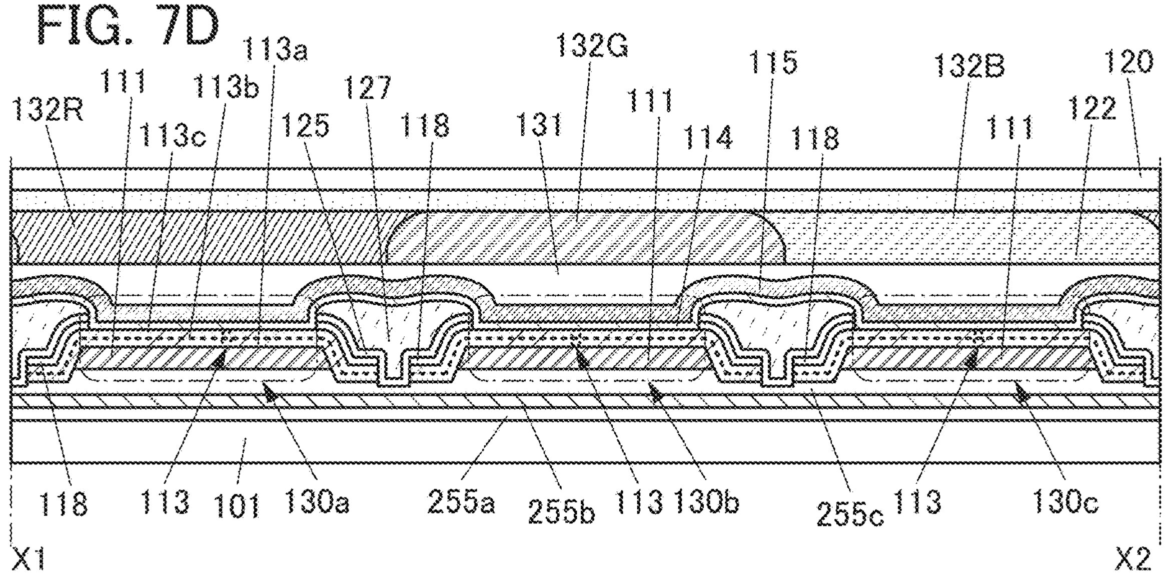

FIG. 6B, FIG. 7C, and FIG. 7D each illustrate a cross-sectional view taken along the dashed-dotted line X1-X2 in FIG. 6A. FIG. 7A and FIG. 7B each illustrate across-sectional view taken along the dashed-dotted line Y1-Y2 in FIG. 6A.

FIG. 8A, FIG. 8B, FIG. 9A to FIG. 9C, and FIG. 10A to FIG. 10C each illustrate a cross section along the dashed-dotted line X1-X2 and a cross section along dashed-dotted line Y1-Y2 in FIG. 6A side by side.

As illustrated in FIG. 6B, in the display panel 100, an insulating layer is provided over a layer 101 including transistors, light-emitting devices 130_a_, 130_b_, and 130_c_ are provided over the insulating layer, and a protective layer 131 is provided to cover these light-emitting devices. Coloring layers 132R, 132G, and 132B are provided over the protective layer 131, and a substrate 120 is bonded onto the protective layer 131 with a resin layer 122. In a region between adjacent light-emitting devices, an insulating layer 125 and an insulating layer 127 over the insulating layer 125 are provided.

Although FIG. 6B and the like illustrate a plurality of cross sections of the insulating layer 125 and the insulating layer 127, the insulating layer 125 and the insulating layer 127 are each a continuous layer when the display panel 100 is seen from above. In other words, the display panel 100 can have a structure such that one insulating layer 125 and one insulating layer 127 are provided, for example. Note that the display panel 100 may include a plurality of insulating layers 125 that are separated from each other and a plurality of insulating layers 127 that are separated from each other.

The display panel of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The insulating layer over the transistors may have a single-layer structure or a stacked-layer structure. In FIG. 6B and the like, an insulating layer 255_a_, an insulating layer 255_b_ over the insulating layer 255_a_, and the insulating layer 255_c_ over the insulating layer 255_b_ are illustrated as the insulating layer over the transistors. These insulating layers may have a depressed portion between adjacent light-emitting devices. In the example illustrated in FIG. 6B and the like, the insulating layer 255_c_ has a depressed portion. Note that the insulating layers (the insulating layer 255*a* to the insulating layer 255*c*) over the transistors may be regarded as part of the layer 101 including transistors.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c*, and a silicon nitride film be used as the insulating layer 255*b*. The insulating layer 255*b* preferably has a function of an etching protective film.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

Structure examples of the layer 101 including transistors will be described later in Embodiment 4.

As the light-emitting device, an OLED (Organic Light Emitting Diode) or a QLED (Quantum-dot Light Emitting Diode) is preferably used. Examples of a light-emitting substance (also referred to as a light-emitting material) contained in the light-emitting device include a substance emitting fluorescent light (a fluorescent material), a substance emitting phosphorescent light (a phosphorescent material), and a substance exhibiting thermally activated delayed fluorescence (Thermally activated delayed fluorescence (TADF) material). As the TADF material, a material in which the singlet and triplet excited states are in thermal equilibrium may be used. Since such a TADF material has a short emission lifetime (excitation lifetime), it can inhibit a reduction in the efficiency of a light-emitting device in a high-luminance region. An inorganic compound (e.g., a quantum dot material) may also be used as the light-emitting substance contained in the light-emitting device.

The light-emitting device includes an EL layer between a pair of electrodes. The EL layer includes at least a light-emitting layer. In this specification and the like, one of the pair of electrodes may be referred to as a pixel electrode and the other may be referred to as a common electrode.

One of the pair of electrodes of the light-emitting device functions as an anode and the other electrode functions as a cathode. In some of the cases described below, the pixel electrode may function as an anode and the common electrode may function as a cathode, for example.

The light-emitting device includes a pixel electrode 111 over the insulating layer 255*c*, an island-shaped EL layer 113 over the pixel electrode 111, a common layer 114 over the EL layer 113, and a common electrode 115 over the common layer 114.

The pixel electrode 111 preferably has an end portion with a tapered shape. In the case where the pixel electrode 111 has an end portion with a tapered shape, the EL layer 113 that is provided along the side surface of the pixel electrode 111 also has a tapered shape. When the side surface of the pixel electrode 111 has a tapered shape, coverage with the EL layer 113 provided along the side surface of the pixel electrode 111 can be improved. Furthermore, when the side surface of the pixel electrode 111 has a tapered shape, a foreign matter (also referred to as dust or particles) in the manufacturing process is easily removed by processing such as cleaning, which is preferable.

Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

The light-emitting devices 130*a*, 130*b*, and 130*c* each include the EL layer 113 and the common layer 114. Note that the common layer 114 can also be referred to as a part of the EL layer in the light-emitting device. In this specification and the like, in the EL layers included in the light-emitting devices, the island-shaped layer provided in each light-emitting device is referred to as the EL layer 113, and the layer shared by the plurality of light-emitting devices is referred to as the common layer 114.

The plurality of EL layers 113 are each provided into an island shape. The plurality of EL layers 113 can have the same structure.

The EL layer 113 includes at least a light-emitting layer. In addition, the EL layer 113 may include one or more of a hole-injection layer, a hole-transport layer, a hole-blocking layer, a charge-generation layer, an electron-blocking layer, an electron-transport layer, and an electron-injection layer.

For example, the EL layer 113 can contain a light-emitting material emitting blue light and a light-emitting material emitting light having a longer wavelength than blue light. For example, a structure containing a light-emitting material emitting blue light and a light-emitting material emitting yellow light, or a structure containing a light-emitting material emitting blue light, a light-emitting material emitting green light, and a light-emitting material emitting red light can be used for the EL layer 113.

The EL layer 113 includes a plurality of light-emitting units. In this embodiment, the EL layer 113 includes two light-emitting units, for example. Specifically, the EL layer 113 includes a first light-emitting unit 113*a*, a charge-generation layer 113*b* (indicated by a dotted line), and a second light-emitting unit 113*c*.

Each of the light-emitting units includes a light-emitting layer. For example, the plurality of light-emitting units emit light of complementary colors, the light-emitting device can emit white light.

In the case where the light-emitting device configured to emit white light has a microcavity structure described later, light of a specific color such as red, green, or blue is sometimes intensified to be emitted.

The first light-emitting unit 113*a* and the second light-emitting unit 113*c* each include at least a light-emitting layer. The first light-emitting unit 113*a* and the second light-emitting unit 113*c* may each include one or more of a hole-injection layer, a hole-transport layer, a hole-blocking layer, an electron-blocking layer, an electron-transport layer, and an electron-injection layer.

For example, the first light-emitting unit 113*a* may include a hole-injection layer, a hole-transport layer, a light-emitting layer, and an electron-transport layer in this order. In addition, an electron-blocking layer may be provided between the hole-transport layer and the light-emitting layer. Furthermore, an electron-injection layer may be provided over the electron-transport layer.

Alternatively, the first light-emitting unit 113*a* may include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

For example, the second light-emitting unit 113*c* may include a hole-transport layer, a light-emitting layer, and an electron-transport layer in this order. In addition, a hole-injection layer may be provided between the charge-generation layer 113*b* and the hole-transport layer. Moreover, an electron-blocking layer may be provided between the hole-transport layer and the light-emitting layer.

Alternatively, the second light-emitting unit 113*c* may include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

It is preferable that the second light-emitting unit 113*c* include a light-emitting layer and a carrier-transport layer (an electron-transport layer or a hole-transport layer) over the light-emitting layer. Since the surface of the second light-emitting unit 113*c* is exposed in the manufacturing process of the display panel, providing the carrier-transport layer over the light-emitting layer inhibits the light-emitting layer from being exposed on the outermost surface, so that damage to the light-emitting layer can be reduced. Thus, the reliability of the light-emitting device can be increased.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the light-emitting devices 130*a*, 130*b*, and 130*c*.

A tandem structure is employed for the light-emitting device of this embodiment. Although the light-emitting device includes two light-emitting units in the example described in this embodiment, the number of light-emitting units included in the light-emitting device may be three or more.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIG. 7A and FIG. 7B). For the conductive layer 123, a conductive layer formed using the same material and through the same process as the pixel electrode 111 is preferably used.

Note that FIG. 7A illustrates an example in which the common layer 114 is provided over the conductive layer 123, and the conductive layer 123 and the common electrode 115 are electrically connected to each other through the common layer 114. Furthermore, as illustrated in FIG. 7B, the common layer 114 is not necessarily provided in the connection portion 140. In FIG. 7B, the conductive layer 123 and the common electrode 115 are directly connected to each other. For example, by using a mask for specifying a deposition area (also referred to as an area mask or a rough metal mask to distinguish from a fine metal mask), the common layer 114 can be formed in a region different from a region where the common electrode 115 is formed.

The protective layer 131 is preferably included over the light-emitting devices 130*a*, 130*b*, and 130*c*. Providing the protective layer 131 can enhance the reliability of the light-emitting devices. The protective layer 131 may have a single-layer structure or a stacked-layer structure of two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices, for example; thus, the reliability of the display panel can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film, an aluminum nitride film, and the like. Examples of the oxynitride insulating film include a silicon oxynitride film, an aluminum oxynitride film, and the like. Examples of the nitride oxide insulating film include a silicon nitride oxide film, an aluminum nitride oxide film, and the like.

In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted by the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

The protective layer 131 may have a stacked-layer structure of two layers which are formed by different deposition methods. Specifically, the first layer of the protective layer 131 may be formed by an ALD method, and the second layer of the protective layer 131 may be formed by a sputtering method.

In the subpixel 110*a*, the coloring layer 132R that transmits red light is provided over the protective layer 131. Thus, light emitted by the light-emitting device 130*a* is extracted as red light to the outside of the display panel 100 through the coloring layer 132R. Note that the coloring layer

132R may be shared by a plurality of subpixels 110*a* adjacent to each other. Furthermore, the coloring layer 132R may be independently provided one by one for the subpixels 110*a*.

Similarly, in the subpixel 110*b*, the coloring layer 132G that transmits green is provided over the protective layer 131. Thus, from the subpixel 110*b*, light emitted by the light-emitting device 130*b* is extracted as green light to the outside of the display panel 100 through the coloring layer 132G.

Also in the subpixel 110*c*, the coloring layer 132B that transmits blue light is provided over the protective layer 131. Thus, from the subpixel 110*c*, light emitted by the light-emitting device 130*c* is extracted as blue light to the outside of the display panel 100 through the coloring layer 132B.

FIG. 6B and the like illustrate an example in which the coloring layers 132R, 132G, and 132B are directly provided over the light-emitting devices 130*a*, 130*b*, and 130*c* with the protective layer 131 therebetween. With such a structure, the alignment accuracy of the light-emitting devices and the coloring layers can be improved. Furthermore, the structure is preferable because the distance between the light-emitting devices and the coloring layers can be reduced, so that color mixing can be inhibited and the viewing angle characteristics can be improved.

As illustrated in FIG. 7C, the substrate 120 provided with the coloring layers 132R, 132G, and 132B may be attached to the protective layer 131 with the resin layer 122. The coloring layers 132R, 132G, and 132B are provided on the substrate 120, whereby the heat treatment temperature in the forming process of them can be increased.

In FIG. 6B and the like, an insulating layer covering the end portion of the top surface of the pixel electrode 111 is not provided between the pixel electrode 111 and the EL layer 113. Thus, the distance between adjacent light-emitting devices can be extremely shortened. Accordingly, the display panel can have high resolution or high definition.

In FIG. 6B and the like, a sacrificial layer 118 is positioned over the EL layer 113. In FIG. 6B, one end portion of the sacrificial layer 118 is aligned or substantially aligned with the end portion of the EL layer 113, and the other end portion of the sacrificial layer 118 is positioned over the EL layer 113. Thus, the sacrificial layer used to protect the EL layer 113 used in the manufacture of the EL layer 113 may partly remain in the display panel of one embodiment of the present invention. The sacrificial layer 118 sometimes remains between the EL layer 113 and the insulating layer 125 or the insulating layer 127, for example.

As the sacrificial layer, one or more of a metal film, an alloy film, a metal oxide film, a semiconductor film, an organic insulating film, an inorganic insulating film, and the like can be used, for example. As the sacrificial layer, a variety of inorganic insulating films that can be used as the protective layer 131 can be used. For example, an inorganic insulating material such as aluminum oxide, hafnium oxide, or silicon oxide can be used for the sacrificial layer, for example.

As illustrated in FIG. 7D, one or both of the insulating layer 125 and the insulating layer 127 may cover part of the top surface of the EL layer 113. When one or both of the insulating layer 125 and the insulating layer 127 cover not only the side surfaces of the EL layer 113 but also the top surface thereof, peeling of the EL layer 113 can further be prevented and the reliability of the light-emitting devices can be improved. In addition, the manufacturing yield of the light-emitting devices can be further increased. In the example in FIG. 7D, the EL layer 113, the sacrificial layer 118, the insulating layer 125, and the insulating layer 127 are stacked in the position over the end portion of the pixel electrode 111.

There is no particular limitation on whether the width of the pixel electrode 111 or the width of the EL layer is larger. FIG. 6B and the like illustrate an example where the end portion of the EL layer 113 is positioned more outward from the end portion of the pixel electrode 111. In FIG. 6B and the like, the EL layer 113 is formed to cover the end portion of the pixel electrode 111. Such a structure can increase the aperture ratio compared with the structure in which the end portion of the EL layer 113 is positioned inward from the end portion of the pixel electrode 111.

Covering the side surface of the pixel electrode 111 with the EL layer 113 inhibits contact between the pixel electrode 111 and the common electrode 115, thereby inhibiting a short circuit in the light-emitting device. Furthermore, the distance between the light-emitting region (i.e., the region overlapping the pixel electrode 111) in the EL layer 113 and the end portion of the EL layer 113 can be increased. The end portion of the EL layer 113 includes a portion that may be damaged during the manufacturing process of the display device. With the portion not used for the light-emitting region, a variation in characteristics of the light-emitting devices can be inhibited, and the reliability can be improved.

Figure 8A:
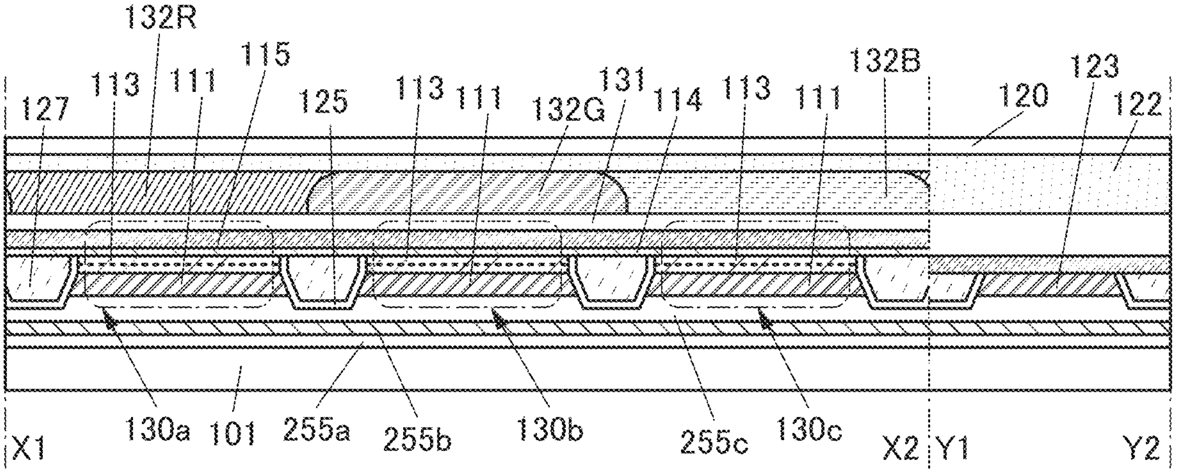
FIG. 8A and FIG. 8B are cross-sectional views illustrating examples of a display panel.
Figure 8B:
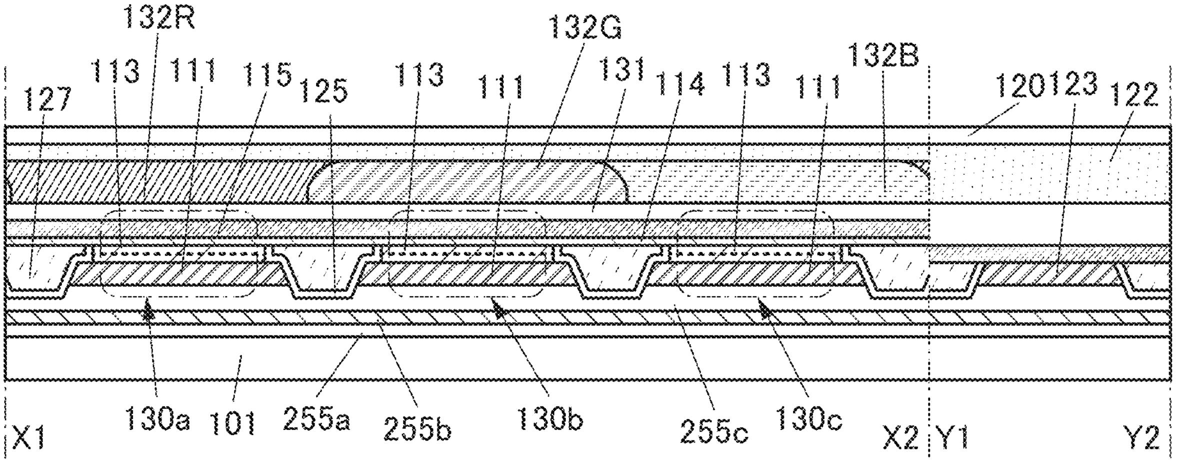

FIG. 8A illustrates an example where the end portion of the top surface of the pixel electrode 111 and the end portion of the EL layer 113 are aligned or substantially aligned with each other. In the example illustrated in FIG. 8A, the end portion of the EL layer 113 is positioned inward from the end portion of the bottom surface of the pixel electrode 111. FIG. 8B illustrates an example where the end portion of the EL layer 113 is positioned inward from the end portion of the top surface of the pixel electrode 111. In FIG. 8A and FIG. 8B, the end portion of the EL layer 113 is positioned over the pixel electrode 111.

As illustrated in FIG. 8A and FIG. 8B, when the end portion of the EL layer 113 is positioned over the pixel electrode 111, a reduction in the thickness of the EL layer 113 at or near the end portion of the pixel electrode 111 can be inhibited to make the thickness of the EL layer 113 uniform.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with use of the same mask pattern is included in the expression. However, in some cases, the outlines do not completely overlap with each other and the upper layer is positioned on the inner side of the lower layer or the upper layer is positioned on the outer side of the lower layer; such a case is also represented as "end portions are substantially aligned with each other" or "top surface shapes are substantially the same".

The end portion of the EL layer 113 may have both a portion positioned outward from the end portion of the pixel electrode 111 and a portion positioned inward from the end portion of the pixel electrode 111.

Figure 9A:
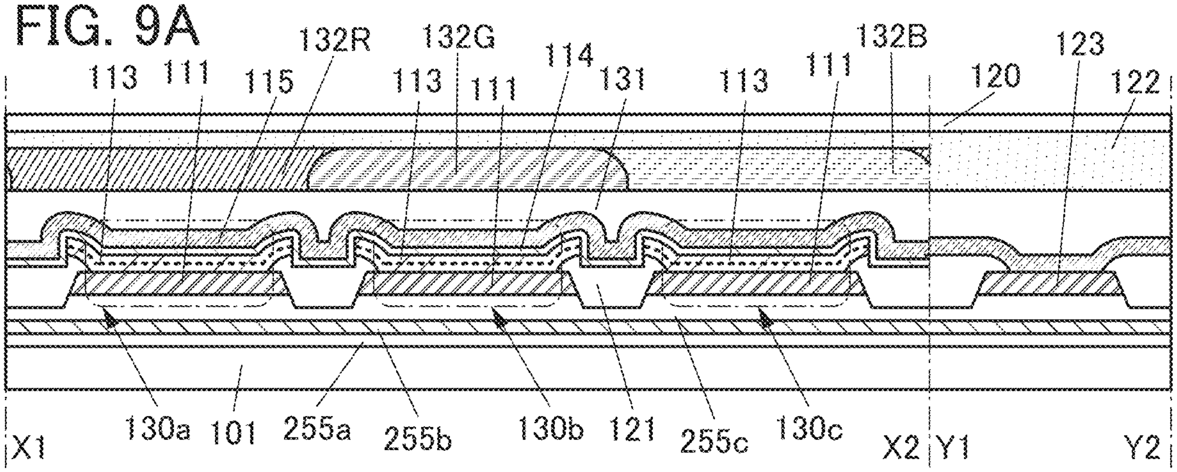
FIG. 9A to FIG. 9C are cross-sectional views illustrating examples of display panel.
Figure 9B:
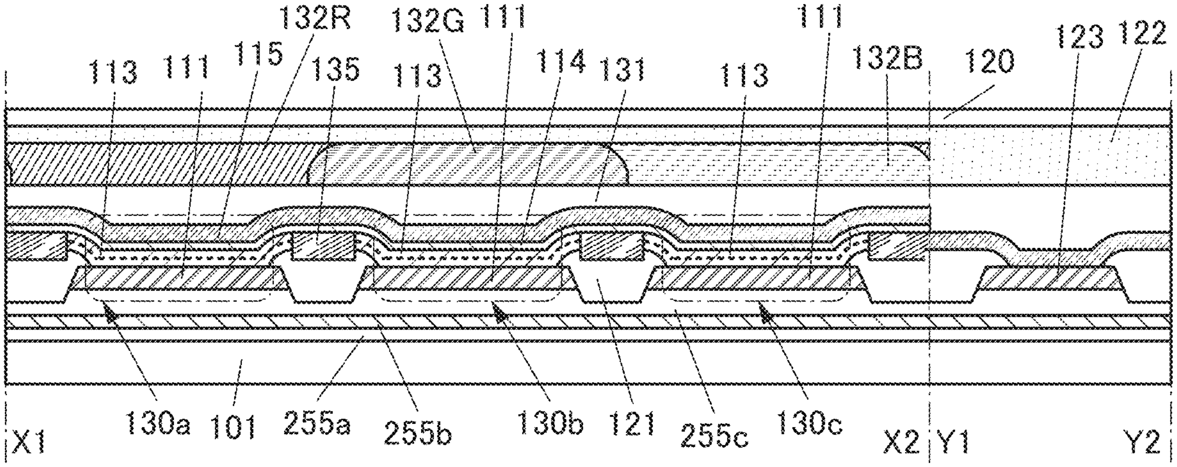
Figure 9C:
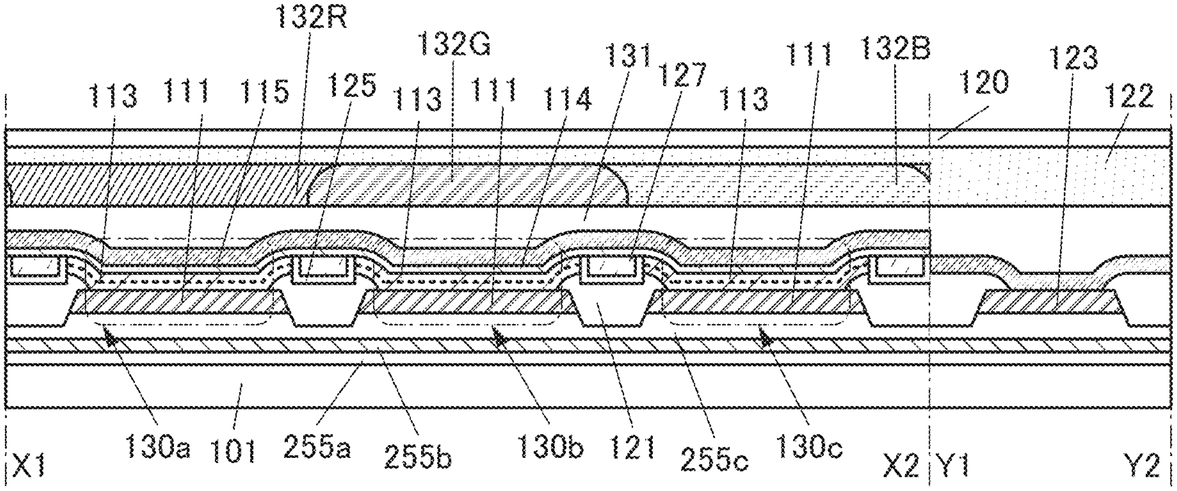

As illustrated in FIG. 9A to FIG. 9C, an insulating layer 121 covering the end portion of the top surface of the pixel electrode 111 may be provided. The EL layer 113 can include a portion on and in contact with the pixel electrode 111 and a portion on and in contact with the insulating layer 121. The insulating layer 121 can have a single-layer structure or a stacked-layer structure using one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121, impurities are less likely to enter the light-emitting devices as compared with the case where an organic insulating film is used; therefore, the reliability of the light-emitting devices can be improved. Furthermore, the insulating layer 121 can be thinner, so that high resolution can be easily achieved. When an organic insulating film is used as the insulating layer 121, good step coverage can be obtained as compared with the case where an inorganic insulating film is used; therefore, an influence of the shape of the pixel electrodes can be small. Therefore, a short circuit in the light-emitting devices can be prevented. Specifically, when an organic insulating film is used as the insulating layer 121, the insulating layer 121 can be processed into a tapered shape or the like.

Note that the insulating layer 121 is not necessarily provided. The aperture ratio of the subpixel can be sometimes increased without providing the insulating layer 121. Alternatively, the distance between subpixels can be shortened and the resolution or the definition of the display panel can be sometimes increased.

Note that FIG. 9A illustrates an example in which the common layer 114 enters the region between two EL layers 113 and the like over the insulating layer 121. As illustrated in FIG. 9B, a space 135 may be formed in the region.

The space 135 contains, for example, one or more selected from air, nitrogen, oxygen, carbon dioxide, and Group 18 elements (typified by helium, neon, argon, xenon, and krypton). Alternatively, a resin or the like may fill the space 135.

As illustrated in FIG. 9C, the insulating layer 125 may be provided to cover the top surface of the insulating layer 121 and the side surface of the EL layer 113, and the insulating layer 127 may be provided over the insulating layer 125.

In FIG. 6B, FIG. 7C, FIG. 7D, FIG. 8A, and FIG. 8B, the side surface of the pixel electrode 111 and the side surface of the EL layer 113 are covered with the insulating layer 125 and the insulating layer 127. In FIG. 9A to FIG. 9C, the side surface of the pixel electrode 111 is covered with the insulating layer 121. The side surface of the EL layer 113 illustrated in FIG. 9A is covered with the insulating layer 125, and the side surface of the EL layer illustrated in FIG. 9C is covered with the insulating layer 125 and the insulating layer 127. Thus, the common layer 114 (or the common electrode 115) can be inhibited from being in contact with the side surface of the pixel electrode 111 and the side surface of the EL layer 113, whereby a short circuit of the light-emitting devices can be inhibited. Thus, the reliability of the light-emitting devices can be increased.

The insulating layer 125 preferably covers at least one of the side surface of the pixel electrode 111 and the side surface of the EL layer 113, and further preferably covers both the side surface of the pixel electrode 111 and the side surface of the EL layer 113. The insulating layer 125 can be in contact with the side surface of the pixel electrode 111 and the side surface of the EL layer 113.

In FIG. 6B and the like, the end portion of the pixel electrode 111 is covered with the EL layer 113, and the insulating layer 125 is in contact with the side surface of the EL layer 113.

The insulating layer 127 is provided over the insulating layer 125 to fill a depressed portion in the insulating layer 125. The insulating layer 127 can have a structure overlapping with the side surface of the EL layer 113 with the insulating layer 125 therebetween (also referred to as a structure covering the side surface thereof). Furthermore, the insulating layer 127 may overlap with the side surface of the pixel electrode 111 with the insulating layer 125 therebetween.

The insulating layer 125 and the insulating layer 127 can fill a gap between adjacent island-shaped layers, whereby the formation surfaces of layers (e.g., the carrier-injection layer and the common electrode) provided over the island-shaped layers can be less uneven and can be flatter. Thus, the coverage with the carrier-injection layer, the common electrode, and the like can be increased and disconnection of the common electrode can be prevented.

Note that in this specification and the like, disconnection refers to a phenomenon in which a layer, a film, or an electrode is split because of the shape of the formation surface (e.g., a level difference).

The common layer 114 and the common electrode 115 are provided over the EL layer 113, the insulating layer 125, and the insulating layer 127. At the stage before the insulating layer 125 and the insulating layer 127 are provided, a level difference due to a region where the pixel electrode 111 and the EL layer 113 are provided and a region where the pixel electrode 111 and the EL layer 113 are not provided (a region between the light-emitting devices) is caused. In the display panel of one embodiment of the present invention, the level difference can be eliminated with the insulating layer 125 and the insulating layer 127, and the coverage with the common layer 114 and the common electrode 115 can be improved. Consequently, it is possible to inhibit a connection defect due to disconnection of the common electrode 115. Alternatively, an increase in electrical resistance, which is caused by a reduction in thickness locally of the common electrode 115 due to level difference, can be inhibited.

To improve the planarity of a surface over which the common layer 114 and the common electrode 115 are formed, the levels of the top surface of the insulating layer 125 and the top surface of the insulating layer 127 are aligned or substantially aligned with the level of the top surface of the EL layer 113 at its end portion (also referred to as the level of the end portion of the top surface of the EL layer 113). The top surface of the insulating layer 127 preferably has a flat surface; however, it may include a projecting portion, a convex curved surface, a concave curved surface, or a depressed portion.

The insulating layer 125 or the insulating layer 127 can be provided in contact with the island-shaped EL layer 113. When the insulating layer and the island-shaped EL layer are in close contact with each other, an effect of fixing the adjacent island-shaped EL layers by or attaching the adjacent island-shaped EL layers to the insulating layer can be attained. Thus, film separation of the EL layer 113 can be prevented and the reliability of the light-emitting device can be increased. Furthermore, the manufacturing yield of the light-emitting device can be increased.

Figure 10A:
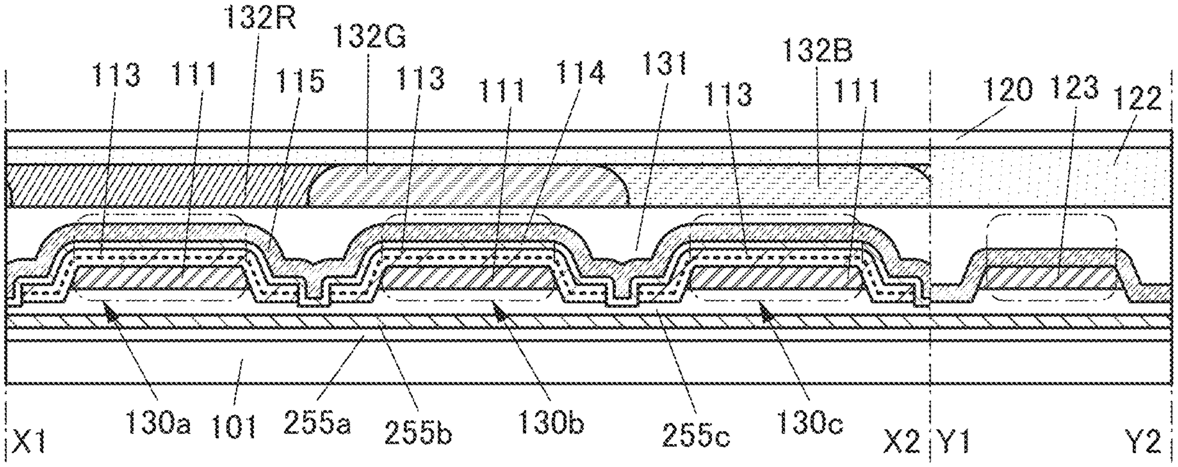
FIG. 10A to FIG. 10C are cross-sectional views illustrating examples of a display panel.

Note that as illustrated in FIG. 10A, the display panel does not necessarily include the insulating layer 125 or the insulating layer 127. FIG. 10A illustrates an example in which the common layer 114 is provided in contact with the top surface of the insulating layer 255*c*, the side surface and top surface of the EL layer 113. Note that the space 135 may be provided between adjacent EL layers 113 as illustrated in FIG. 9B.

Note that one of the insulating layer 125 and the insulating layer 127 is not necessarily provided. When the insulating layer 125 having a single-layer structure using an inorganic material is formed, for example, the insulating layer 125 can be used as a protective insulating layer for the EL layer 113. This leads to higher reliability of the display panel. For another example, when the insulating layer 127 having a single-layer structure using an organic material is formed, the insulating layer 127 can fill a gap between adjacent EL layers 113 and planarization can be performed. In this way, the coverage with the common electrode 115 (upper electrode) formed over the EL layer 113 and the insulating layer 127 can be increased.

Figure 10B:
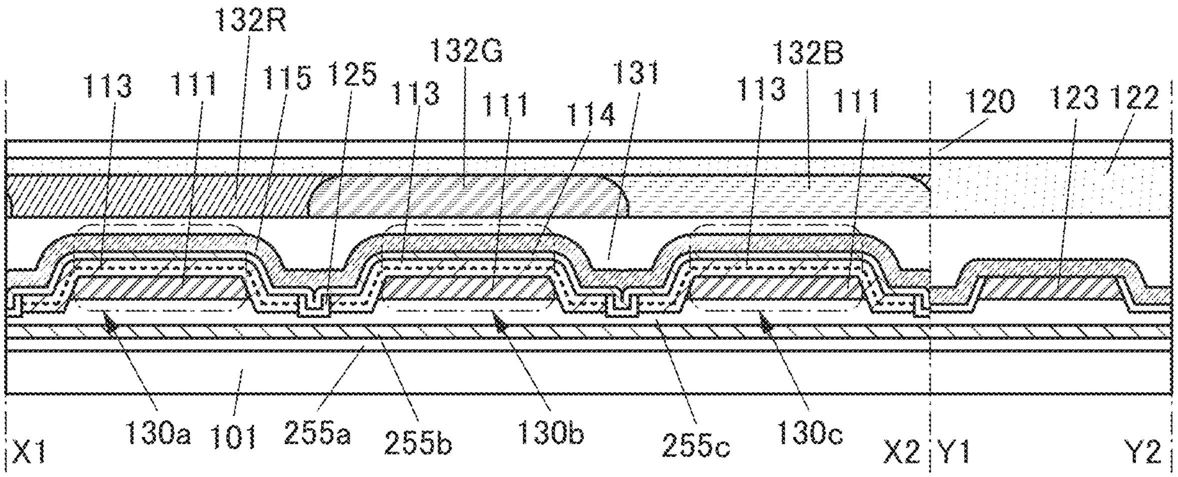

FIG. 10B illustrates an example where the insulating layer 127 is not provided. Note that although the common layer 114 enters the depressed portion of the insulating layer 125 in the example illustrated in FIG. 10B, a space may be formed in the region.

The insulating layer 125 includes a region in contact with the side surface of the EL layer 113 and functions as a protective insulating layer of the EL layer 113. Providing the insulating layer 125 can inhibit impurities (e.g., oxygen and moisture) from entering the EL layer 113 through its side surface, resulting in a highly reliable display panel.

Figure 10C:
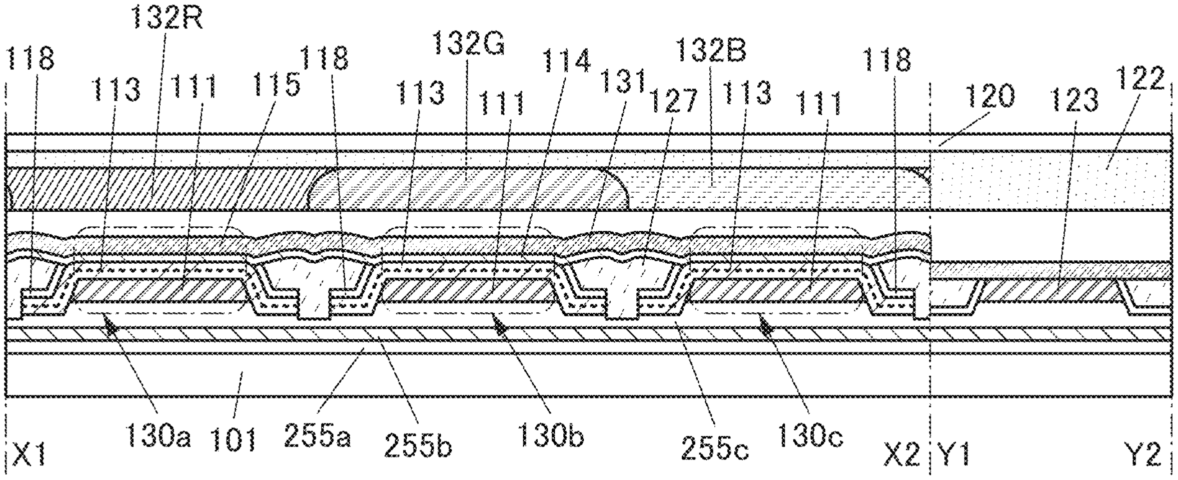

FIG. 10C illustrates an example where the insulating layer 125 is not provided. In the case where the insulating layer 125 is not provided, the insulating layer 127 can be in contact with the side surface of the EL layer 113. The insulating layer 127 can be provided to fill the gaps between the EL layers 113 of the light-emitting devices.

In this case, an organic material that causes less damage to the EL layer 113 is preferably used for the insulating layer 127. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

Next, examples of materials and formation methods of the insulating layer 125 and the insulating layer 127 are described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

When the insulating layer 125 has a function of a barrier insulating layer or a gettering function, entry of impurities (typically, at least one of water and oxygen) that might diffuse into the light-emitting devices from the outside can be inhibited. With this structure, a highly reliable light-emitting device, furthermore, a highly reliable display panel can be provided.

The insulating layer 125 preferably has a low impurity concentration. In this case, deterioration of the EL layer due to entry of impurities from the insulating layer 125 into the EL layer can be inhibited. In addition, when the impurity concentration is reduced in the insulating layer 125, a barrier property against at least one of water and oxygen can be increased. For example, the insulating layer 125 preferably has one of a sufficiently low hydrogen concentration and a sufficiently low carbon concentration, desirably has both of them.

The insulating layer 125 can be formed by a sputtering method, a CVD method, a pulsed laser deposition (PLD) method, an ALD method, or the like. The insulating layer 125 is preferably formed by an ALD method achieving good coverage.

When the substrate temperature at the time when the insulating layer 125 is deposited is increased, the formed insulating layer 125, even with a small thickness, can have a low impurity concentration and a high barrier property against at least one of water and oxygen. Therefore, the substrate temperature is preferably higher than or equal to 60° C., further preferably higher than or equal to 80° C., still further preferably higher than or equal to 100° C., yet still further preferably higher than or equal to 120° C. Meanwhile, the insulating layer 125 is deposited after formation of an island-shaped EL layer, it is preferable that the insulating layer 125 be formed at a temperature lower than the upper temperature limit of the EL layer. Therefore, the substrate temperature is preferably lower than or equal to 200° C., further preferably lower than or equal to 180° C., still further preferably lower than or equal to 160° C., still further preferably lower than or equal to 150° C., yet still further preferably lower than or equal to 140° C.

Examples of indicators of the upper temperature limit are the glass transition point, the softening point, the melting point, the thermal decomposition temperature, and the 5% weight loss temperature. The upper temperature limit of the EL layer can be, for example, any of the above temperatures, preferably the lowest temperature thereof. In the case where the EL layer is formed of a plurality of layers, the lowest temperature in the upper temperature limits of the layers can be regarded as the upper temperature limit of the EL layer. In the case of a mixed layer that is one layer formed of a plurality of materials, for example, the upper temperature limit of the most contained material or the lowest temperature in the upper temperature limits of the materials can be regarded as the upper temperature limit of the layer.

As the insulating layer 125, an insulating film with a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed.

The insulating layer 127 provided over the insulating layer 125 has a function of reducing the depressed portion of the insulating layer 125 formed between adjacent light-emitting devices. In other words, the insulating layer 127 brings an effect of improving the planarity of a surface where the common electrode 115 is formed. As the insulating layer 127, an insulating layer containing an organic material can be suitably used. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used, for example. Examples of organic materials that may be used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. Alternatively, a photosensitive resin can be used for the insulating layer 127. A photoresist may be used as the photosensitive resin. As the photosensitive resin, a positive photosensitive material or a negative photosensitive material can be used.

A material absorbing visible light may be used for the insulating layer 127. When the insulating layer 127 absorbs light emitted by the light-emitting device, leakage of light (stray light) from the light-emitting device to the adjacent light-emitting device through the insulating layer 127 can be inhibited. Thus, the display quality of the display panel can be improved. Since no polarizing plate is required to improve the display quality, the weight and thickness of the display panel can be reduced.

Examples of the material absorbing visible light include a material containing a pigment of black or any other color, a material containing a dye, a light-absorbing resin material (e.g., polyimide), and a resin material that can be used for color filters (a color filter material). Using a resin material obtained by stacking or mixing color filter materials of two or three or more colors is particularly preferred to enhance the effect of blocking visible light. In particular, mixing color filter materials of three or more colors enables the formation of a black or nearly black resin layer.

For example, the insulating layer 127 can be formed by a wet deposition method such as spin coating, dipping, spray coating, ink-jetting, dispensing, screen printing, offset printing, doctor blade coating, slit coating, roll coating, curtain coating, or knife coating. Specifically, an organic insulating film that is to be the insulating layer 127 is preferably formed by spin coating.

In addition, the insulating layer 127 is formed at a temperature lower than the upper temperature limit of the EL layer 113. The typical substrate temperature in formation of the insulating layer 127 is lower than or equal to 200° C., preferably lower than or equal to 180° C., further preferably lower than or equal to 160° C., still further preferably lower than or equal to 150° C., yet still further preferably lower than or equal to 140° C.

FIG. 11A to FIG. 11E each illustrate a cross-sectional structure of a region 139 including the insulating layer 127 and its surroundings.

Figure 11A:
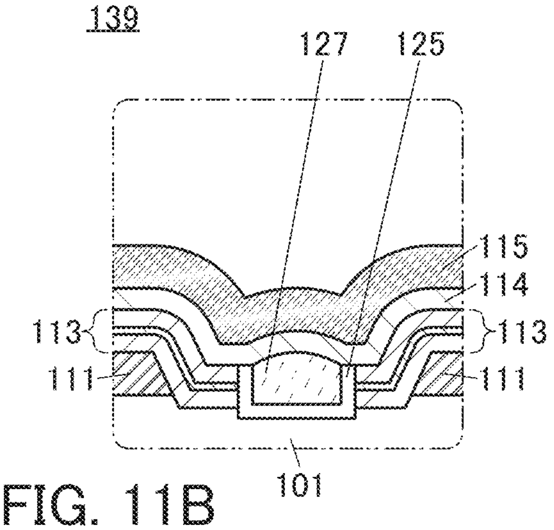
FIG. 11A to FIG. 11E are cross-sectional views illustrating examples of a display panel.

In FIG. 11A, the top surface of the insulating layer 127 has a region whose level is higher than that of top surface of the EL layer 113. As illustrated in FIG. 11A, the top surface of the insulating layer 127 can have a shape that is bulged in the center and its vicinity, i.e., a shape including a convex curved surface, in the cross-sectional view.

Figure 11B:
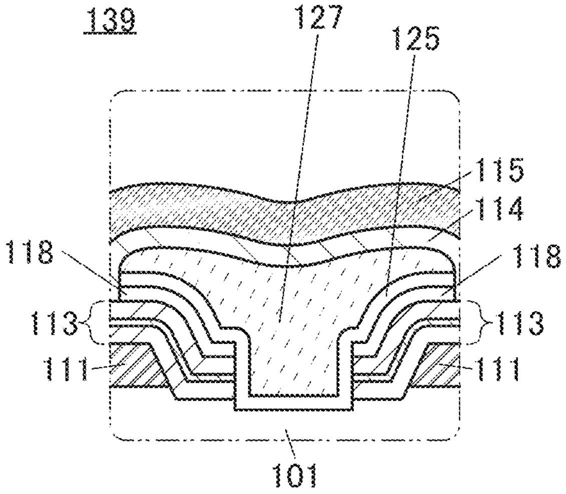

In FIG. 11B, the top surface of the insulating layer 127 has a shape that is gently bulged toward the center, i.e., a convex curved surface, and has a shape that is recessed in the center and its vicinity, i.e., a concave curved surface, in the cross-sectional view. The insulating layer 127 has a region whose level is higher than that of the top surface of the EL layer 113. The region 139 of the display panel includes a region where the EL layer 113, the sacrificial layer 118, the insulating layer 125, and the insulating layer 127 are stacked in this order.

Figure 11C:
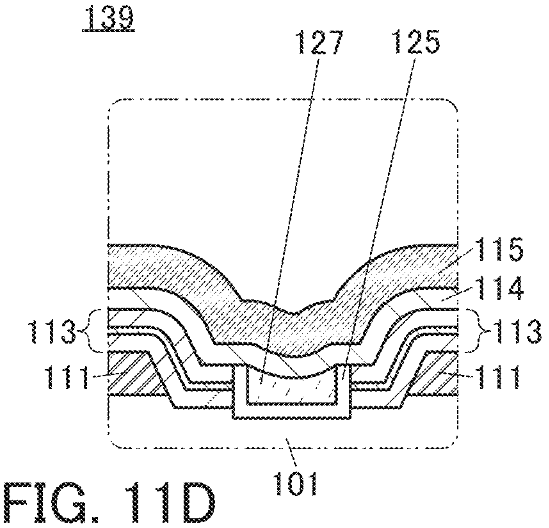

In FIG. 11C, the top surface of the insulating layer 127 includes a region whose level is lower than that of the top surface of the EL layer 113. In the cross-sectional view, the top surface of the insulating layer 127 has a depressed portion in the center and its vicinity, i.e., has a concave curved surface.

Figure 11D:
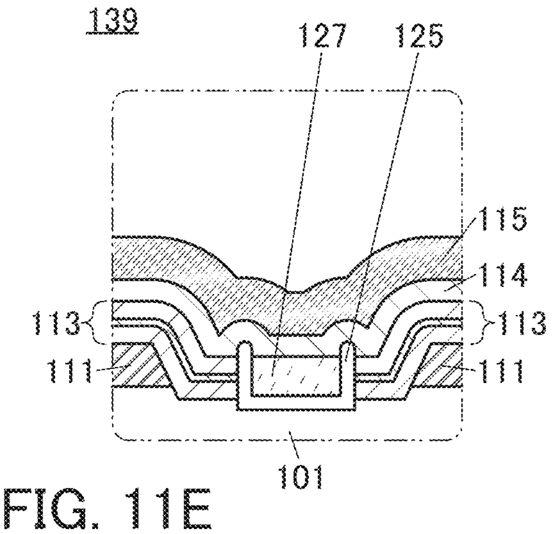

In FIG. 11D, the top surface of the insulating layer 125 includes a region whose level is higher than that of the top surface of the EL layer 113. That is, the insulating layer 125 protrudes from the formation surface of the common layer 114 and forms a projecting portion.

For example, when the insulating layer 125 is formed so that its level is equal to or substantially equal to the level of the sacrificial layer, the insulating layer 125 may protrude as illustrated in FIG. 11D.

Figure 11E:
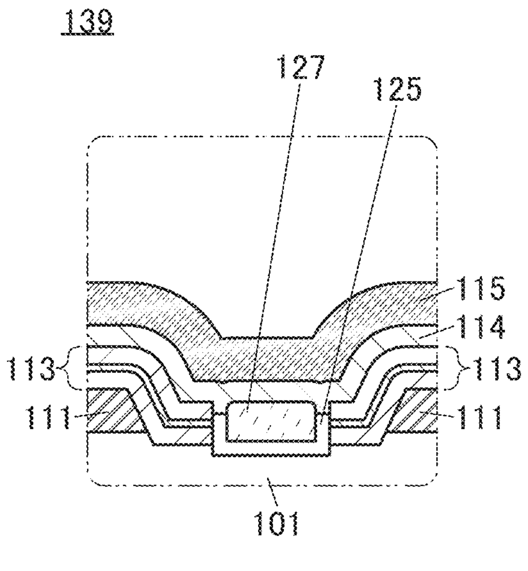

In FIG. 11E, the top surface of the insulating layer 125 includes a region whose level is lower than that of the top surface of the EL layer 113. That is, the insulating layer 125 forms a depressed portion on the formation surface of the common layer 114.

As described above, the insulating layer 125 and the insulating layer 127 can have a variety of shapes.

A light-blocking layer may be provided on the surface of the substrate 120 on the resin layer 122 side. Moreover, a variety of optical members can be provided on the outer side of the substrate 120. Examples of optical members include a polarizing plate, a retardation plate, alight diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be provided as a surface protective layer on the outer surface of the substrate 120. For example, it is preferable to provide, as the surface protective layer, a glass layer or a silica layer ($SiO_x$ layer) because the surface contamination or damage can be inhibited from being generated. For the surface protective layer, DLC (diamond like carbon), aluminum oxide ($AlO_x$), a polyester-based material, a polycarbonate-based material, or the like may be used. For the surface protective layer, a material having a high visible-light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material which transmits the light. When a flexible material is used for the substrate 120, the flexibility of the display panel can be increased. Furthermore, a polarizing plate may be used as the substrate 120.

For the substrate 120, it is possible to use, for example, polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyether-sulfone (PES) resin, polyamide resins (e.g., nylon and aramid), a polysiloxane resin, a cycloolefin resin, a poly-styrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass thin enough to have flexibility may be used as the substrate 120.

In the case where a circularly polarizing plate overlaps with the display panel, a highly optically isotropic substrate is preferably used as the substrate included in the display panel. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A single-layer structure or a stacked-layer structure including a film containing one or more of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. They can also be used for conductive layers such as wirings and electrodes included in the display device, and conductive layers (e.g., a conductive layer functioning as a pixel electrode or a counter electrode) included in a light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

Figure 12A:
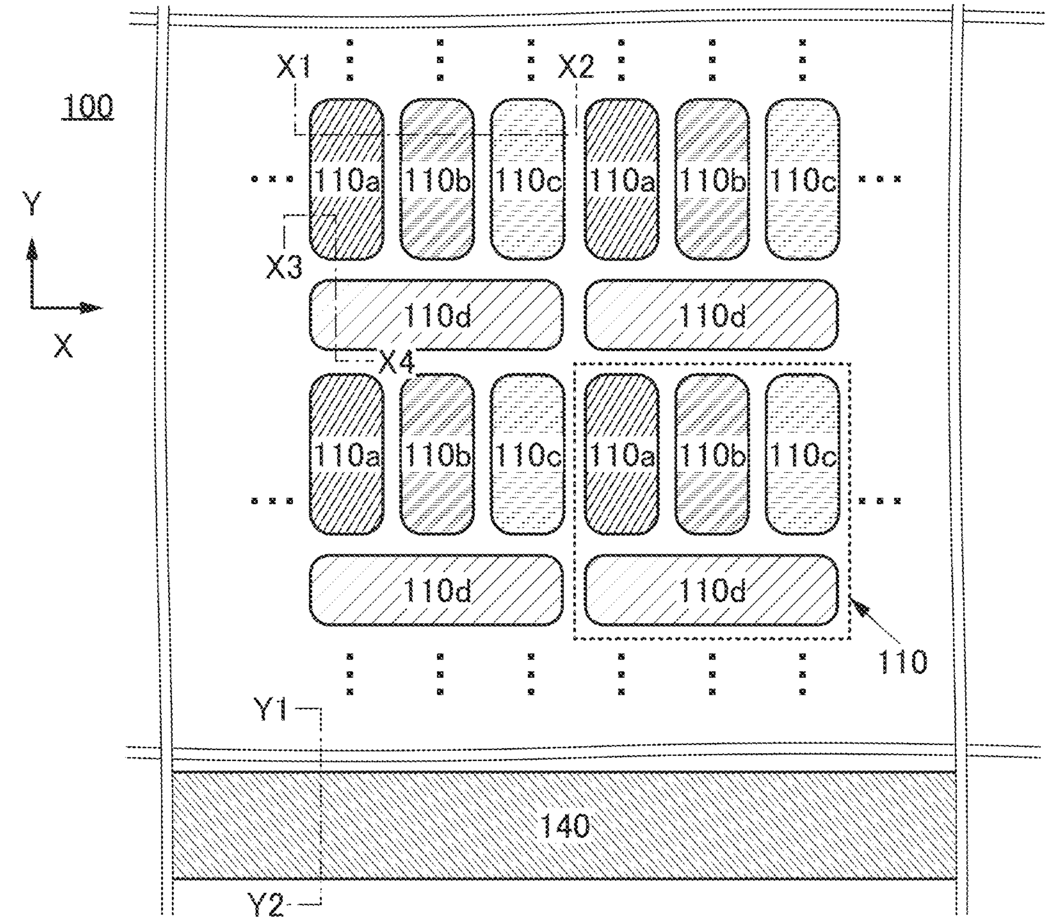
FIG. 12A is a top view illustrating an example of a display panel.

As illustrated in FIG. 12A, the pixel can include four types of subpixels.

FIG. 12A illustrates a top view of the display panel 100. The display panel 100 includes a display portion in which a plurality of pixels 110 are arranged in a matrix, and the connection portion 140 outside the display portion.

The pixel 110 illustrated in FIG. 2A is composed of four subpixels 110*a*, 110*b*, 110*c*, and 110*d*.

The subpixels 110*a*, 110*b*, 110*c*, and 110*d* can include light-emitting devices that emit light of different colors. As the subpixels 110*a*, 110*b*, 110*c*, and 110*d*, for example, subpixels of four colors of R, G, B, and W, subpixels of four colors of R, G, B, and Y, and subpixels of four colors of R, G, B, and IR, and the like can be given.

The display panel of one embodiment of the present invention may include a light-receiving device in the pixel.

Three of the four subpixels included in the pixel 110 in FIG. 12A may include light-emitting devices and the other one may include a light-receiving device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display panels.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display panel using the organic EL device.

The light-receiving device includes at least an active layer that functions as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be detected and electric charge can be generated and extracted as current. Alternatively, the pixel electrode may function as a cathode and the common electrode may function as an anode.

A manufacturing method similar to that of the light-emitting device can be employed for the light-receiving device. An island-shaped active layer (also referred to as a photoelectric conversion layer) included in the light-receiving device is formed by processing a film that is to be the active layer and formed over the entire surface, not by using a fine metal mask; thus, the island-shaped active layer can be formed to have a uniform thickness. In addition, a sacrificial layer provided over the active layer can reduce damage to the active layer in the manufacturing process of the display panel, increasing the reliability of the light-receiving device.

Figure 12B:
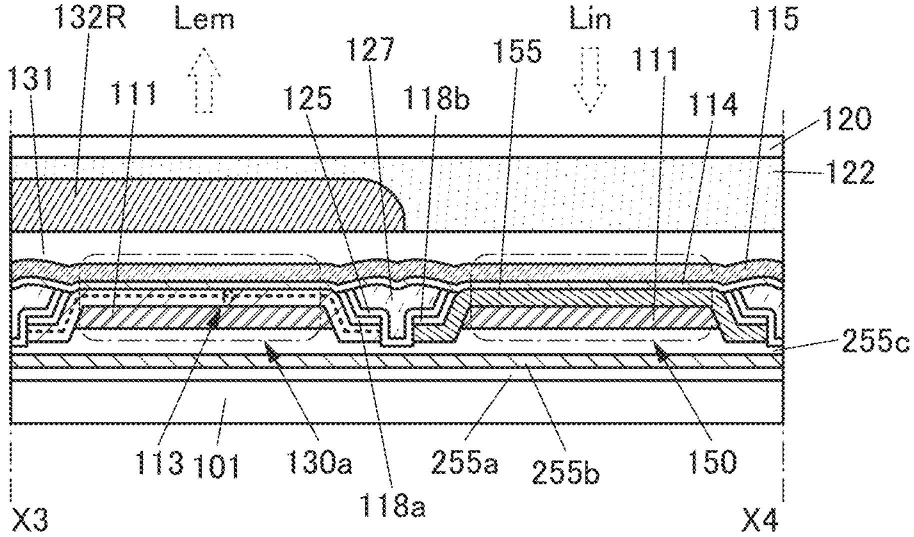
FIG. 12B is a cross-sectional view illustrating an example of a display panel.

FIG. 12B is a cross-sectional view taken along the dashed-dotted line X3-X4 in FIG. 12A. See FIG. 6B for a cross-sectional view taken along the dashed-dotted line X1-X2 in FIG. 12A, and see FIG. 7A or FIG. 7B for a cross-sectional view taken along the dashed-dotted line Y1-Y2 in FIG. 12A.

As illustrated in FIG. 12B, in the display panel 100, the insulating layer is provided over the layer 101 including transistors, the light-emitting device 130*a* and a light-receiving device 150 are provided over the insulating layer, and the protective layer 131 is provided to cover the light-emitting device and the light-receiving device. The coloring layer 132R is stacked over the protective layer 131 at a position overlapping with the light-emitting device 130*a*, and the substrate 120 is bonded with the resin layer 122. In a region between the light-emitting device and the light-receiving device that are adjacent to each other, the insulating layer 125 and the insulating layer 127 over the insulating layer 125 are provided.

In FIG. 12B, light from the light-emitting device 130*a* is emitted to the substrate 120 side, and light is incident on the light-receiving device 150 from the substrate 120 side (see light Lem and light Lin).

The structure of the light-emitting device 130*a* is as described above.

The light-receiving device 150 includes the pixel electrode 111 over the insulating layer 255*c*, a layer 155 including an island-shaped active layer over the pixel electrode 111, the common layer 114 over the layer 155, and the common electrode 115 over the common layer 114.

The layer 155 including an active layer is provided in the light-receiving device 150, not in the light-emitting device. The common layer 114 is a continuous layer shared by the light-emitting device and the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

A sacrificial layer 118*a* is positioned between the EL layer 113 and the insulating layer 125, and a sacrificial layer 118*b* is positioned between the layer 155 and the insulating layer 125. The sacrificial layer 118*a* is a remaining portion of the sacrificial layer provided over the EL layer 113 when the EL layer 113 is processed. The sacrificial layer 118*b* is a remaining part of the sacrificial layer provided over the layer 155 including an active layer when the layer 155 is processed. The sacrificial layer 118*a* and the sacrificial layer 118*b* may include the same material or different materials.

In the display panel including the light-emitting device and the light-receiving device in each pixel, the pixel has a light-receiving function, which enables detection of a touch or approach of an object while an image is displayed. For example, all the subpixels included in the display panel can display an image; alternatively, some of the subpixels can emit light as a light source, some of the rest of the subpixels can detect light, and the other subpixels can display an image.

In the display panel of one embodiment of the present invention, the light-emitting devices are arranged in a matrix in the display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of a target (e.g., a finger, a hand, or a pen) can be detected. Furthermore, in the display panel of one embodiment of the present invention, the light-emitting devices can be used as a light source of the sensor. Accordingly, a light-receiving portion and a light source do not need to be provided separately from the display panel; hence, the number of components of an electronic device can be reduced. For example, a fingerprint authentication device, a capacitive touch panel for scroll operation, or the like is not necessarily provided separately from the electronic device. Thus, with the use of the display panel of one embodiment of the present invention, the electronic device can be provided with reduced manufacturing cost.

In the display panel of one embodiment of the present invention, when an object reflects (or scatters) light emitted by the light-emitting device included in the display portion, the light-receiving device can detect the reflected light (or scattered light); thus, image capturing or touch detection is possible even in a dark place.

In the case where the light-receiving devices are used as an image sensor, the display panel can capture an image with the use of the light-receiving devices. For example, the display panel of this embodiment can be used as a scanner.

For example, data on biological information such as a fingerprint or a palm print can be obtained with the use of the image sensor. That is, a biometric authentication sensor can be incorporated in the display panel. When the display panel incorporates a biological authentication sensor, the number of components of an electronic device can be reduced as compared to the case where the biological authentication sensor is provided separately from the display panel; thus, the size and weight of the electronic device can be reduced.

In the case where the light-receiving devices are used as the touch sensor, the display panel can detect an approach or contact of an object with the use of the light-receiving devices.

The display panel of one embodiment of the present invention can have one or both of an image capturing function and a sensing function in addition to an image displaying function. Thus, the display panel of one embodiment of the present invention can be regarded as highly compatible with the function other than the display function.

Next, materials that can be used for the light-emitting device will be described.

A conductive film that transmits visible light is used as the electrode through which light is extracted, which is either the pixel electrode or the common electrode. A conductive film that reflects visible light is preferably used as the electrode through which light is not extracted. In the case where the display panel includes a light-emitting device emitting infrared light, a conductive film which transmits visible light and infrared light is used as the electrode through which light is extracted, and a conductive film reflecting visible light and infrared light is preferably used as the electrode through which light is not extracted.

A conductive film that transmits visible light may be used also for the electrode through which light is not extracted. In this case, the electrode is preferably provided between a reflective layer and the EL layer. In other words, light emitted by the EL layer may be reflected by the reflective layer to be extracted from the display panel.

As a material that forms the pair of electrodes (the pixel electrode and the common electrode) of the light-emitting device, a metal, an alloy, an electrically conductive compound, a mixture thereof, and the like can be used as appropriate. Specific examples include an indium tin oxide (In—Sn oxide, also referred to as ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a visible-light-transmitting property (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The pixel electrode and the common electrode can each be formed by a sputtering method or a vacuum evaporation method, for example. Alternatively, the pixel electrode and the common electrode can may each be a stack of a film formed by an evaporation method and a film formed by a sputtering method.

The light-emitting layer is a layer containing a light-emitting material. The light-emitting layer can contain one or more kinds of light-emitting materials. As the light-emitting material, a substance whose emission color is blue, violet, bluish violet, green, yellowish green, yellow, orange, red, or the like is appropriately used. Alternatively, as the light-emitting material, a substance that emits near-infrared light can be used.

Examples of the light-emitting material include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting material (a guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting material (phosphorescent material). When a combination of materials is selected so as to form an exciplex that exhibits light emission whose wavelength overlaps with the wavelength on a lowest-energy-side absorption band of the light-emitting material, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 113 (or the light-emitting unit) may further include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron-transport property and a high hole-transport property or a bipolar material), and the like.

Either a low molecular compound or a high molecular compound can be used in the light-emitting device, and an inorganic compound may also be contained. Each layer included in the light-emitting device can be formed by a method such as an evaporation method (including a vacuum evaporation method), a transfer method, a printing method, an inkjet method and a coating method.

For example, the EL layer 113 (or the light-emitting unit) may include at least one of a hole-injection layer, a hole-transport layer, a hole-blocking layer, an electron-blocking layer, an electron-transport layer, and an electron-injection layer.

As the common layer 114, one or more of a hole-injection layer, a hole-transport layer, a hole-blocking layer, an electron-blocking layer, an electron-transport layer, and an electron-injection layer can be used. For example, a carrier-injection layer (a hole-injection layer or an electron-injection layer) may be formed as the common layer 114. Note that the light-emitting device does not necessarily include the common layer 114.

The top light-emitting unit of the EL layer 113 (the second light-emitting unit 113*c* in this embodiment preferably includes a light-emitting layer and a carrier-transport layer over the light-emitting layer. Accordingly, the light-emitting layer is inhibited from being exposed on the outermost surface during the manufacturing process of the display panel 100, so that damage to the light-emitting layer can be reduced. Thus, the reliability of the light-emitting device can be increased.

The hole-injection layer injects holes from the anode to the hole-transport layer and contains a substance with a high hole-injection property. Examples of a substance with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. The hole-transport material preferably has a hole mobility of $1\times10^{-6}$ $cm^2/Vs$ or higher. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

An electron-transport layer is a layer transporting electrons, which are injected from a cathode by an electron-injection layer, to a light-emitting layer. The electron-transport layer contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$; X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. In the stacked-layer structure, for example, lithium fluoride can be used for the first layer and ytterbium can be used for the second layer.

Alternatively, an electron-transport material may be used for the electron-injection layer. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) or the like can be used for the organic compound having an unshared electron pair. Note that NBPhen has a higher glass transition temperature (Tg) than BPhen and thus has high heat resistance.

In this embodiment, a tandem structure is employed for the light-emitting device. Therefore, a charge-generation layer is provided between two light-emitting units. The charge-generation layer includes at least a charge-generation region. The charge-generation layer has a function of injecting electrons into one of the two light-emitting units and injecting holes into the other when voltage is applied between the pair of electrodes.

As described above, the charge-generation layer includes at least a charge-generation region. The charge-generation region preferably contains an acceptor material, and for example, preferably contains a hole-transport material and an acceptor material which can be used for the hole-injection layer.

The charge-generation layer preferably includes a layer containing a substance having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be used for the electron-injection buffer layer.

The charge-generation layer preferably includes a layer containing a substance having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

The EL layer 113 and the common layer 114 can each be formed by a method such as an evaporation method (including a vacuum evaporation method), a transfer method, a printing method, an inkjet method, or a coating method.

Thin films included in the display panel (e.g., insulating films, semiconductor films, and conductive films) can be formed by a sputtering method, a CVD method, a vacuum evaporation method, a PLD method, an ALD method, or the like. Examples of a CVD method include a PECVD method and a thermal CVD method. An example of a thermal CVD method is a metal organic chemical vapor deposition (MOCVD: Metal Organic CVD) method.

Alternatively, the thin films included in the display panel (e.g., insulating films, semiconductor films, and conductive films) can be formed by spin coating, dipping, spray coating, ink-jetting, dispensing, screen printing, offset printing, doctor blade coating, slit coating, roll coating, curtain coating, knife coating, or the like.

Specifically, for manufacture of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

Thin films included in the display panel can be processed by a photolithography method or the like. Alternatively, thin films may be processed by a nanoimprinting method, a sandblasting method, a lift-off method, or the like. Alternatively, island-shaped thin films may be directly formed by a deposition method using a shielding mask such as a metal mask.

There are two typical methods in a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

Next, materials that can be used for the light-receiving device will be described.

The active layer included in the light-receiving device includes a semiconductor. Examples of the semiconductor include an inorganic semiconductor such as silicon and an organic semiconductor including an organic compound. This embodiment describes an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases; however, fullerene has a spherical shape, and thus has a high electron-accepting property although π-electron conjugation widely spread therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-$C_{71}$-butyric acid methyl ester (abbreviation: $PC_{70}BM$), [6,6]-Phenyl-$C_{61}$-butyric acid methyl ester (abbreviation: $PC_{60}BM$), and 1',1",4',4"-Tetrahydro-di[1,4]methanonaphthaleno[1,2:2',3',56,60:2",3" ][5,6]fullerene-$C_{60}$ (abbreviation: ICBA).

Another example of an n-type semiconductor material is a perylenetetracarboxylic derivative such as N,N-dimethyl-3,4,9,10-perylenetetracarboxylic diimide (abbreviation: Me-PTCDI).

Another example of an n-type semiconductor material is 2,2'-(5,5'-(thieno[3,2-b]thiophene-2,5-diyl)bis(thiophene-5,2-diyl)) bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Furthermore, other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a layer containing any of a substance having a high hole-injection property, a hole-blocking material, a substance having a high electron-injection property, an electron-blocking material, and the like.

Either a low molecular compound or a high molecular compound can be used in the light-receiving device, and an inorganic compound may also be contained. Each layer included in the light-receiving device can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO) or an organic compound such as polyethylenimine ethoxylated (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

Three or more kinds of materials may be used for the active layer. For example, a third material may be mixed with an n-type semiconductor material and a p-type semiconductor material in order to extend the absorption wavelength range. In this case, the third material may be a low molecular compound or a high molecular compound.

As described above, in the method for manufacturing the display panel of one embodiment of the present invention, the island-shaped EL layers are formed not by using a metal mask having a fine pattern but by processing an EL layer formed over the entire surface.

Accordingly, the size of the island-shaped EL layer or even the size of the subpixel can be smaller than that obtained through the formation with a metal mask. Therefore, a high-resolution display panel or a display panel with a high aperture ratio, which has been difficult to achieve, can be achieved.

Since the display panel of one embodiment of the present invention includes the light-emitting devices with a tandem structure, the carrier balance can be more easily adjusted and the emission color at a low luminance is less different from that at a high luminance. Each subpixel includes an island-shaped EL layer, which can inhibit generation of leakage current between the subpixels. Accordingly, degradation of the display quality of the display panel can be inhibited. In addition, both the high resolution and high display quality of the display panel can be achieved.

In the display panel of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display panel of this embodiment includes a region where the distance between two adjacent EL layers 113 is less than or equal to 1 μm, preferably less than or equal to 0.5 μm (500 nm), further preferably less than or equal to 100 nm.

This embodiment can be combined with any of the other embodiments as appropriate.

Embodiment 3

In this embodiment, a display panel of one embodiment of the present invention is described with reference to FIG. 13 to FIG. 16.

[Pixel Layouts]

In this embodiment, pixel layouts different from that in FIG. 6A are mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting device.

Figure 13A:
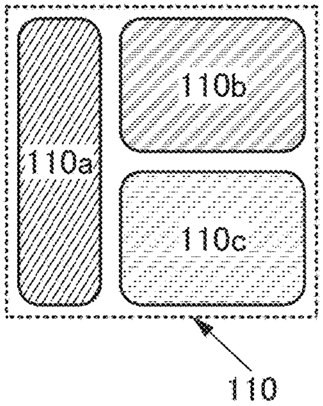
FIG. 13A to FIG. 13F are top views illustrating examples of a pixel.
Figure 15A:
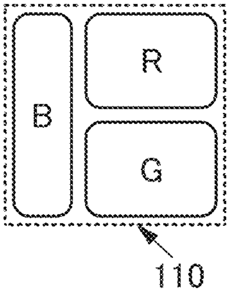
FIG. 15A to FIG. 15J are top views illustrating examples of a pixel.

The pixel 110 illustrated in FIG. 13A employs S-stripe arrangement. The pixel 110 illustrated in FIG. 13A is composed of three subpixels 110*a*, 110*b*, and 110*c*. For example, as illustrated in FIG. 15A, the subpixel 110*a* may be a blue subpixel B, the subpixel 110*b* may be a red subpixel R, and the subpixel 110*c* may be a green subpixel G.

Figure 13B:
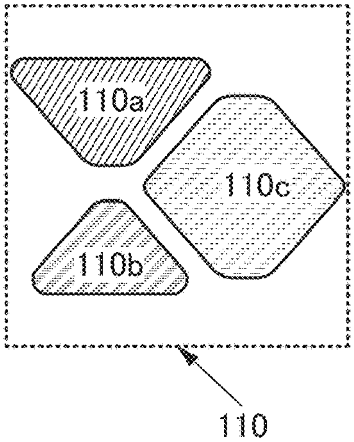
Figure 15B:
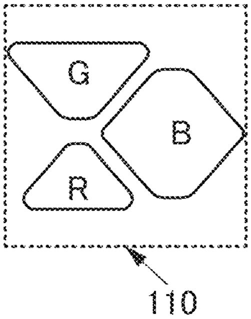

The pixel 110 illustrated in FIG. 13B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 15B, the subpixel 110*a* may be the green subpixel G, the subpixel 110*b* may be the red subpixel R, and the subpixel 110*c* may be the blue subpixel B.

Figure 13C:
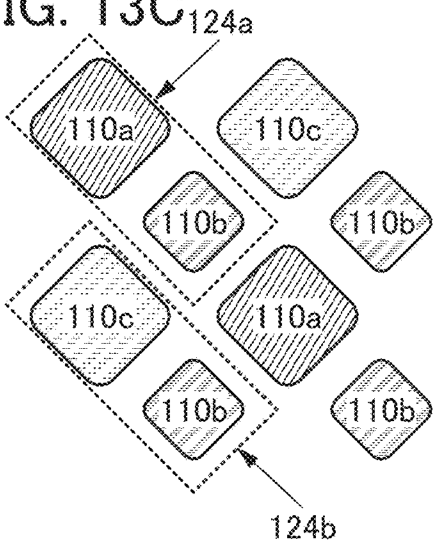
Figure 15C:
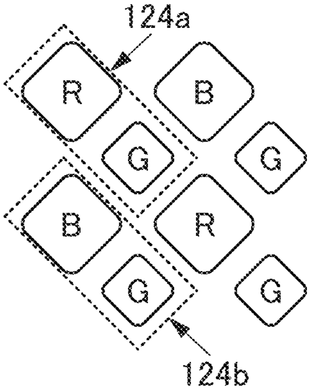

Pixels 124*a* and 124*b* illustrated in FIG. 13C employ PenTile arrangement. FIG. 13C illustrates an example in which the pixels 124*a* each including the subpixels 110*a* and 110*b* and the pixels 124*b* each including the subpixels 110*b* and 110*c* are alternately arranged. For example, as illustrated in FIG. 15C, the subpixel 110*a* may be the red subpixel R, the subpixel 110*b* may be the green subpixel G, and the subpixel 110*c* may be the blue subpixel B.

Figure 13D:
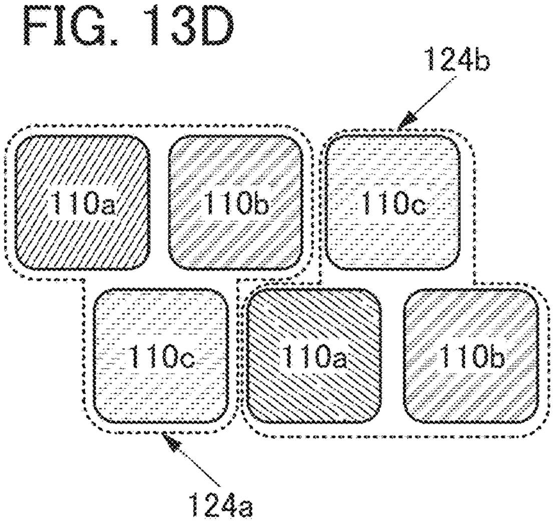
Figure 13E:
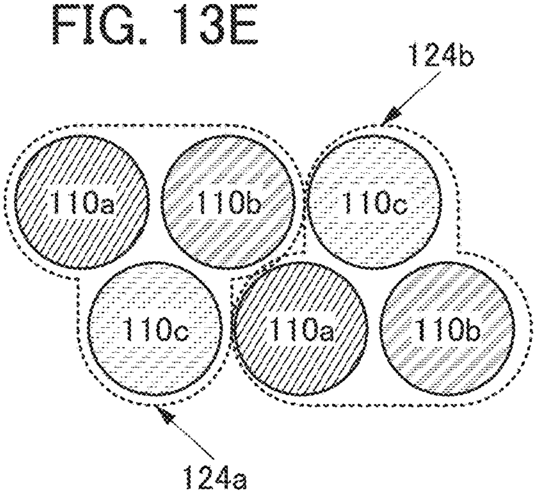
Figure 15D:
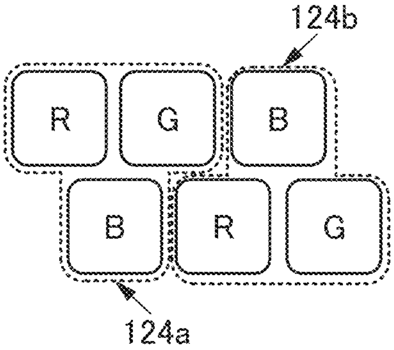

The pixels 124*a* and 124*b* illustrated in FIG. 13D and FIG. 13E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 15D, the subpixel 110*a* may be the red subpixel R, the subpixel 110*b* may be the green subpixel G, and the subpixel 110*c* may be the blue subpixel B.

FIG. 13D illustrates an example in which the top surface of each subpixel has a rough tetragonal shape with rounded corners, and FIG. 13E illustrates an example in which the top surface of each subpixel is circular.

Figure 13F:
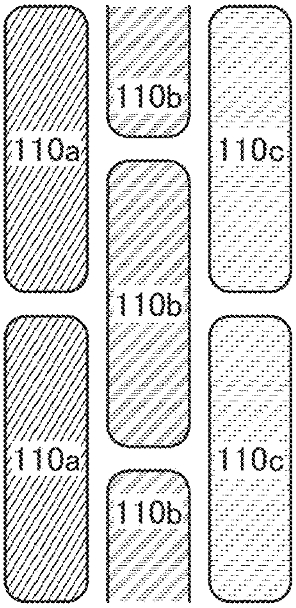
Figure 15E:
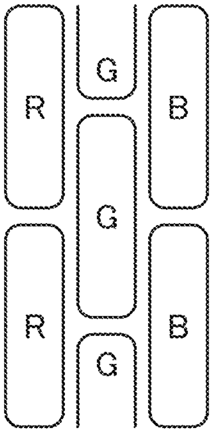

FIG. 13F illustrates an example in which subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 15E, the subpixel 110*a* may be the red subpixel R, the subpixel 110*b* may be the green subpixel G, and the subpixel 110*c* may be the blue subpixel B.

In a photolithography method, as a pattern to be formed by processing becomes finer, the influence of light diffraction becomes more difficult to ignore; accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method for manufacturing the display panel of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

Note that to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 15F:
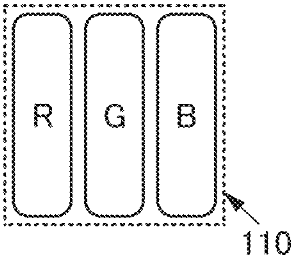
Figure 15G:
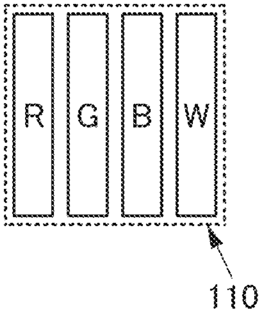
Figure 15H:
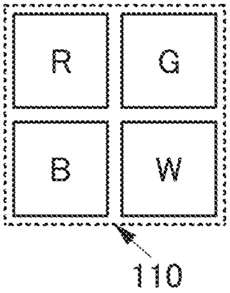
Figure 15I:
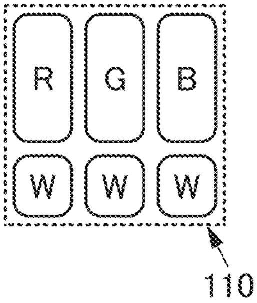
Figure 15J:
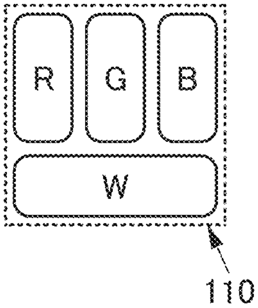

Also in the pixel 110 illustrated in FIG. 6A, which employs stripe arrangement, for example, the subpixel 110*a* can be the red subpixel R, the subpixel 110*b* can be the green subpixel G, and the subpixel 110*c* can be the blue subpixel B as illustrated in FIG. 15F.

As illustrated in FIG. 14A to FIG. 14H, the pixel can include four types of subpixels.

Figure 14A:
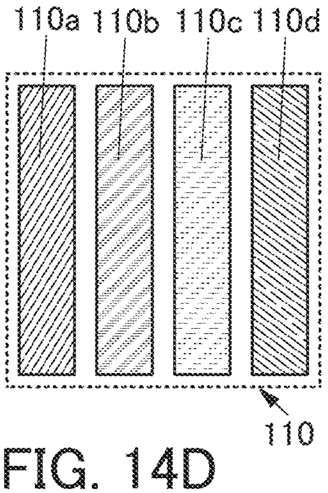
FIG. 14A to FIG. 14H are top views illustrating examples of a pixel.
Figure 14B:
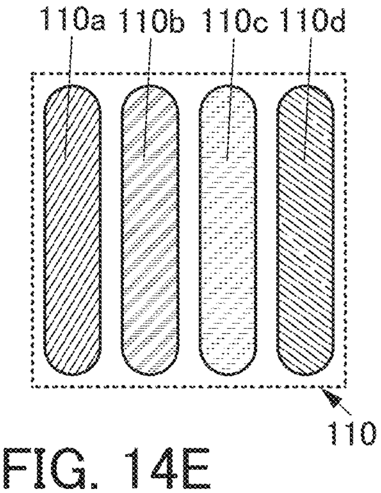
Figure 14C:
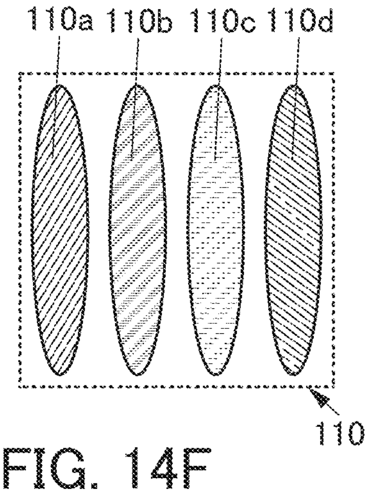

The pixels 110 illustrated in FIG. 14A to FIG. 14C employ stripe arrangement.

FIG. 14A illustrates an example in which each subpixel has a rectangular top surface, FIG. 14B illustrates an example in which each subpixel has a top surface shape formed by combining two half circles and a rectangle, and FIG. 14C illustrates an example in which each subpixel has an elliptical top surface.

Figure 14D:
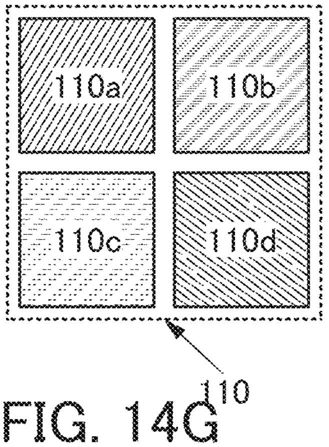
Figure 14E:
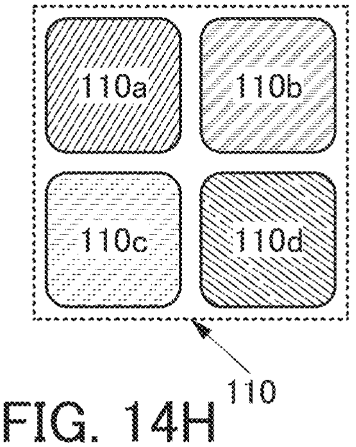
Figure 14F:
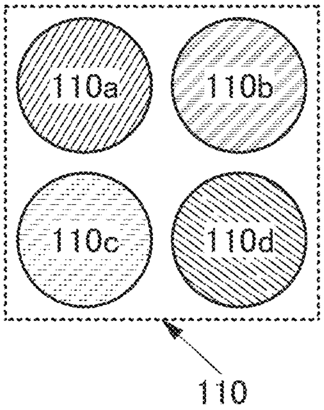

The pixels 110 illustrated in FIG. 14D to FIG. 14F employ matrix arrangement.

FIG. 14D illustrates an example in which each subpixel has a square top surface, FIG. 14E illustrates an example in which each subpixel has a substantially square top surface with rounded corners, and FIG. 14F illustrates an example in which each subpixel has a circular top surface.

Figure 14G:
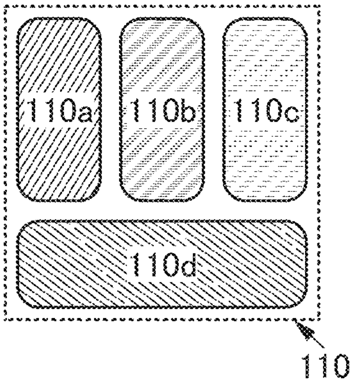
Figure 14H:
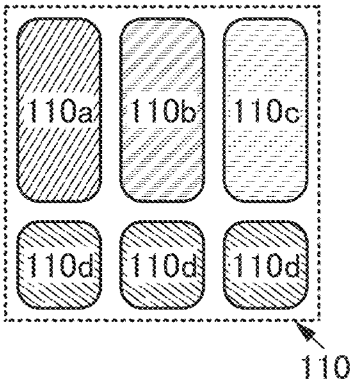

FIG. 14G and FIG. 14H each illustrate an example in which one pixel 110 is composed of two rows and three columns.

The pixel 110 illustrated in FIG. 14G includes three subpixels (the subpixels 110*a*, 110*b*, and 110*c*) in the upper row (first row) and one subpixel (a subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 14H includes three subpixels (the subpixels 110*a*, 110*b*, and 110*c*) in the upper row (first row) and three of the subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Aligning the positions of the subpixels in the upper row and the lower row as illustrated in FIG. 14H enables dust and the like that would be produced in the manufacturing process to be removed efficiently. Thus, a display panel with high display quality can be provided.

The pixels 110 illustrated in FIG. 14A to FIG. 14H are each composed of the four subpixels 110*a*, 110*b*, 110*c*, and 110*d*. The subpixels 110*a*, 110*b*, 110*c*, and 110*d* include light-emitting devices that emit light of different colors. The subpixels 110*a*, 110*b*, 110*c*, and 110*d* can be of four colors of R, G, B, and white (W), of four colors of R, G, B, and Y, of four colors of R, G, B, and infrared light (IR), or the like. For example, the subpixels 110*a*, 110*b*, 110*c*, and 110*d* can be red, green, blue, and white subpixels, respectively, as illustrated in FIG. 15G to FIG. 15J.

The display panel of one embodiment of the present invention may include a light-receiving device in the pixel.

Three of the four subpixels included in the pixel 110 illustrated in FIG. 15G to FIG. 15J may include a light-emitting device and the other one may include a light-receiving device.

For example, the subpixels 110*a*, 110*b*, and 110*c* may be subpixels of three colors of R, G, and B, and the subpixel 110*d* may be a subpixel including a light-receiving device.

Figure 16A:
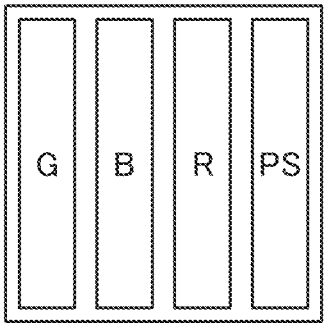
FIG. 16A to FIG. 16D are top views illustrating examples of a pixel.
Figure 16B:
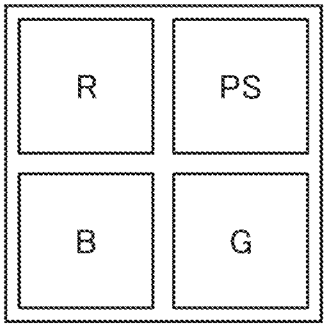

Pixels illustrated in FIG. 16A and FIG. 16B each include a subpixel G, a subpixel B, a subpixel R, and a subpixel PS. Note that the arrangement order of the subpixels is not limited to the structures illustrated in the drawings and can be determined as appropriate. For example, the positions of the subpixel G and the subpixel R may be interchanged with each other.

The pixel illustrated in FIG. 16A employs stripe arrangement. The pixel illustrated in FIG. 16B employs matrix arrangement.

The subpixel R emits red light. The subpixel G emits green light. The subpixel B emits blue light.

The subpixel PS includes a light-receiving device. There is no particular limitation on the wavelength of light detected by the subpixel PS. The subpixel PS can have a structure capable of detecting one or both of infrared light and visible light.

Figure 16C:
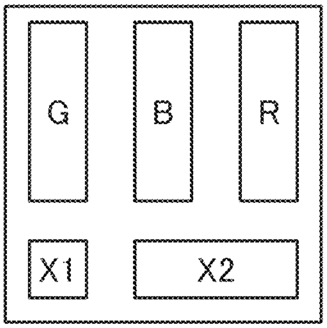
Figure 16D:
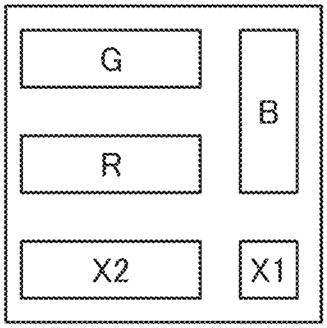

Pixels illustrated in FIG. 16C and FIG. 16D each include the subpixel G, the subpixel B, the subpixel R, a subpixel X1, and a subpixel X2. Note that the arrangement order of the subpixels is not limited to the structures illustrated in the drawings and can be determined as appropriate. For example, the positions of the subpixel G and the subpixel R may be interchanged with each other.

FIG. 16C illustrates an example where one pixel is provided in two rows and three columns. Three subpixels (the subpixel G, the subpixel B, and the subpixel R) are provided in the upper row (first row). In FIG. 16C, two subpixels (the subpixel X1 and the subpixel X2) are provided in the lower row (second row).

FIG. 16D illustrates an example where one pixel is composed of three rows and two columns. In FIG. 16D, the pixel includes the subpixel G in the first row, the subpixel R in the second row, and the subpixel B across these two rows. In addition, two subpixels (the subpixel X1 and the subpixel X2) are provided in the third row. In other words, the pixel illustrated in FIG. 16D includes three subpixels (the subpixel G, the subpixel R, and the subpixel X2) in the left column (first column) and two subpixels (the subpixel B and the subpixel X1) in the right column (second column).

The layout of the subpixels R, G, and B illustrated in FIG. 16C is stripe arrangement.

The layout of the subpixels R, G, and B illustrated in FIG. 16D is what is called S stripe arrangement. Thus, high display quality can be achieved.

At least one of the subpixel X1 and the subpixel X2 preferably includes the light-receiving device (i.e., the subpixel PS).

Note that the pixel layout including the subpixel PS is not limited to the structures illustrated in FIG. 16A to FIG. 16D.

For the subpixel X1 or the subpixel X2, for example, a structure that emits infrared light (IR) can be used. In this case, the subpixel PS preferably detects infrared light. For example, with one of the subpixel X1 and the subpixel X2 used as a light source, reflected light of light emitted by the light source can be detected by the other of the subpixel X1 and the subpixel X2 while an image is displayed using the subpixels R, G, and B.

A structure including a light-receiving device can be used for both the subpixel X1 and the subpixel X2. In this case, the wavelength ranges of light detected by the subpixel X1 and the subpixel X2 may be the same, different, or partially the same. For example, one of the subpixel X1 and the subpixel X2 may mainly detect visible light while the other may mainly detect infrared light.

The light-receiving area of the subpixel X1 is smaller than the light-receiving area of the subpixel X2. A smaller light-receiving area leads to a narrower image-capturing range, inhibits a blur in a captured image, and improves the definition. Thus, the use of the subpixel X1 enables higher-resolution or higher-definition image capturing than the use of the light-receiving device included in the subpixel X2. For example, image capturing for personal authentication with the use of a fingerprint, a palm print, the iris, the shape of a blood vessel (including the shape of a vein and the shape of an artery), a face, or the like is possible by using the subpixel X1.

The light-receiving device included in the subpixel PS preferably detects visible light, and preferably detects one or more of blue light, violet light, bluish violet light, green light, greenish yellow light, yellow light, orange light, red light, and the like. The light-receiving device included in the subpixel PS may detect infrared light.

In the case where the subpixel X2 has a structure including the light-receiving device, the subpixel X2 can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel X2 can be determined as appropriate depending on the application purpose. For example, the subpixel X2 preferably detects infrared light. Thus, a touch can be detected even in a dark place.

Here, a touch sensor or a near touch sensor can detect an approach or contact of an object (e.g., a finger, a hand, or a pen).

The touch sensor can detect an object when the display panel and the object come in direct contact with each other. The near touch sensor can detect an object even when the object is not in contact with the display panel. For example, the display panel is preferably capable of detecting an object positioned in the range of 0.1 mm to 300 mm, further preferably 3 mm to 50 mm from the display panel. This structure enables the display panel to be operated without direct contact of an object, that is, enables the display panel to be operated in a contactless (touchless) manner. With the above-described structure, the display panel can have a reduced risk of being dirty or damaged, or can be operated without the object directly touching a dirt (e.g., dust or a virus) attached to the display panel.

The refresh rate of the display panel of one embodiment of the present invention can be variable. For example, the refresh rate is adjusted (adjusted in the range from 1 Hz to 240 Hz, for example) in accordance with contents displayed on the display panel, whereby power consumption can be reduced. The driving frequency of the touch sensor or the near touch sensor may be changed in accordance with the refresh rate. In the case where the refresh rate of the display panel is 120 Hz, for example, the driving frequency of the touch sensor or the near touch sensor can be higher than 120 Hz (typically 240 Hz). This structure reduces power consumption and increases the response speed of the touch sensor or the near touch sensor.

Figure 16E:
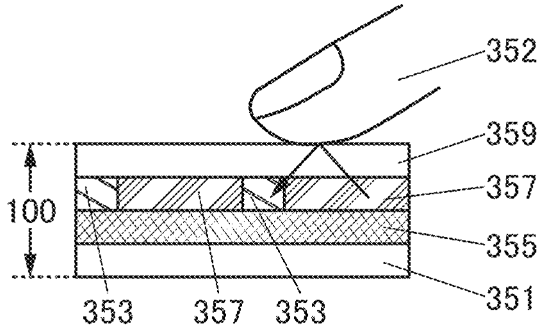
FIG. 16E to FIG. 16G are cross-sectional views illustrating an example of a display panel.
Figure 16F:
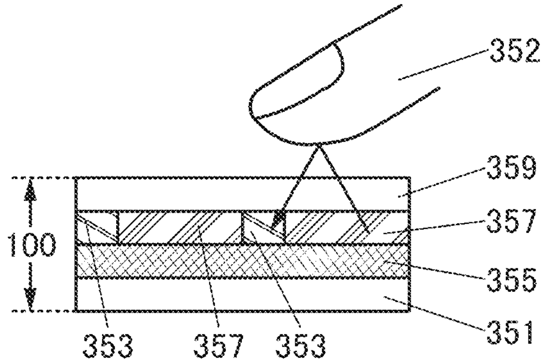
Figure 16G:
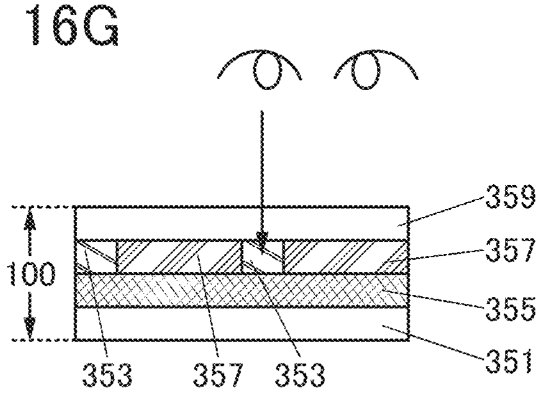

The display panel 100 illustrated in FIG. 16E to FIG. 16G includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch or a transistor may be employed.

For example, after light emitted from the light-emitting device in the layer 357 including the light-emitting device is reflected by a finger 352 that touches the display panel 100 as illustrated in FIG. 16E, the light-receiving device in the layer 353 including the light-receiving device senses the reflected light. Thus, the touch of the finger 352 on the display panel 100 can be detected.

Alternatively, the display panel may have a function of detecting an object that is close to (i.e., not touching) the display panel as illustrated in FIG. 16F and FIG. 16G or capturing an image of such an object. FIG. 16F illustrates an example in which a human finger is detected, and FIG. 16G illustrates an example in which information on the surroundings, surface, or inside of the human eye (e.g., the number of blinks, the movement of an eyeball, and the movement of an eyelid) is detected.

In the display panel of this embodiment, an image of the periphery of an eye, the surface the eye, or the inside (fundus or the like) of the eye of a user of a wearable device can be captured with the use of the light-receiving device. Therefore, the wearable device can have a function of detecting one or more selected from a blink, movement of an iris, and movement of an eyelid of the user.

As described above, the pixel composed of the subpixels each including the light-emitting device can employ any of a variety of layouts in the display panel of one embodiment of the present invention. The display panel of one embodiment of the present invention can have a structure in which the pixel includes both a light-emitting device and a light-receiving device. Also in this case, any of a variety of layouts can be employed.

This embodiment can be combined with any of the other embodiments as appropriate.

Embodiment 4

In this embodiment, display panels of embodiments of the present invention are described with reference to FIG. 17 to FIG. 28.

The display panel of this embodiment can be a high-resolution display panel. Accordingly, the display panel in this embodiment can be used for display portions of information terminals (wearable devices) such as watch-type and bracelet-type information terminals and display portions of wearable devices capable of being worn on a head, such as a VR device like a head-mounted display and a glasses-type AR device.

The display panel of this embodiment can be a high-definition display panel or a large-sized display panel. Accordingly, the display panel of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer and the like, digital signage, and a large game machine such as a pachinko machine.

In the display panel of this embodiment, since a tandem structure is used for light-emitting devices, the difference between the chromaticity at low luminance emission and that at high luminance emission is small. Furthermore, since the EL layers of the light-emitting devices are separated from each other, crosstalk generated between adjacent subpixels can be inhibited while the display panel of this embodiment has high resolution. Accordingly, the display panel can have high resolution and high display quality.

Thus, the display panel of this embodiment can be used for one or both of the wearable display device and the terminal in the display system of one embodiment of the present invention.

[Display Module]

Figure 17A:
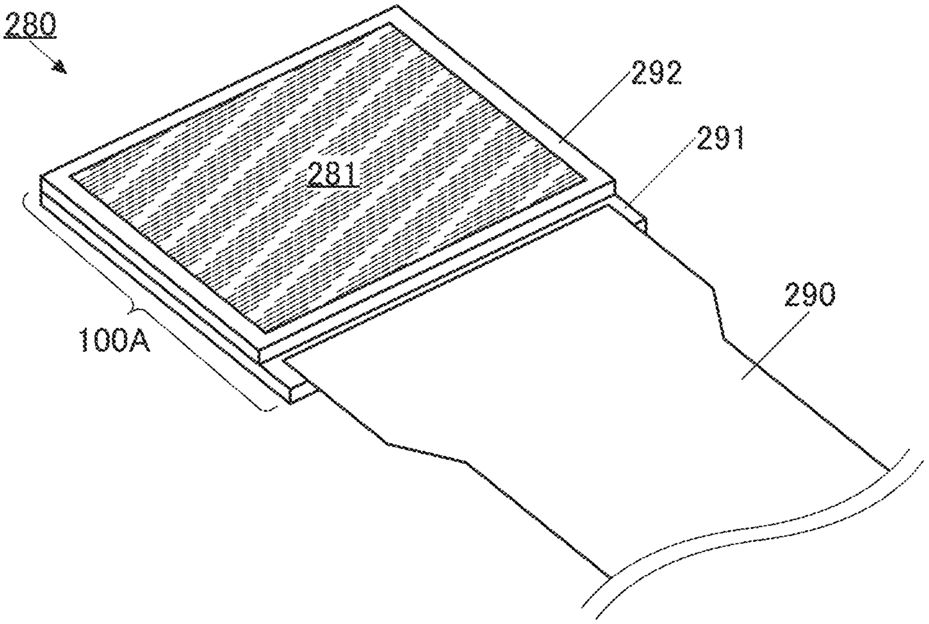
FIG. 17A and FIG. 17B are perspective views illustrating an example of a display panel.

FIG. 17A is a perspective view of a display module 280. The display module 280 includes a display panel 100A and an FPC 290. Note that the display panel included in the display module 280 is not limited to the display panel 100A and may be any of a display panel 100B to a display panel 100F described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 17B:
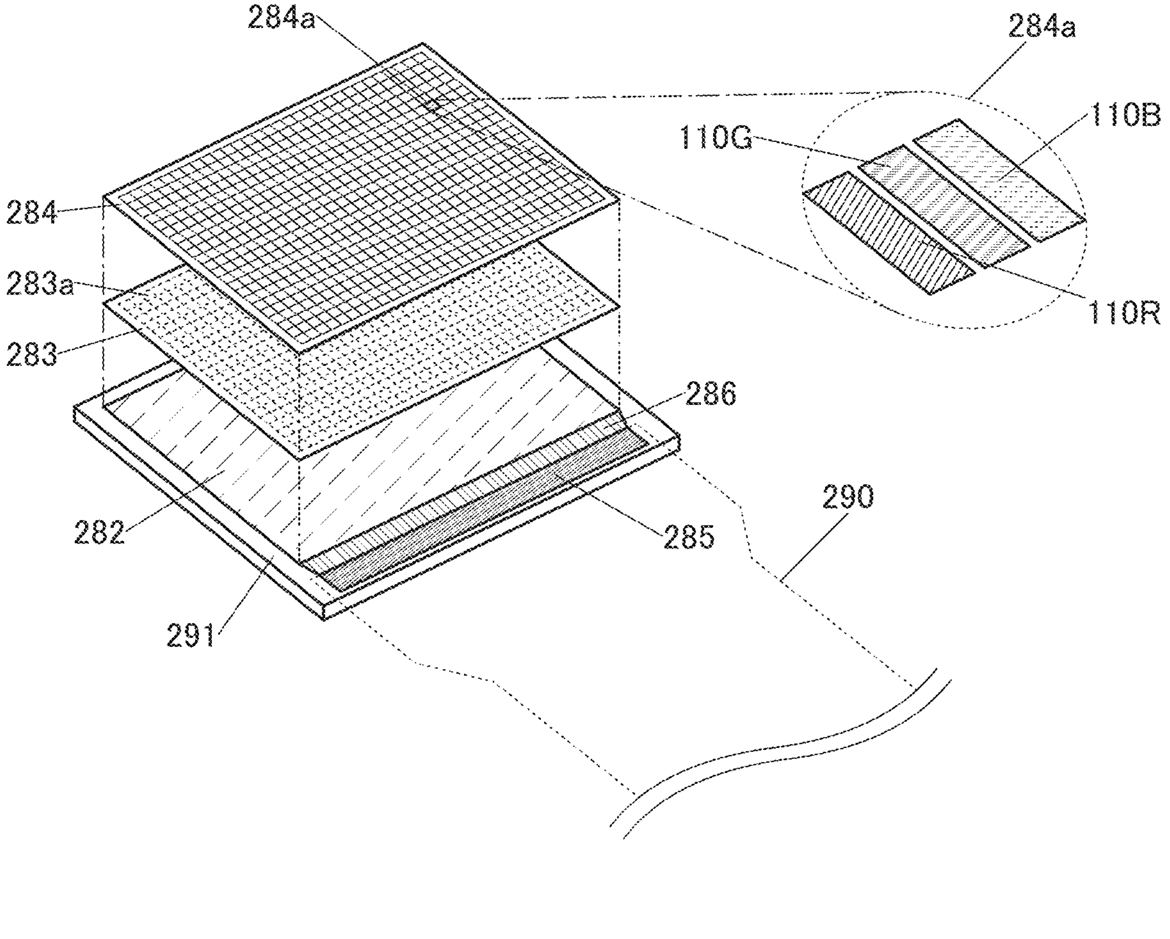

FIG. 17B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 17B. The pixel 284*a* includes a subpixel 110R emitting red light, a subpixel 110G emitting green light, and a subpixel 110B emitting blue light.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits for controlling light emission of the respective light-emitting devices. For example, the pixel circuit 283*a* can include at least one selection transistor, one current control transistor (driving transistor), and a capacitor for one light-emitting device. In this case, a gate signal is input to the gate of the selection transistor, and a source signal is input to the source of the selection transistor. With such a structure, an active-matrix display panel is achieved.

The circuit portion 282 includes a circuit for driving the pixel circuits 283*a* in the pixel circuit portion 283. For example, one or both of agate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 281 can have an extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device such as ahead-mounted display or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

[Display Panel 100A]

Figure 18A:
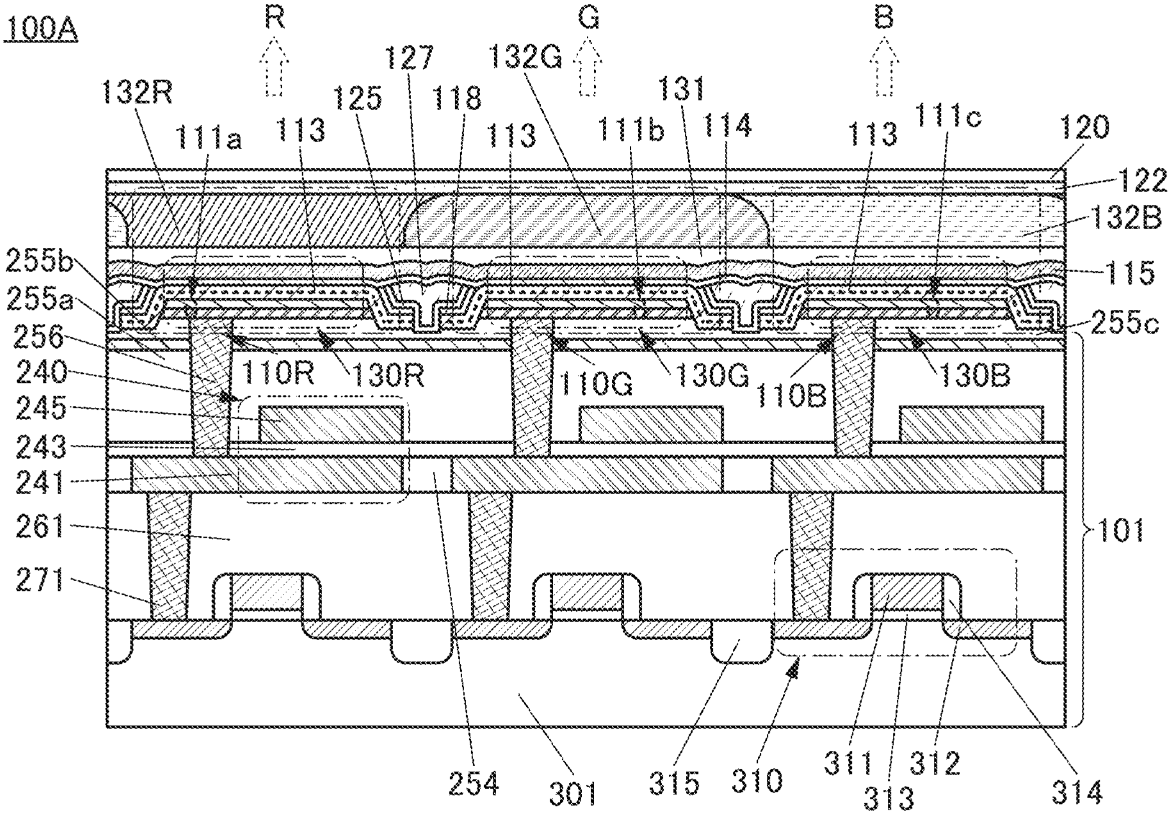
FIG. 18A and FIG. 18B are cross-sectional views illustrating examples of a display panel.

The display panel 100A illustrated in FIG. 18A includes a substrate 301, a light-emitting device 130R, a light-emitting device 130G, a light-emitting device 130B, the coloring layer 132R, the coloring layer 132G, the coloring layer 132B, a capacitor 240, a transistor 310, and the like.

The subpixel 110R includes the light-emitting device 130R and the coloring layer 132R, the subpixel 110G includes the light-emitting device 130G and the coloring layer 132G, and the subpixel 110*b* includes the light-emitting device 130B and the coloring layer 132B. The light-emitting devices 130R, 130G, and 130B can emit white light. In the subpixel 110R, light emitted from the light-emitting device 130R is extracted as red light to the outside of the display panel 100A through the coloring layer 132R. Similarly, In the subpixel 110G, light emitted from the light-emitting device 130G is extracted as green light to the outside of the display panel 100A through the coloring layer 132G. In the subpixel 110B, light emitted from the light-emitting device 130B is extracted as blue light to the outside of the display panel 100A through the coloring layer 132B.

The light-emitting devices in the subpixels emitting light of different colors can have the same structure in which white light can be emitted, for example. Specifically, the EL layers 113 included in the light-emitting devices can have the same structure. In contrast, the EL layers 113 included in the light-emitting device are separated from each other, which can inhibit generation of leakage current between the light-emitting devices. Thus, the display quality of the display panel can be improved.

The substrate 301 corresponds to the substrate 291 in FIG. 17A and FIG. 17B. A stacked-layer structure including the substrate 301 and the components thereover up to the insulating layer 255*c* corresponds to the layer 101 including transistors in Embodiment 2.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c* and a silicon nitride film be used as the insulating layer 255*b*. The insulating layer 255*b* preferably has a function of an etching protective film. Although this embodiment describes an example in which a depressed portion is provided in the insulating layer 255*c*, a depressed portion is not necessarily provided in the insulating layer 255*c*.

The light-emitting device 130R, the light-emitting device 130G, and the light-emitting device 130B are provided over the insulating layer 255*c*. FIG. 18A illustrates an example in which the light-emitting device 130R, the light-emitting device 130G, and the light-emitting device 130B have a structure similar to the stacked-layer structure illustrated in FIG. 6B. An insulator is provided in a region between adjacent light-emitting devices. In FIG. 18A and the like, the insulating layer 125 and the insulating layer 127 over the insulating layer 125 are provided in this region. The sacrificial layer 118 is positioned between the insulating layer 125 and each of the EL layers 113 included in the light-emitting devices 130R, 130G, and 130B.

A pixel electrode 111*a*, a pixel electrode 111*b*, and a pixel electrode 111*c* of the light-emitting device are each electrically connected to one of the source and the drain of the transistor 310 through a plug 256 embedded in the insulating layer 255*a*, the insulating layer 255*b*, and the insulating layer 255*c*, the conductive layer 241 embedded in the insulating layer 254, and the plug 271 embedded in the insulating layer 261. The level of the top surface of the insulating layer 255*c* is equal to or substantially equal to the level of the top surface of the plug 256. A variety of conductive materials can be used for the plugs. FIG. 18A and the like illustrate an example where the pixel electrode has a two-layer structure of a reflective electrode and a transparent electrode over the reflective electrode.

The protective layer 131 is provided over the light-emitting device 130R, the light-emitting device 130G, and the light-emitting device 130B. The substrate 120 is bonded to the protective layer 131 with the resin layer 122. Embodiment 2 can be referred to for details of the light-emitting devices and the components thereover up to the substrate 120. The substrate 120 corresponds to the substrate 292 in FIG. 17A.

The insulating layer covering the end portions of the top surfaces of the pixel electrodes 111*a*, 111*b*, and 111*c* is not provided between the EL layer 113 and each of the pixel electrodes 111*a*, 111*b*, and 111*c*. Thus, the distance between adjacent light-emitting devices can be extremely shortened. Accordingly, the display panel can have high resolution or high definition.

Although the display panel 100A includes the light-emitting devices 130R, 130G, and 130B in this example, the display panel of this embodiment may further include a light-receiving device.

Figure 18B:
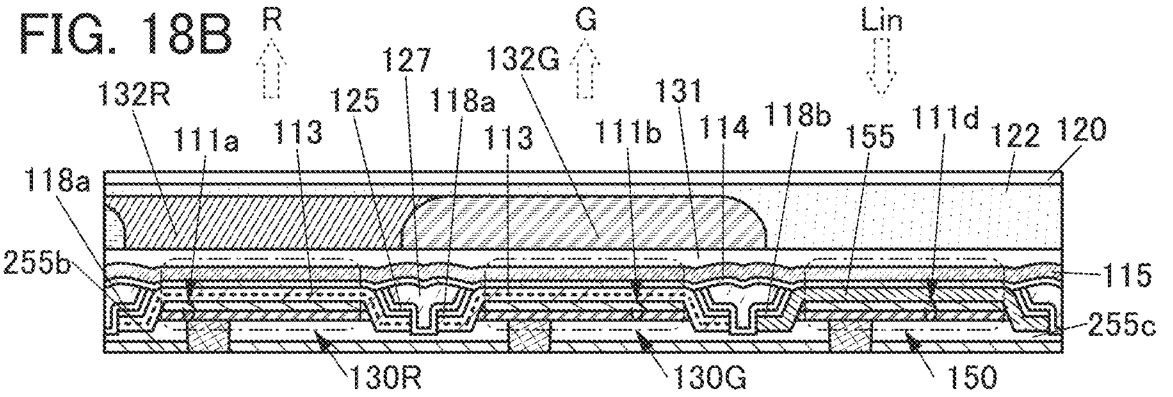

The display panel illustrated in FIG. 18B is a modification example of the stacked-layer structure from the insulating layer 255*b* to the substrate 120 in the display panel illustrated in FIG. 18A and includes the light-emitting devices 130R and 130G and the light-receiving device 150. The light-receiving device 150 includes a pixel electrode 111*d*, the layer 155 including an active layer, the common layer 114, and the common electrode 115 that are stacked. Embodiment 2 can be referred to for details of the components of the light-receiving device 150.

Figure 19A:
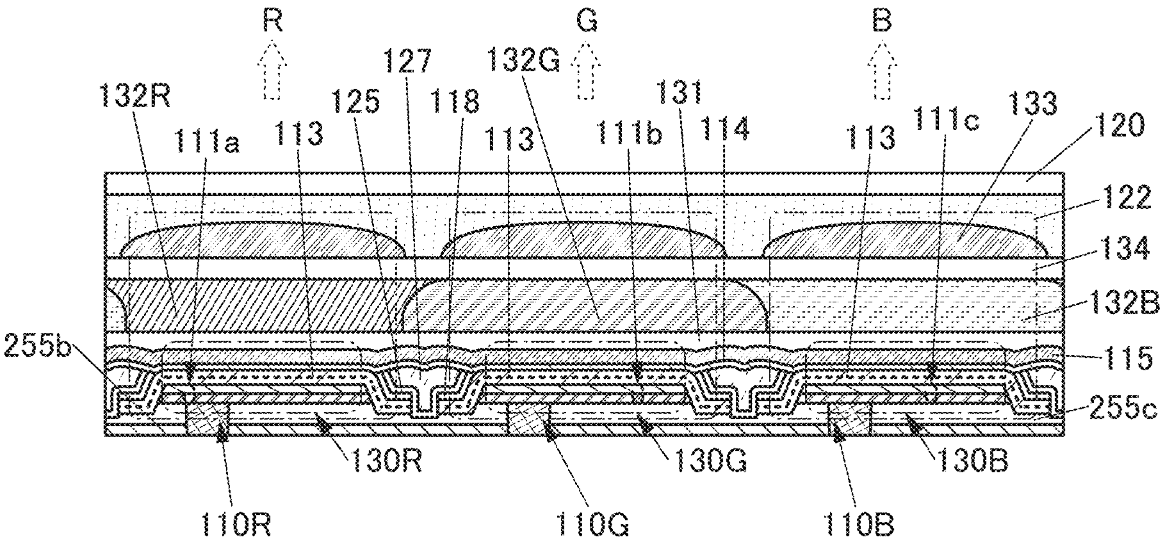
FIG. 19A and FIG. 19B are cross-sectional views illustrating examples of a display panel.
Figure 19B:
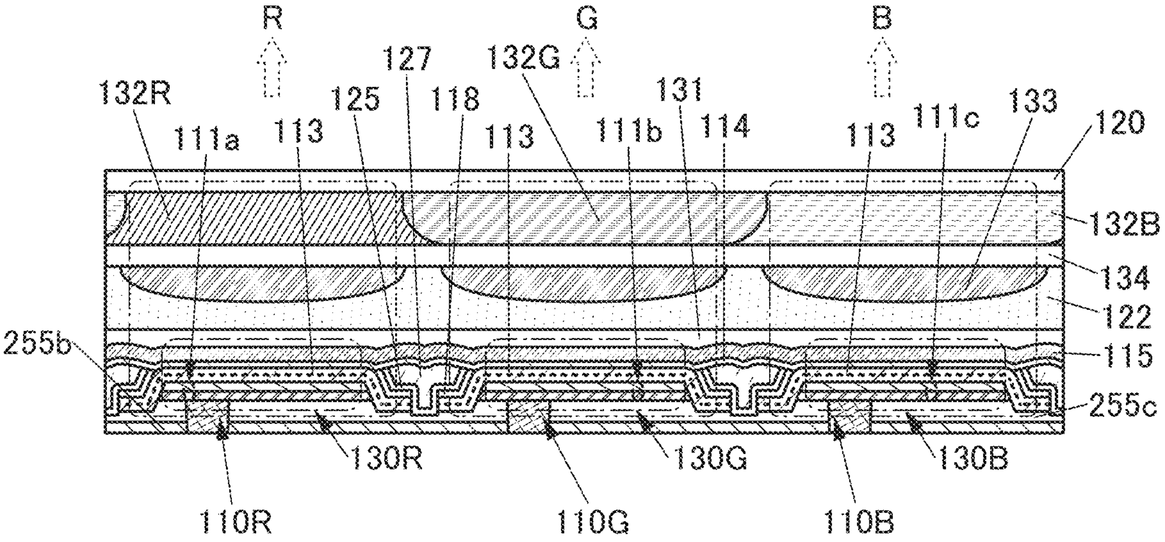

The display panels in FIG. 19A and FIG. 19B are each a modification example of the stacked-layer structure from the insulating layer 255*b* to the substrate 120 in the display panel illustrated in FIG. 18A. As illustrated in FIG. 19A and FIG. 19B, a lens array 133 may be provided. Using the lens array 133 enables light emitted by the light-emitting devices to be collected.

FIG. 19A illustrates an example where the coloring layers 132R, 132G, and 132B are provided over the light-emitting devices 130R, 130G, and 130B with the protective layer 131 therebetween, an insulating layer 134 is provided over the coloring layers 132R, 132G, and 132B, and the lens array 133 is provided over the insulating layer 134. The coloring layer 132R, the coloring layer 132G, the coloring layer 132B, and the lens array 133 are directly formed over the substrate provided with the light-emitting devices, whereby the accuracy of positional alignment of the light-emitting devices and the coloring layers or the lens array can be enhanced.

For the insulating layer 134, one or both of an inorganic insulating material and an organic insulating material can be used. The insulating layer 134 may have either a single-layer structure or a stacked-layer structure. The insulating layer 134 can be formed using a material that can be used for the protective layer 131, for example. When light emitted by the light-emitting device is extracted through the insulating layer 134, the insulating layer 134 preferably has a high visible-light-transmitting property.

In FIG. 19A, light emitted by the light-emitting device passes through the coloring layer and then passes through the lens array 133, resulting in being extracted to the outside of the display panel. It is preferable to shorten the distance between the light-emitting device and the coloring layer because color mixing can be inhibited and the viewing angle characteristics can be improved. Note that the lens array 133 may be provided over the light-emitting device and the coloring layer may be provided over the lens array 133.

FIG. 19B illustrates an example where the substrate 120 provided with the coloring layer 132R, the coloring layer 132G, the coloring layer 132B, and the lens array 133 is bonded onto the protective layer 131 with the resin layer 122. The substrate 120 is provided with the coloring layer 132R, the coloring layer 132G, the coloring layer 132B, and the lens array 133, whereby the heat treatment temperature in the forming process of them can be increased.

In the example of FIG. 19B, the coloring layers 132R, 132G, and 132B are provided in contact with the substrate 120, the insulating layer 134 is provided in contact with the coloring layers 132R, 132G, and 132B, and the lens array 133 is provided in contact with the insulating layer 134.

In FIG. 19B, light emitted by the light-emitting device passes through the lens array 133 and then passes through the coloring layer, resulting in being extracted to the outside of the display panel. Note that the lens array 133 may be provided in contact with the substrate 120, the insulating layer 134 may be provided in contact with the lens array 133, and the coloring layer may be provided in contact with the insulating layer 134. In this case, light emitted by the light-emitting device passes through the coloring layer and then passes through the lens array 133, resulting in being extracted to the outside of the display panel. Note that it is preferable that a region where the coloring layer 132B and the coloring layer 132G overlap with each other and a region where the coloring layer 132G and the coloring layer 132R overlap with each other be provided between adjacent lens arrays 133, as illustrated in FIG. 19A and FIG. 19B. Providing a region where coloring layers of different colors overlap with each other can inhibit mixing of light emitted by the light-emitting devices.

The lens array 133 may have a convex surface facing the substrate 120 side or a convex surface facing the light-emitting device side. In view of manufacturing easiness, it is preferable that the convex surface face the substrate 120 side when the lens is formed over the light-emitting device, and it is preferable that the convex surface face the light-emitting device side when the lens is formed on the substrate 120 side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used. The lens array 133 may be directly formed over the substrate or the light-emitting device. Alternatively, a lens array separately formed may be bonded thereto.

[Display Panel 100B]

Figure 20:
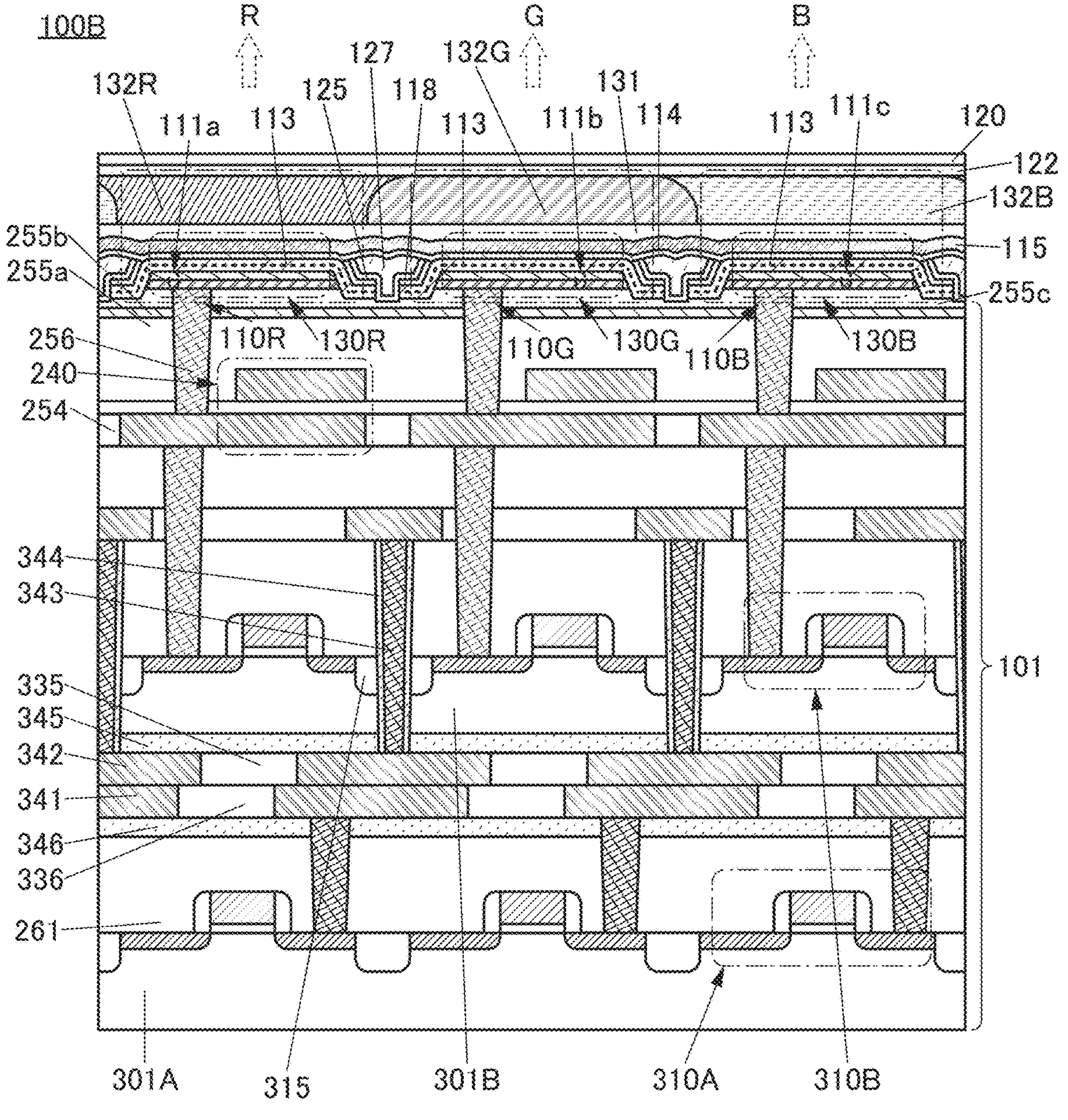
FIG. 20 is a cross-sectional view illustrating an example of a display panel.

The display panel 100B illustrated in FIG. 20 has a structure where a transistor 310A and a transistor 310B in each of which a channel is formed in a semiconductor substrate are stacked. Note that in the description of the display panel below, portions similar to those of the above-mentioned display panel are not described in some cases.

In the display panel 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 131 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Over the substrate 301A, a conductive layer 341 is provided over the insulating layer 346. The conductive layer 341 is preferably provided to be embedded in an insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper) pads.

[Display Panel 100C]

Figure 21:
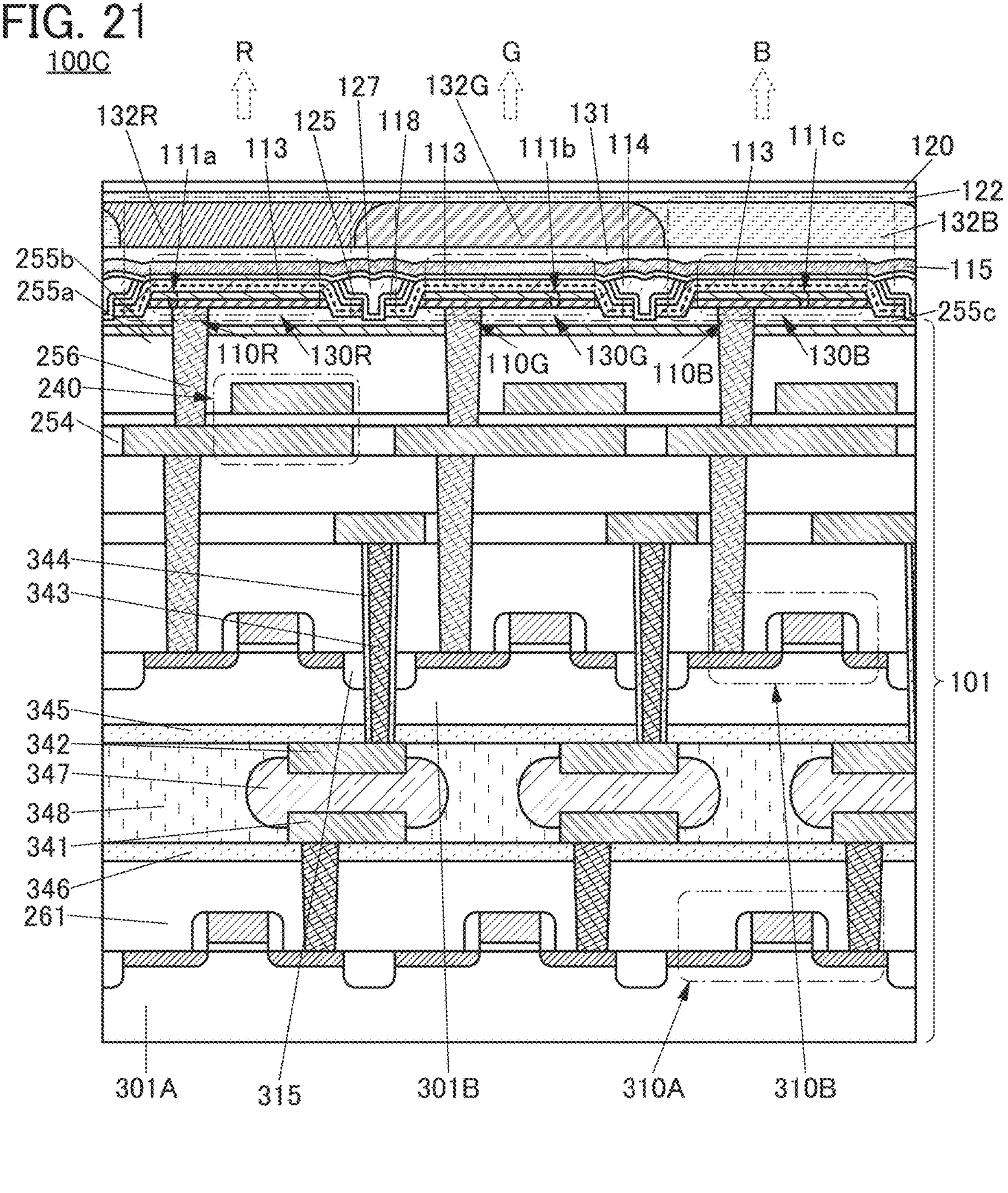
FIG. 21 is a cross-sectional view illustrating an example of a display panel.

The display panel 100C illustrated in FIG. 21 has a structure where the conductive layer 341 and the conductive layer 342 are bonded to each other through a bump 347.

As illustrated in FIG. 21, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Panel 100D]

Figure 22:
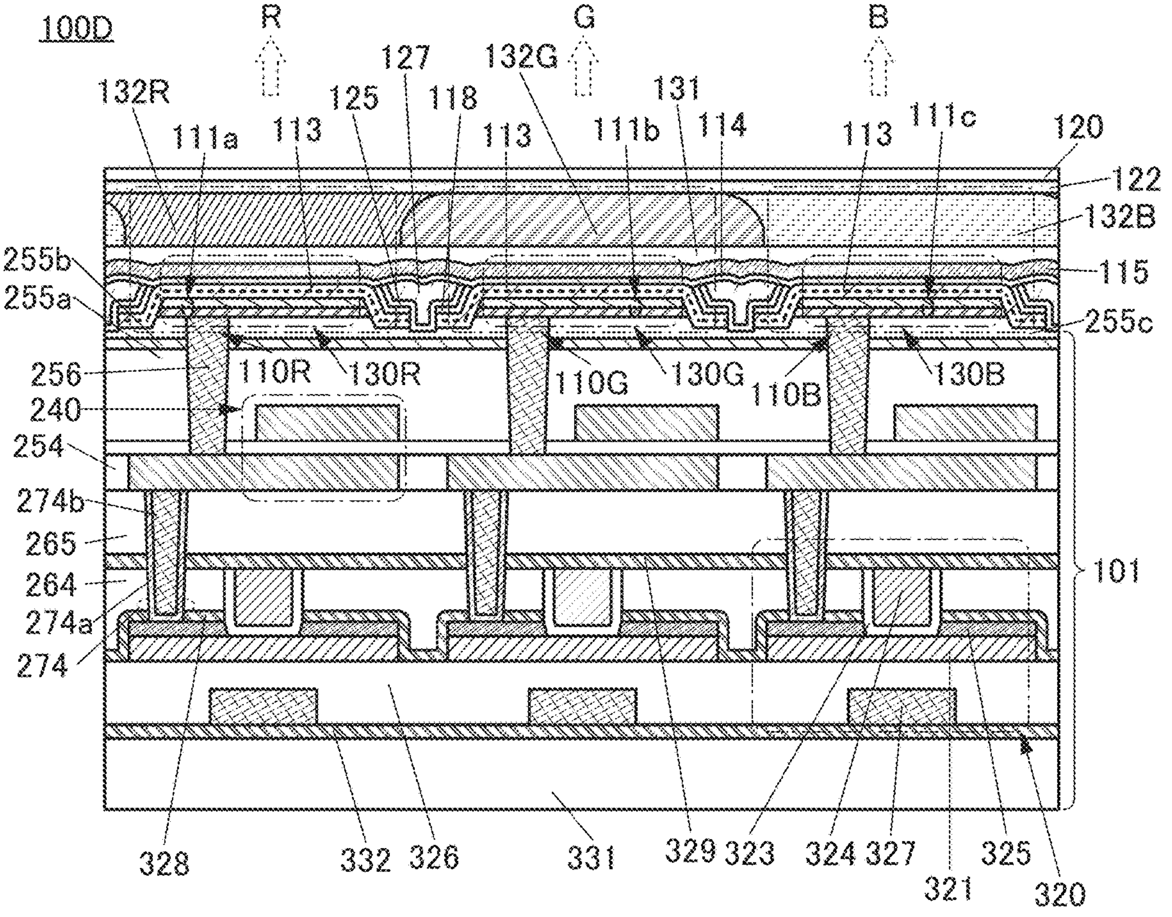
FIG. 22 is a cross-sectional view illustrating an example of a display panel.

The display panel 100D illustrated in FIG. 22 differs from the display panel 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 17A and FIG. 17B. A stacked-layer structure including the substrate 331 and components thereover up to the insulating layer 255*b* corresponds to the layer 101 including transistors in Embodiment 2. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material through which hydrogen and oxygen are less likely to diffuse is preferably used for the conductive layer 274*a*.

[Display Panel 100E]

Figure 23:
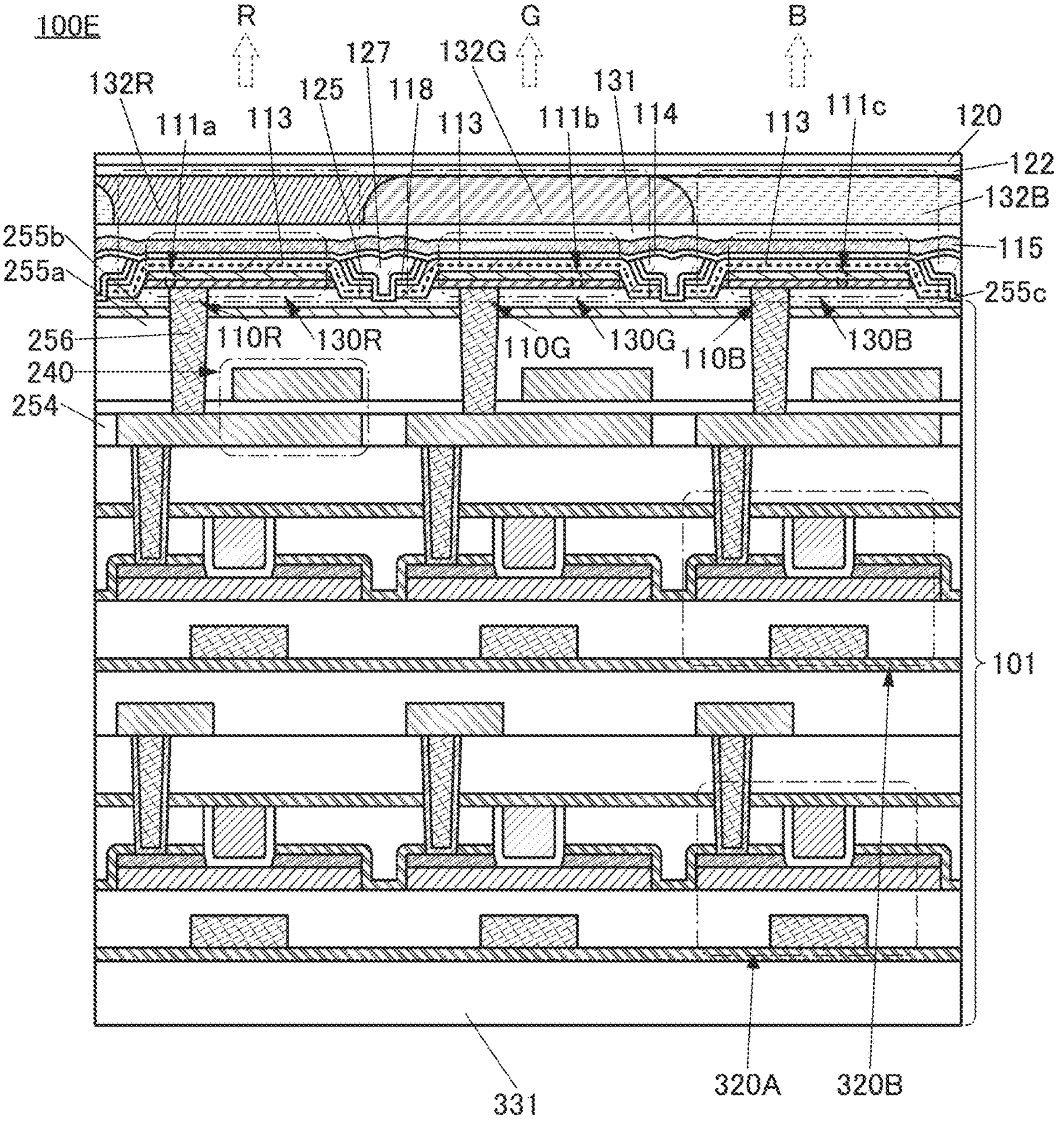
FIG. 23 is a cross-sectional view illustrating an example of a display panel.

The display panel 100E illustrated in FIG. 23 has a structure in which a transistor 320A and a transistor 320B each including an oxide semiconductor in a semiconductor where a channel is formed are stacked.

The description of the display panel 100D can be referred to for the transistor 320A, the transistor 320B, and the components around them.

Although the structure where two transistors including an oxide semiconductor are stacked is described, the present invention is not limited thereto. For example, three or more transistors may be stacked.

[Display Panel 100F]

Figure 24:
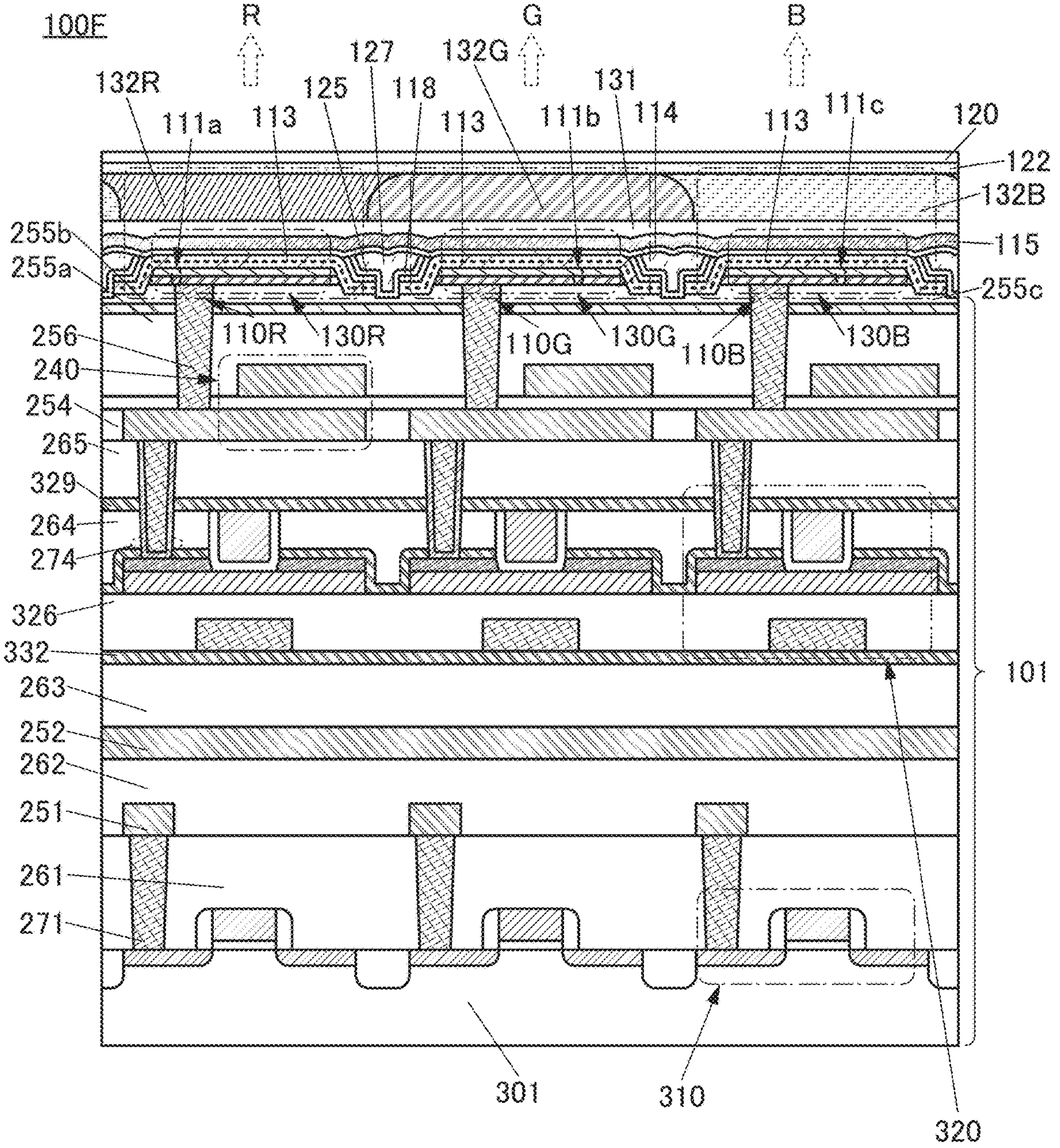
FIG. 24 is a cross-sectional view illustrating an example of a display panel.

The display panel 100F illustrated in FIG. 24 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

[Display Panel 100G]

Figure 25:
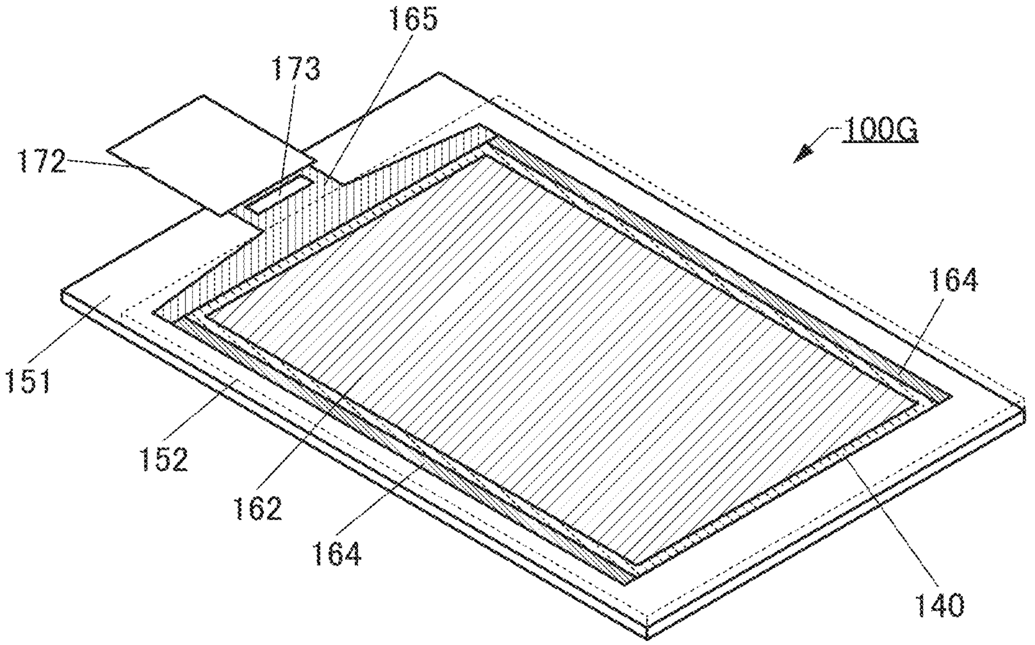
FIG. 25 is a perspective view illustrating an example of a display panel.
Figure 26A:
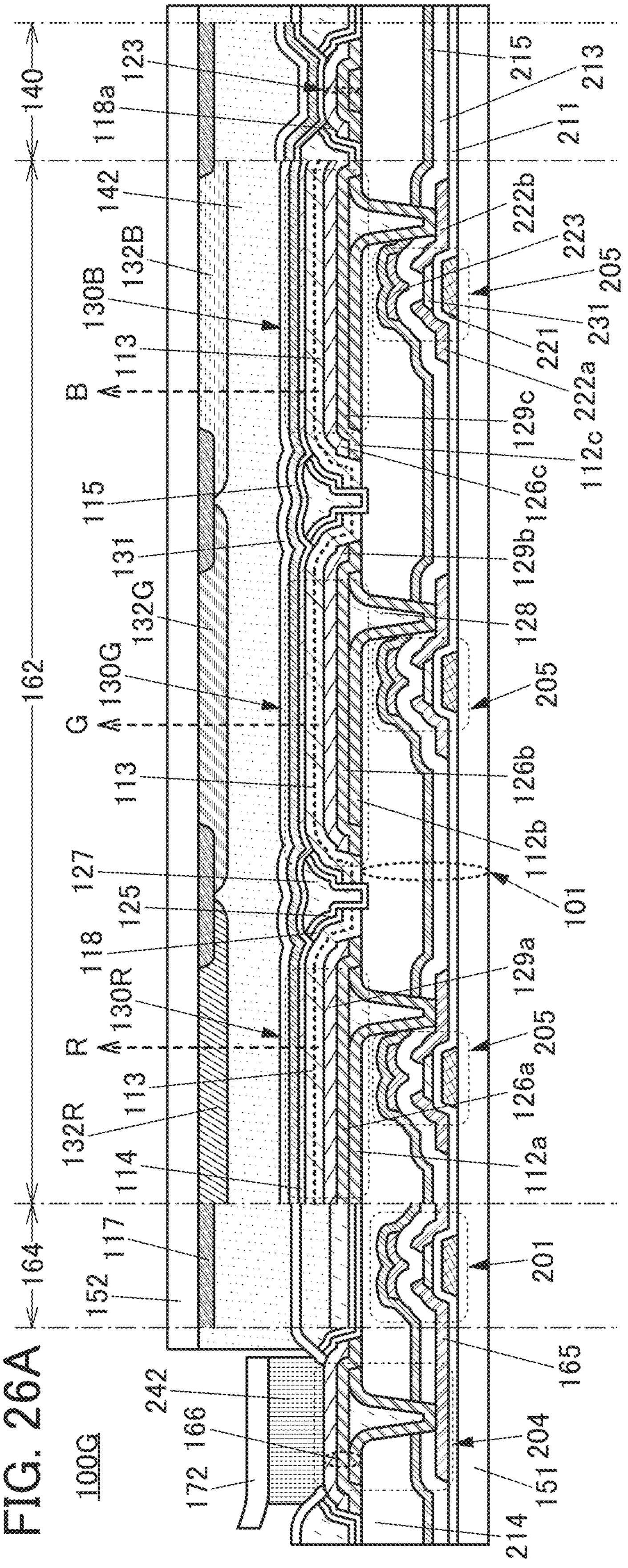
FIG. 26A is a cross-sectional view illustrating an example of a display panel.

FIG. 25 is a perspective view of a display panel 100G, and FIG. 26A is a cross-sectional view of the display panel 100G.

In the display panel 100G, a substrate 152 and a substrate 151 are bonded to each other. In FIG. 25, the substrate 152 is denoted by a dashed line.

The display panel 100G includes a display portion 162, the connection portion 140, a circuit 164, a wiring 165, and the like. FIG. 25 illustrates an example where an IC 173 and an FPC 172 are mounted on the display panel 100G. Thus, the structure illustrated in FIG. 25 can be regarded as a display module including the display panel 100G, the IC (integrated circuit), and the FPC.

The connection portion 140 is provided outside the display portion 162. The connection portion 140 can be provided along one or more sides of the display portion 162. The number of connection portions 140 can be one or more. FIG. 25 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 25 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display panel 100G and the display module are not necessarily provided with an IC. The IC may be mounted on the FPC by a COF method or the like.

FIG. 26A illustrates an example of cross sections of part of a region including the FPC 172, part of the circuit 164, part of the display portion 162, part of the connection portion 140, and part of a region including an end portion of the display panel 100G.

In the display panel 100G illustrated in FIG. 26A, a transistor 201, a transistor 205, the light-emitting device 130R, the light-emitting device 130G, the light-emitting device 130B, the coloring layer 132R transmitting red light, the coloring layer 132G transmitting green light, the coloring layer 132B transmitting blue light, and the like are provided between the substrate 151 and the substrate 152. Light emitted by the light-emitting device 130R is extracted as red light to the outside of the display panel 100G through the coloring layer 132R. Similarly, light emitted by the light-emitting device 130G is extracted as green light to the outside of the display panel 100G through the coloring layer 132G. Light emitted by the light-emitting device 130B is extracted as blue light to the outside of the display panel 100G through the coloring layer 132B.

The light-emitting devices 130R, 130G, and 130B each have the same structure as the stacked-layer structure illustrated in FIG. 6B except the structure of the pixel electrode. Embodiment 2 can be referred to for the details of the light-emitting devices.

The light-emitting devices in the subpixels emitting light of different colors can have the same structure in which white light can be emitted, for example. Specifically, the EL layers 113 included in the light-emitting devices can have the same structure. In contrast, the EL layers 113 included in the light-emitting devices are separated from each other, which can inhibit generation of leakage current between the light-emitting devices. Thus, the display quality of the display panel can be improved.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through an opening provided in the insulating layer 214. The end portion of the conductive layer 126*a* is positioned on the outer side of the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

The conductive layers 112*a*, 112*b*, and 112*c* are provided to cover the openings provided in the insulating layer 214. A layer 128 is embedded in each of depressed portions of the conductive layers 112*a*, 112*b*, and 112*c*.

The layer 128 has a planarization function for the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development processes, reducing the influence of dry etching, wet etching, or the like on the surfaces of the conductive layers 112*a*, 112*b*, and 112*c*. When the layer 128 is formed using a negative photosensitive resin, the layer 128 can sometimes be formed using the same photomask (light-exposure mask) as the photomask used for forming the opening in the insulating layer 214.

The top and side surfaces of the conductive layer 126*a* and the top and side surfaces of the conductive layer 129*a* are covered with the EL layer 113. Similarly, the top surface and side surfaces of the conductive layer 126*b* and the top and side surfaces of the conductive layer 129*b* are covered with the EL layer 113. Moreover, the top and side surfaces of the conductive layer 126*c* and the top and side surfaces of the conductive layer 129*c* are covered with the EL layer 113. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surface of the EL layer 113 is covered with the insulating layers 125 and 127. The sacrificial layer 118 is positioned between the insulating layer 125 and each of the EL layers 113 included in the light-emitting devices 130R, 130G, and 130B. The common layer 114 is provided over the EL layer 113 and the insulating layers 125 and 127, and the common electrode 115 is provided over the common layer 114. The common layer 114 and the common electrode 115 are each a continuous film shared by a plurality of light-emitting devices.

The protective layer 131 is provided over each of the light-emitting devices 130R, 130G, and 130B. The protective layer 131 covering the light-emitting devices can inhibit an impurity such as water from entering the light-emitting devices, and increase the reliability of the light-emitting devices.

The protective layer 131 and the substrate 152 are bonded to each other with an adhesive layer 142. A solid sealing structure, a hollow sealing structure, or the like can be employed to seal the light-emitting devices. In FIG. 26A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. Here, the adhesive layer 142 may be provided not to overlap with the light-emitting devices. The space may be filled with a resin other than the frame-shaped adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the sacrificial layer 118, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly and electrically connected to each other.

The display panel 100G has a top-emission structure. Light emitted by the light-emitting device is emitted toward the substrate 152. For the substrate 152, a material having a high visible-light-transmitting property is preferably used. The pixel electrode contains a material that reflects visible light, and a counter electrode (the common electrode 115) contains a material that transmits visible light.

A stacked-layer structure including the substrate 151 and the components thereover up to the insulating layer 214 corresponds to the layer 101 including transistors in Embodiment 2.

The transistor 201 and the transistor 205 are formed over the substrate 151. These transistors can be fabricated using the same material in the same process.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of a display panel.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 at the time of processing the conductive layer 112*a*, the conductive layer 126*a*, the conductive layer 129*a*, or the like. Alternatively, a depressed portion may be formed in the insulating layer 214 at the time of processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as agate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display panel of this embodiment.

As the oxide semiconductor having crystallinity, a CAAC (c-axis aligned crystalline)-OS, an nc (nanocrystalline)-OS, and the like can be given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display panel can be simplified, and component cost and mounting cost can be reduced.

An OS transistor has extremely higher field-effect mobility than a transistor containing amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display panel can be reduced with the use of an OS transistor.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve “inhibition of black floating”, “increase in emission luminance", "increase in gray level", "inhibition of variation in light-emitting devices", and the like.

The metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When the semiconductor layer is an In-M-Zn oxide, the atomic ratio of In is preferably higher than or equal to the atomic ratio ofM in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In M:Zn=4:2:3 or a composition in the neighborhood thereof, In:M:Zn=4:2:4.1 or a composition in the neighborhood thereof, In M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display panel can have low power consumption and high drive capability. Note that a structure where an LTPS transistor and an OS transistor are used in combination is referred to as LTPO in some cases. Note that as a further suitable example, a structure can be given where an OS transistor is used as, for example, a transistor functioning as a switch for controlling conduction and non-conduction between wirings and an LTPS transistor is used as, for example, a transistor for controlling current.

For example, one of the transistors included in the display portion 162 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display panel of one embodiment of the present invention can have all of a high aperture ratio, high resolution, high display quality, and low power consumption.

Note that the display panel of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display panel. When the leakage current that might flow through the transistor and the lateral leakage current that might flow between light-emitting devices are extremely low, display with little leakage of light at the time of black display can be achieved.

Figure 26B:
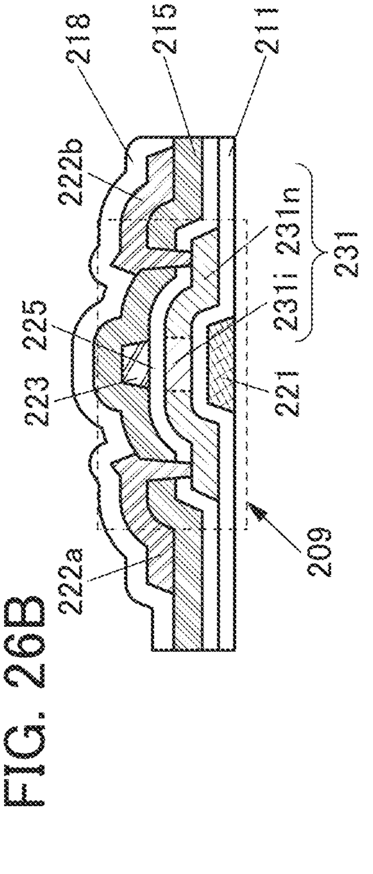
FIG. 26B and FIG. 26C are cross-sectional views illustrating examples of a transistor.
Figure 26C:
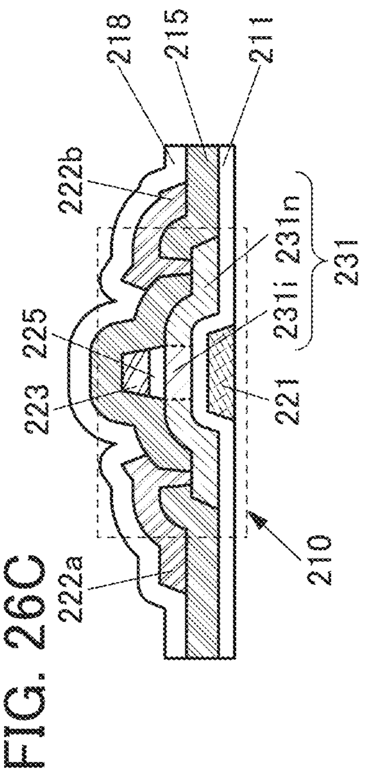

FIG. 26B and FIG. 26C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 26B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 26C, the insulating layer 225 overlaps with the channel formation region 231*i* of the semiconductor layer 231 and does not overlap with the low-resistance regions 231*n*. The structure illustrated in FIG. 26C can be formed by processing the insulating layer 225 with the conductive layer 223 as a mask, for example. In FIG. 26C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. The conductive layer 166 is exposed on the top surface of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between adjacent light-emitting devices, in the connection portion 140, and in the circuit 164, for example. A variety of optical members can be arranged on the outer surface of the substrate 152.

In addition, the coloring layers 132R and 132G may be provided on the surface of the substrate 152 on the substrate 151 side. In FIG. 26A, when the substrate 152 is considered as a reference, the coloring layers 132R and 132G are provided to cover part of the light-blocking layer 117.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Panel 100H]

Figures 27A, 27B, 27C, 27D:
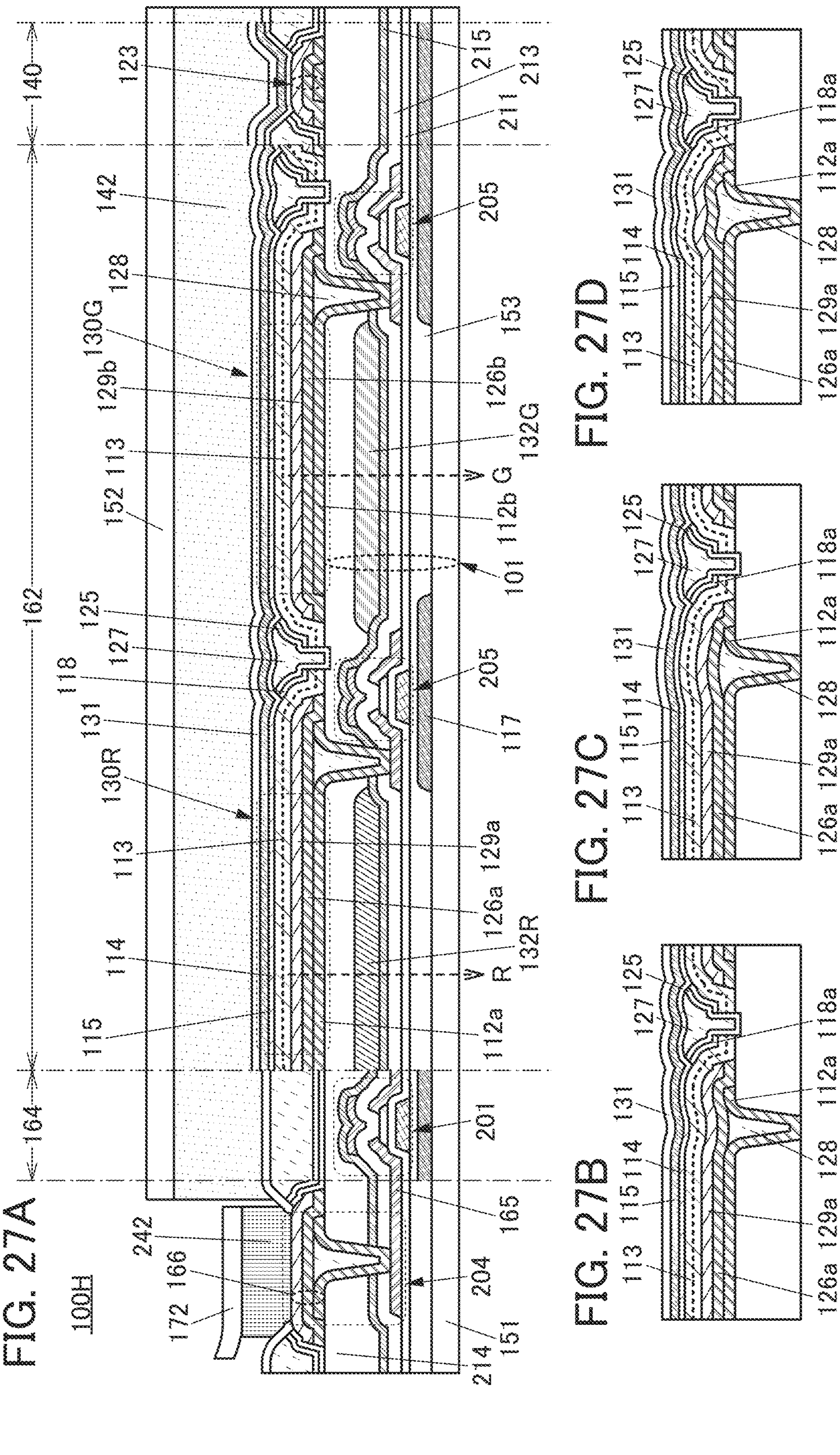
FIG. 27A to FIG. 27D are cross-sectional views illustrating examples of a display panel.

A display panel 100H illustrated in FIG. 27A differs from the display panel 100G mainly in having a bottom-emission structure.

Light emitted by the light-emitting device is emitted toward the substrate 151 side. For the substrate 151, a material having a high visible-light-transmitting property is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 27A illustrates an example in which the light-blocking layer 117 is provided over the substrate 151, an insulating layer 153 is provided over the light-blocking layer 117, and the transistors 201 and 205 and the like are provided over the insulating layer 153.

Moreover, in the display panel 100H, the coloring layer 132R transmitting red light and the coloring layer 132G transmitting green light are provided between the insulating layer 215 and the insulating layer 214. It is preferable that each of the end portion of the coloring layer 132R and the end portion of the coloring layer 132G overlap with the light-blocking layer 117. Light emitted by the light-emitting device 130R is extracted as red light to the outside of the display panel 100H through the coloring layer 132R. Light emitted by the light-emitting device 130G is extracted as green light to the outside of the display panel 100H through the coloring layer 132G. Although not illustrated, the coloring layer 132B transmitting blue light is provided between the insulating layer 215 and the insulating layer 214, and light emitted by the light-emitting device 130B is extracted as blue light to the outside of the display panel 100H through the coloring layer 132B.

The light-emitting device 130R includes the conductive layer 112*a*, the conductive layer 126*a* over the conductive layer 112*a*, and the conductive layer 129*a* over the conductive layer 126*a*.

The light-emitting device 130G includes the conductive layer 112*b*, the conductive layer 126*b* over the conductive layer 112*b*, and the conductive layer 129*b* over the conductive layer 126*b*.

A material having a high visible-light-transmitting property is used for each of the conductive layers 112*a*, 112*b*, 126*a*, 126*b*, 129*a*, and 129*b*. A material reflecting visible light is preferably used for the common electrode 115.

Although FIG. 26A, FIG. 27A, and the like illustrate an example where the top surface of the layer 128 includes a flat portion, the shape of the layer 128 is not particularly limited. FIG. 27B to FIG. 27D illustrate variation examples of the layer 128.

As illustrated in FIG. 27B and FIG. 27D, the top surface of the layer 128 can have a shape such that its center and the vicinity thereof are recessed, i.e., a shape including a concave surface, in a cross-sectional view.

As illustrated in FIG. 27C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112*a* may be equal to or substantially equal to each other, or may be different from each other. For example, the level of the top surface of the layer 128 may be either lower or higher than the level of the top surface of the conductive layer 112*a*.

FIG. 27B can be regarded as illustrating an example where the layer 128 fits in the depressed portion of the conductive layer 112*a*. By contrast, as illustrated in FIG. 27D, the layer 128 may exist also outside the depressed portion of the conductive layer 112*a*, that is, the layer 128 may be formed to have a top surface wider than the depressed portion.

[Display Panel 100J]

Figure 28:
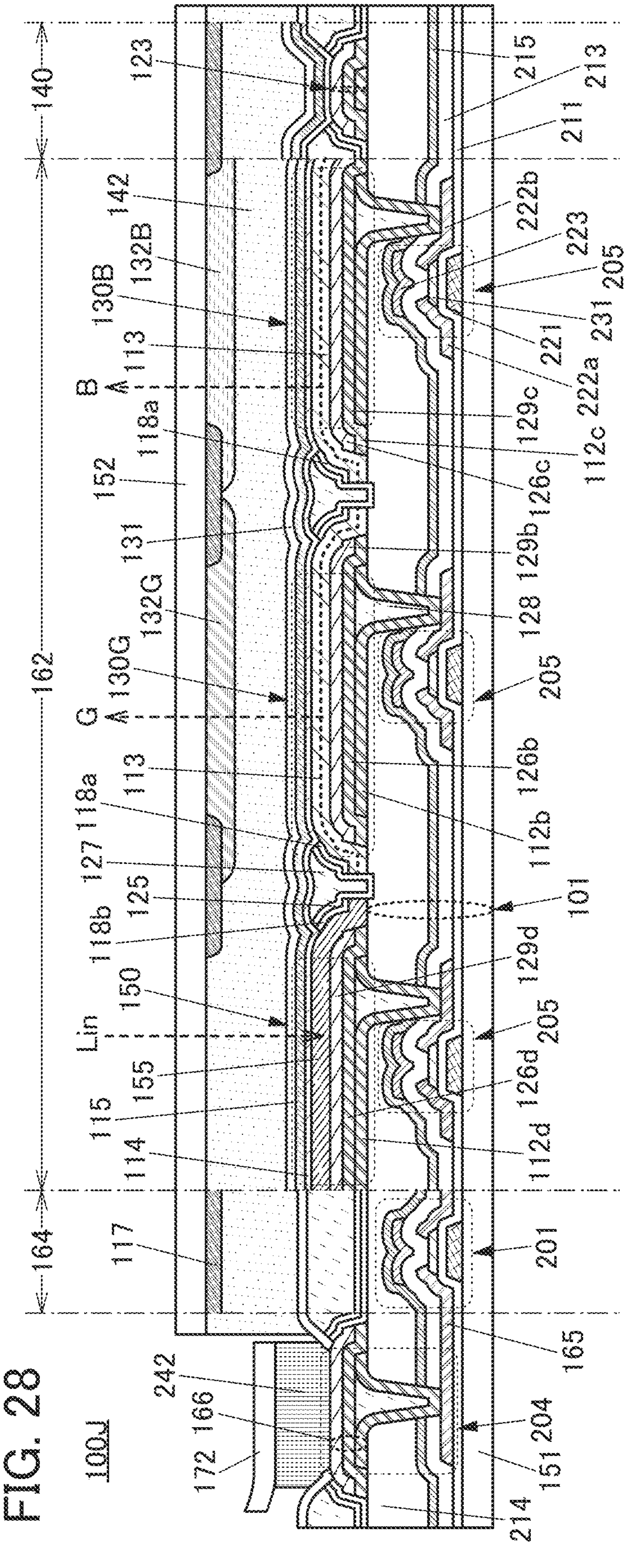
FIG. 28 is a cross-sectional view illustrating an example of a display panel.

A display panel 100J illustrated in FIG. 28 is different from the display panel 100G mainly in including the light-receiving device 150.

The light-receiving device 150 includes a conductive layer 112*d*, a conductive layer 126*d* over the conductive layer 112*d*, and a conductive layer 129*d* over the conductive layer 126*d*.

The conductive layer 112*d* is connected to the conductive layer 222*b* included in the transistor 205 through an opening provided in the insulating layer 214.

The top and side surfaces of the conductive layer 126*d* and the top and side surfaces of the conductive layer 129*d* are covered with the layer 155 including an active layer.

The side surface of the layer 155 is covered with the insulating layers 125 and 127. The sacrificial layer 118*b* is positioned between the layer 155 and the insulating layer 125. The common layer 114 is provided over the layer 155 and the insulating layers 125 and 127, and the common electrode 115 is provided over the common layer 114. The common layer 114 is a continuous film provided to be shared by the light-receiving device and the light-emitting devices.

For example, the pixel layout described in Embodiment 2 with reference to FIG. 12A or the pixel layout described in Embodiment 3 with reference to FIG. 16A to FIG. 16D can be used for the display panel 100J. The light-receiving device 150 can be provided in at least one of the subpixel PS, the subpixel X1, the subpixel X2, and the like. Embodiment 2 can be referred to for the details of the display panel including the light-receiving device.

This embodiment can be combined with any of the other embodiments as appropriate.

Embodiment 5

In this embodiment, a structure example of a transistor that can be used in the display panel of one embodiment of the present invention will be described. Specifically, the case of using a transistor including silicon as a semiconductor where a channel is formed will be described.

One embodiment of the present invention is a display panel including a light-emitting device and a pixel circuit. For example, three kinds of subpixels emitting light of red (R), green (G), and blue (B) are included, whereby a full-color display panel can be achieved.

Transistors containing silicon in their semiconductor layers where channels are formed are preferably used as all transistors included in the pixel circuit for driving the light-emitting device. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display panel can be simplified, whereby parts costs and mounting costs can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than a transistor including amorphous silicon. In addition, the OS transistor has an extremely low off-state current, and charge accumulated in a capacitor that is connected in series to the transistor can be retained for a long period. Furthermore, power consumption of the display panel can be reduced with the use of an OS transistor.

When an LTPS transistor is used as one or more of the transistors included in the pixel circuit and an OS transistor is used as the rest, a display panel with low power consumption and high driving capability can be achieved. As a more preferable example, a structure is given in which an OS transistor is used as a transistor functioning as a switch for controlling electrical continuity and discontinuity between wirings and an LTPS transistor is used as a transistor for controlling a current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples are described below with reference to drawings.

Structure Example 2 of Display Panel

Figure 29A:
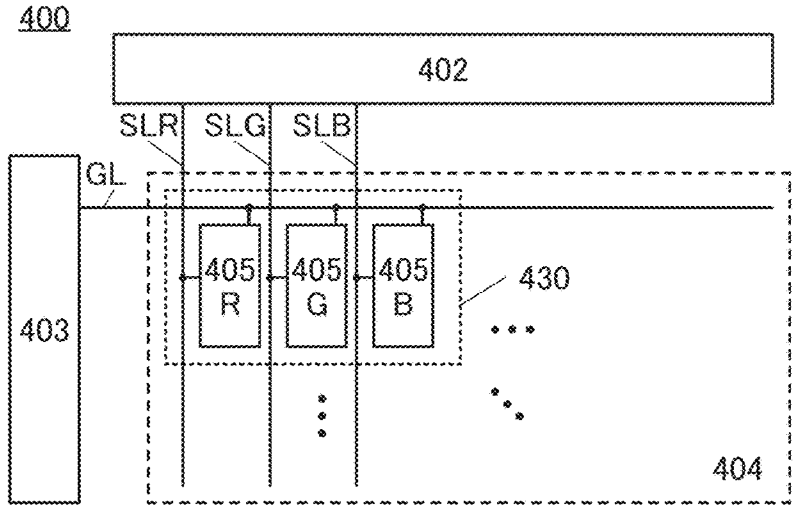
FIG. 29A is a block diagram illustrating an example of a display panel.

FIG. 29A illustrates a block diagram of a display panel 400. The display panel 400 includes a display portion 404, a driver circuit portion 402, a driver circuit portion 403, and the like.

The display portion 404 includes a plurality of pixels 430 arranged in a matrix. The pixels 430 each include a subpixel 405R, a subpixel 405G, and a subpixel 405B. The subpixel 405R, the subpixel 405G, and the subpixel 405B each include a light-emitting device functioning as a display device.

The pixel 430 is electrically connected to a wiring GL, a wiring SLR, a wiring SLG, and a wiring SLB. The wiring SLR, the wiring SLG, and the wiring SLB are electrically connected to the driver circuit portion 402. The wiring GL is electrically connected to the driver circuit portion 403. The driver circuit portion 402 functions as a source line driver circuit (also referred to as a source driver), and the driver circuit portion 403 functions as a gate line driver circuit (also referred to as a gate driver). The wiring GL functions as a gate line, and the wiring SLR, the wiring SLG, and the wiring SLB each function as a source line.

The subpixel 405R emits red light. The subpixel 405G emits green light. The subpixel 405B emits blue light. The subpixels include light-emitting devices including EL layers having the same structure and coloring layers overlapping with the light-emitting devices. When coloring layers that transmit visible light of different colors are provided in the subpixels, the display panel 400 can perform full-color display. Note that the pixel 430 may include a subpixel emitting light of another color. For example, the pixel 430 may include, in addition to the three subpixels, a subpixel emitting white light, a subpixel emitting yellow light, or the like.

The wiring GL is electrically connected to the subpixel 405R, the subpixel 405G, and the subpixel 405B arranged in a row direction (an extending direction of the wiring GL). The wiring SLR, the wiring SLG, and the wiring SLB are electrically connected to the subpixels 405R, the subpixels 405G, and the subpixels 405B (not illustrated) arranged in a column direction (an extending direction of the wiring SLR and the like), respectively.

Structure Example of Pixel Circuit

Figure 29B:
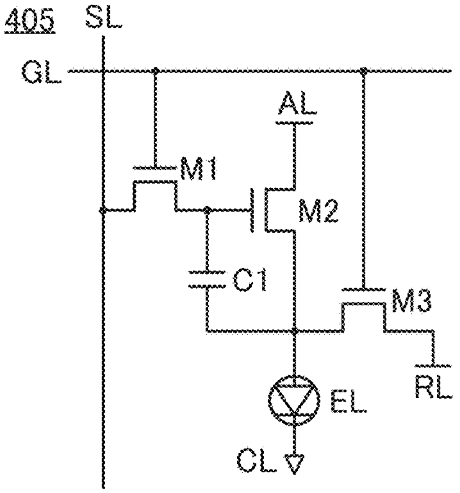
FIG. 29B to FIG. 29D are diagrams illustrating examples of a pixel circuit.

FIG. 29B illustrates an example of a circuit diagram of a pixel 405 that can be used as the subpixel 405R, the subpixel 405G, and the subpixel 405B. The pixel 405 includes a transistor M1, a transistor M2, a transistor M3, a capacitor C1, and a light-emitting device EL. The wiring GL and a wiring SL are electrically connected to the pixel 405. The wiring SL corresponds to any of the wiring SLR, the wiring SLG, and the wiring SLB illustrated in FIG. 29A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 405, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. For example, the transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 402 and a plurality of transistors included in the driver circuit portion 403, and OS transistors can be used as the other transistors. For example, OS transistors can be used as the transistors provided in the display portion 404, and LTPS transistors can be used as the transistors provided in the driver circuit portion 402 and the driver circuit portion 403.

As the OS transistor, a transistor including an oxide semiconductor in its semiconductor layer where a channel is formed can be used. The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example.

Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and smaller carrier density than silicon can achieve an extremely low off-state current. Thus, such a low off-state current enables long-term retention of charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 405.

Note that although the transistor is illustrated as an n-channel transistor in FIG. 29B, a p-channel transistor can also be used.

The transistors included in the pixel 405 are preferably formed to be arranged over the same substrate.

Note that transistors each including a pair of gates overlapping with each other with a semiconductor layer therebetween can be used as the transistors included in the pixel 405.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 29C:
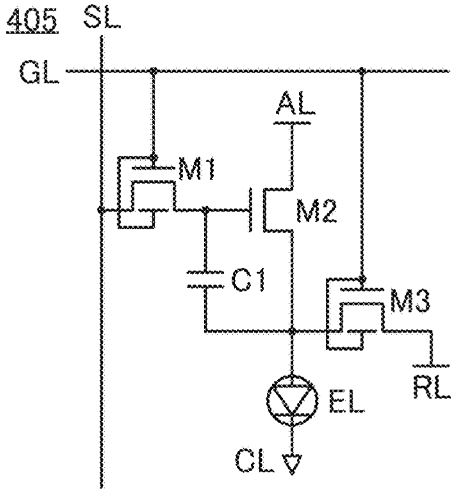

The pixel 405 illustrated in FIG. 29C is an example where a transistor including a pair of gates is used as each of the transistor M1 and the transistor M3. In each of the transistor M1 and the transistor M3, the pair of gates are electrically connected to each other. Such a structure can shorten the period in which data is written to the pixel 405.

Figure 29D:
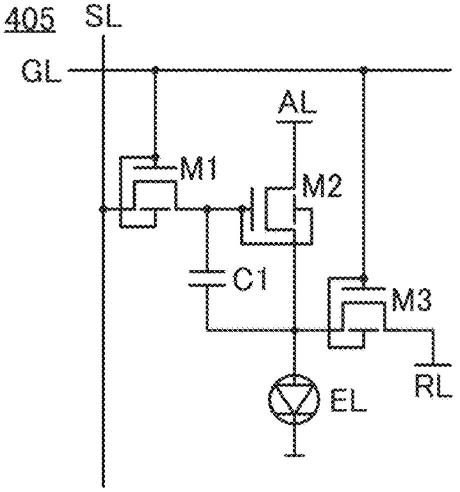

The pixel 405 illustrated in FIG. 29D is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

Structure Examples of Transistor

Cross-sectional structure examples of a transistor that can be used in the display panel described above are described below.

Structure Example 1

Figure 30A:
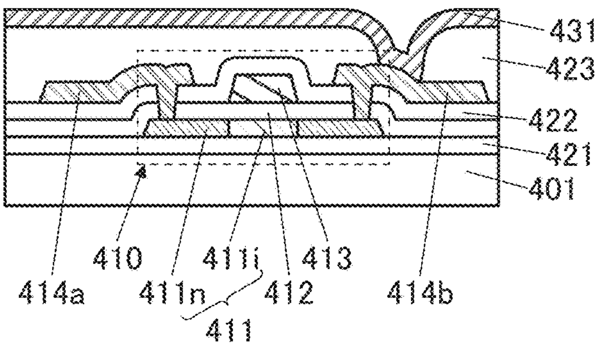
FIG. 30A to FIG. 30D are diagrams illustrating examples of a transistor.

FIG. 30A is a cross-sectional view including a transistor 410.

The transistor 410 is provided over a substrate 401 and contains polycrystalline silicon in its semiconductor layer. For example, the transistor 410 corresponds to the transistor M2 in the pixel 405. In other words, FIG. 30A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as agate insulating layer. Part of the conductive layer 413 functions as agate electrode.

Note that the semiconductor layer 411 can include a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are each electrically connected to the low-resistance region 411*n* in the opening portion provided in the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, and the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423.

Although not illustrated here, an EL layer and a common electrode can be stacked over the conductive layer 431.

Structure Example 2

Figure 30B:
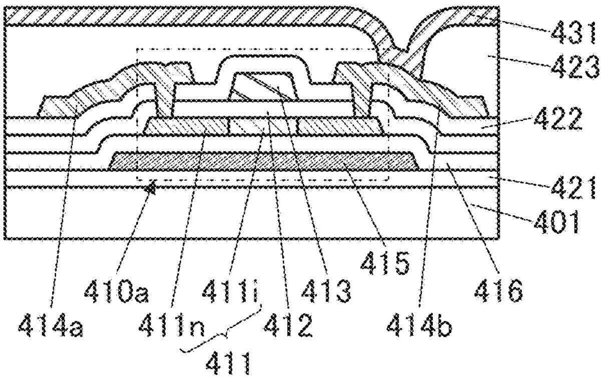

FIG. 30B illustrates a transistor 410*a* including a pair of gate electrodes. The transistor 410*a* illustrated in FIG. 30B is different from FIG. 30A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 30B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case where LTPS transistors are used as all of the transistors included in the pixel 405, the transistor 410 illustrated in FIG. 30A as an example or the transistor 410*a* illustrated in FIG. 30B as an example can be used. In this case, the transistors 410*a* may be used as all of the transistors included in the pixels 405, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 30C:
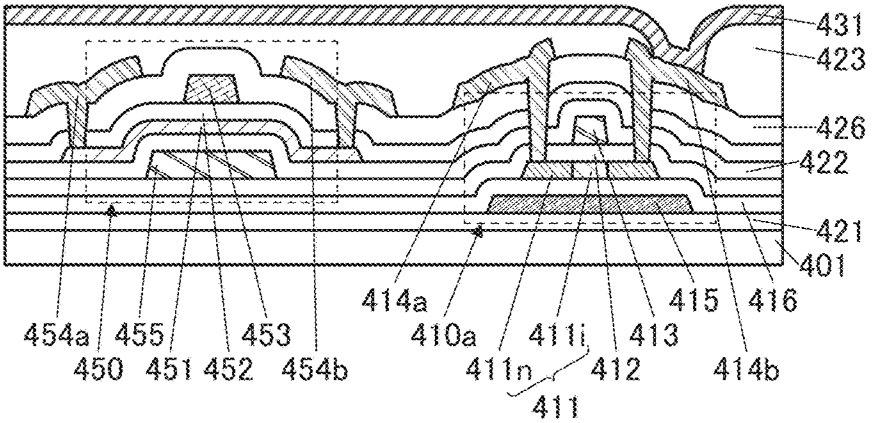

FIG. 30C is a schematic cross-sectional view including the transistor 410*a* and a transistor 450.

Structure example 1 described above can be referred to for the transistor 410*a*. Although an example using the transistor 410*a* is illustrated here, a structure including the transistor 410 and the transistor 450 or a structure including all the transistor 410, the transistor 410*a*, and the transistor 450 may alternatively be employed.

The transistor 450 is a transistor including metal oxide in its semiconductor layer. The structure in FIG. 30C illustrates an example in which the transistor 450 corresponds to the transistor M1 in the pixel 405 and the transistor 410*a* corresponds to the transistor M2. That is, FIG. 30C illustrates an example in which one of a source and a drain of the transistor 410*a* is electrically connected to the conductive layer 431.

Moreover, FIG. 30C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in opening portions provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. In FIG. 30C, the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 30C illustrates a structure where the conductive layer 413 and the conductive layer 455 are formed on the same plane (i.e., in contact with the top surface of the insulating layer 412) and contain the same metal element. This is preferable because the fabrication process can be simplified.

Figure 30D:
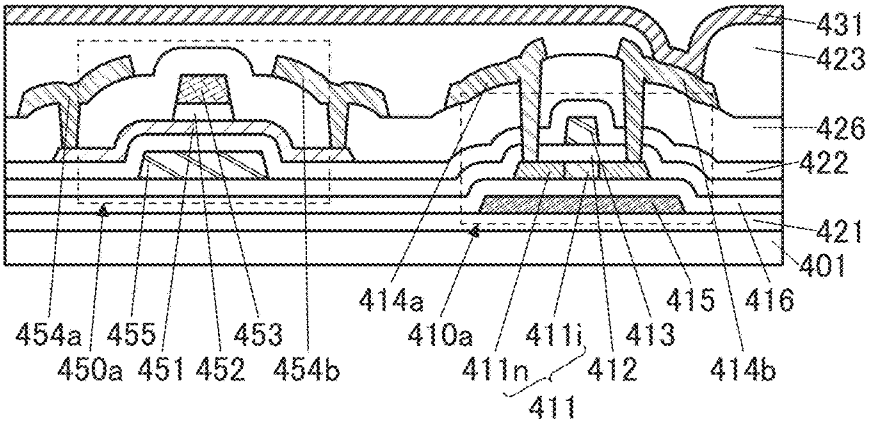

In the structure in FIG. 30C, the insulating layer 452 functioning as the first gate insulating layer of the transistor 450 covers an end portion of the semiconductor layer 451; however, the insulating layer 452 may be processed to have the same or substantially the same top surface shape as the conductive layer 453 as in the transistor 450*a* illustrated in FIG. 30D.

Note that in this specification and the like, the expression "top surface shapes are substantially the same" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such cases are also represented by the expression "top surface shapes are substantially the same".

Although the example in which the transistor 410*a* corresponds to the transistor M2 and is electrically connected to the pixel electrode is shown here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

This embodiment can be combined with the other embodiments as appropriate.

Embodiment 6

In this embodiment, a light-emitting device that can be used in the display panel of one embodiment of the present invention will be described.

Figure 31A:
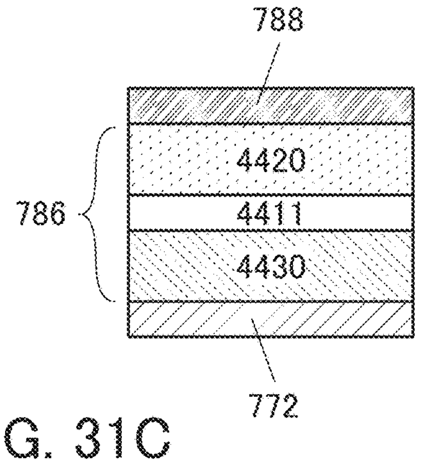
FIG. 31A to FIG. 31F are diagrams illustrating structure examples of a light-emitting device.

As illustrated in FIG. 31A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 31A is referred to as a single structure in this specification.

Figure 31B:
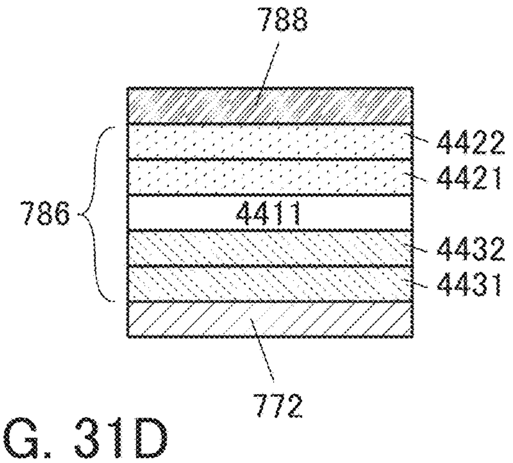

FIG. 31B is a variation example of the EL layer 786 included in the light-emitting device illustrated in FIG. 31A. Specifically, the light-emitting device illustrated in FIG. 31B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. When the lower electrode 772 is an anode and the upper electrode 788 is a cathode, for example, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layer structure, carriers can be efficiently injected to the light-emitting layer 4411, and the efficiency of the recombination of carriers in the light-emitting layer 4411 can be enhanced.

Figure 31C:
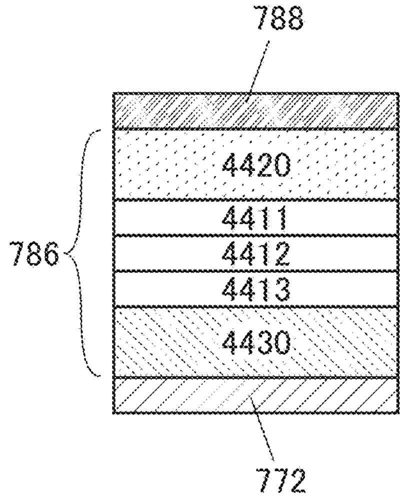
Figure 31D:
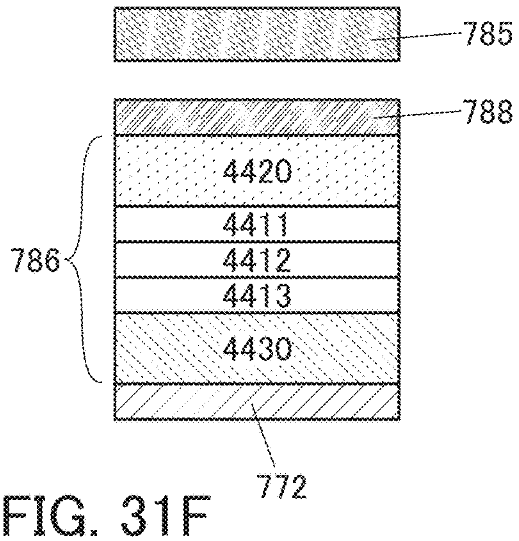

Note that the structure where a plurality of light-emitting layers (light-emitting layers 4411, 4412, and 4413) are provided between the layer 4420 and the layer 4430 as illustrated in FIG. 31C and FIG. 31D is also a variation of the single structure.

Figure 31E:
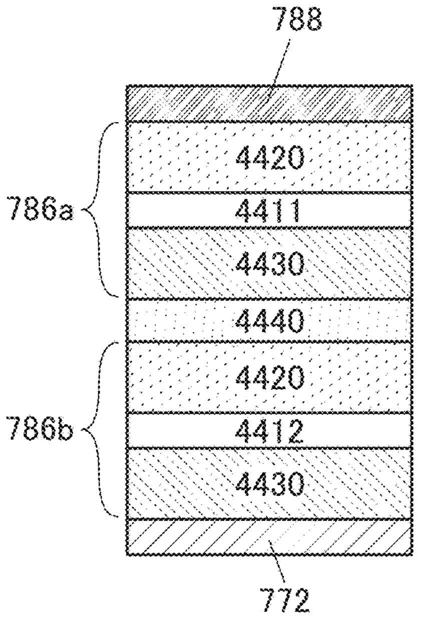
Figure 31F:
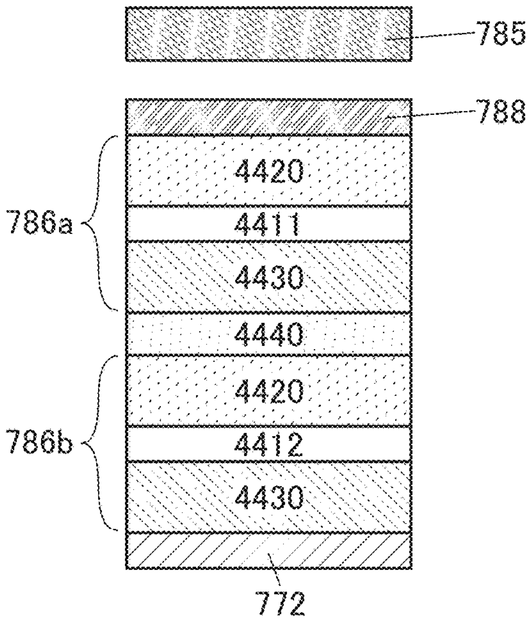

A structure in which a plurality of light-emitting units (an EL layer 786*a* and an EL layer 786*b*) are connected in series with a charge-generation layer 4440 therebetween as illustrated in FIG. 31E or FIG. 31F is referred to as a tandem structure in this specification. Note that a tandem structure may be referred to as a stack structure. The tandem structure enables a light-emitting device capable of high-luminance light emission.

In FIG. 31C and FIG. 31D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 31D.

Alternatively, light-emitting materials that emit light of different colors may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 31D. When white light passes through a color filter, light of a desired color can be obtained.

In FIG. 31E and FIG. 31F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 31F illustrates an example where the layer 785 is further provided. One or both of a color conversion layer and a color filter (coloring layer) can be used as the layer 785.

Note that also in FIG. 31C, FIG. 31D, FIG. 31E, and FIG. 31F, the layer 4420 and the layer 4430 may each have a stacked-layer structure of two or more layers as illustrated in FIG. 31B.

A structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting materials in the light-emitting layer. For example, when an emission color of a first light-emitting layer and an emission color of a second light-emitting layer are complementary colors, the light-emitting device can be configured to emit white light as a whole. When white light emission is obtained using three or more light-emitting layers, the light-emitting device is configured to emit white light as a whole by combining emission colors of the three or more light-emitting layers The light-emitting layer preferably contains two or more selected from light-emitting materials that emit light of red (R), green (G), blue (B), yellow (Y), orange (O), and the like. Alternatively, the light-emitting layer preferably contains two or more light-emitting materials that emit light containing two or more of spectral components of R, G, and B.

This embodiment can be combined with the other embodiments as appropriate.

Embodiment 7

In this embodiment, electronic devices of one embodiment of the present invention are described with reference to FIG. 32 to FIG. 34.

The electronic devices of this embodiment can each be used for the display system of one embodiment of the present invention. Specifically, each of the electronic devices can be used as a wearable display device or a terminal in the display system of one embodiment of the present invention.

Electronic devices of this embodiment each include the display panel of one embodiment of the present invention in a display portion. The display panel of one embodiment of the present invention can be easily increased in resolution and definition and can achieve high display quality. Thus, the display panel of one embodiment of the present invention can be used for a display portion of a variety of electronic devices.

Examples of the electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display panel of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With the use of such a display panel having one or both of high definition and high resolution, the electronic device can provide higher realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 32A to FIG. 32D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to reach a higher level of immersion. The electronic devices illustrated in FIG. 32A to FIG. 32D are each suitably used as a wearable display device in the display system of one embodiment of the present invention.

Figure 32A:
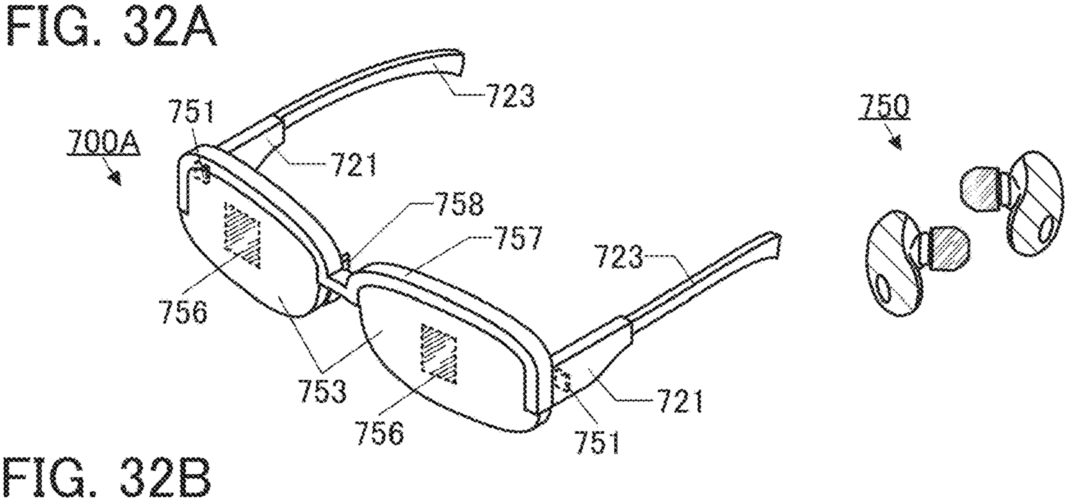
FIG. 32A to FIG. 32D are diagrams illustrating examples of electronic devices.
Figure 32B:
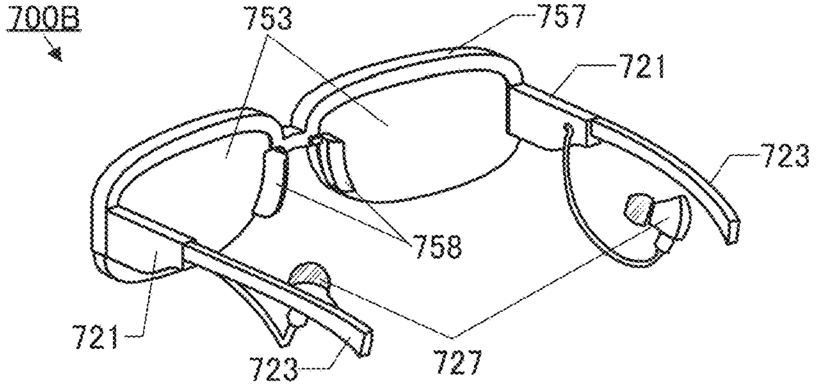

An electronic device 700A illustrated in FIG. 32A and an electronic device 700B illustrated in FIG. 32B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used as the display panels 751. Thus, the electronic devices are capable of performing ultrahigh-resolution display.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 32C:
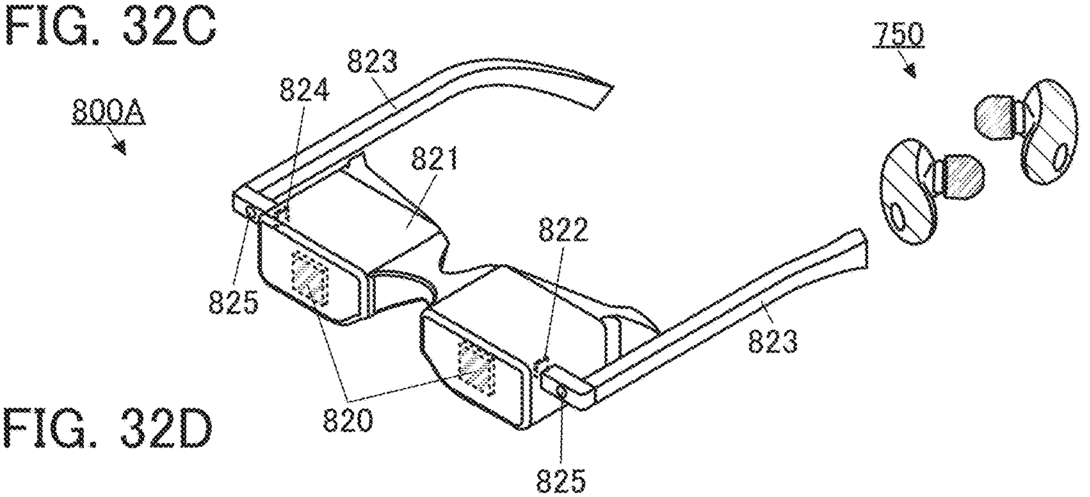
Figure 32D:
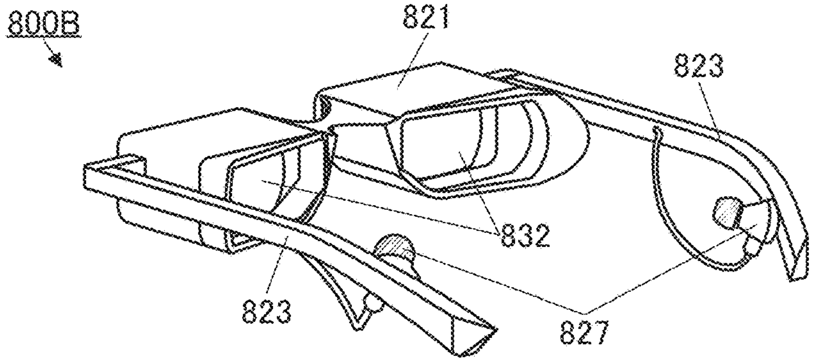

An electronic device 800A illustrated in FIG. 32C and an electronic device 800B illustrated in FIG. 32D each include a pair of display portions 820, a housing 821, a communication portion 822, a pair of wearing portions 823, a control portion 824, a pair of image capturing portions 825, and a pair of lenses 832.

The display panel of one embodiment of the present invention can be used in the display portions 820. Thus, the electronic devices are capable of performing ultrahigh-resolution display.

Such electronic devices provide an enhanced sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 32C or the like illustrates an example where the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a distance image sensor such as LIDAR (Light Detection and Ranging) can be used, for example.

By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the wearing portion 823 can employ a structure including the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 32A has a function of transmitting information to the earphones 750 with the wireless communication function. As another example, the electronic device 800A illustrated in FIG. 32C has a function of transmitting information to the earphones 750 with the wireless communication function.

The electronic device may include an earphone portion. The electronic device 700B in FIG. 32B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 32D includes earphone portions 827. For example, the earphone portion 827 and the control portion 824 are connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

The electronic devices illustrated in FIG. 33 and FIG. 34 are each favorably used as the terminal in the display system of one embodiment of the present invention.

Figure 33A:
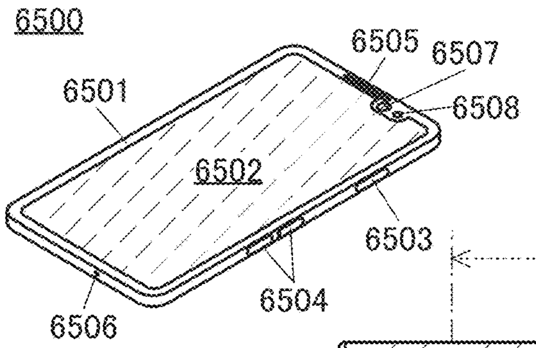
FIG. 33A to FIG. 33F are diagrams illustrating examples of electronic devices.

An electronic device 6500 illustrated in FIG. 33A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used for the display portion 6502.

Figure 33B:
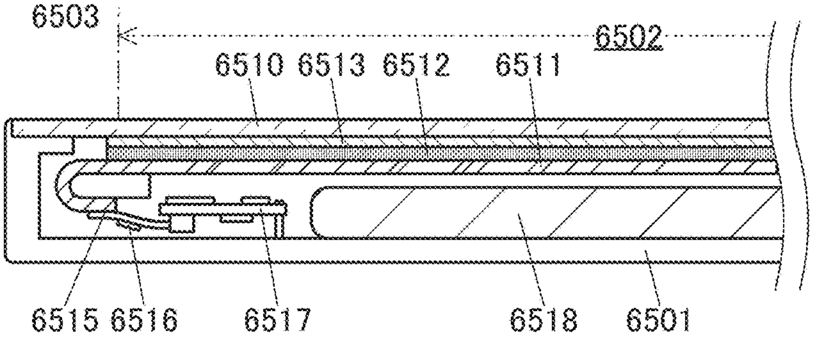

FIG. 33B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of a pixel portion, whereby an electronic device with a narrow bezel can be achieved.

Figure 33C:
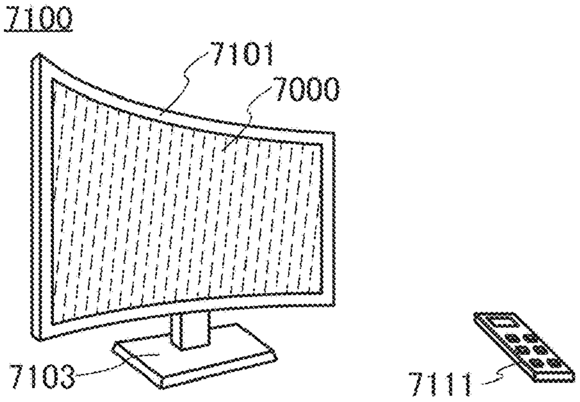

FIG. 33C illustrates an example of a television device. In a television device 7100, a display portion 7000 is incorporated in a housing 7101. Here, the housing 7101 is supported by a stand 7103.

The display panel of one embodiment of the present invention can be used for the display portion 7000.

Operation of the television device 7100 illustrated in FIG. 33C can be performed with an operation switch provided in the housing 7101 and a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 33D:
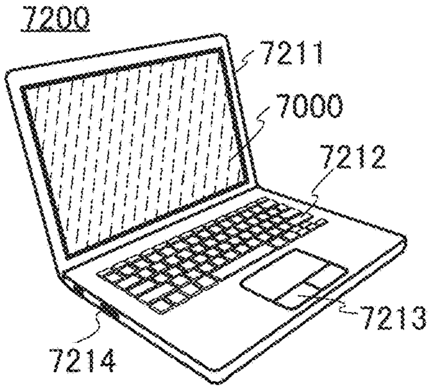

FIG. 33D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display panel of one embodiment of the present invention can be used for the display portion 7000.

Figure 33E:
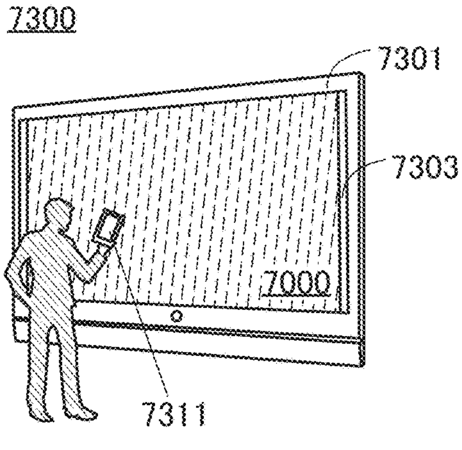
Figure 33F:
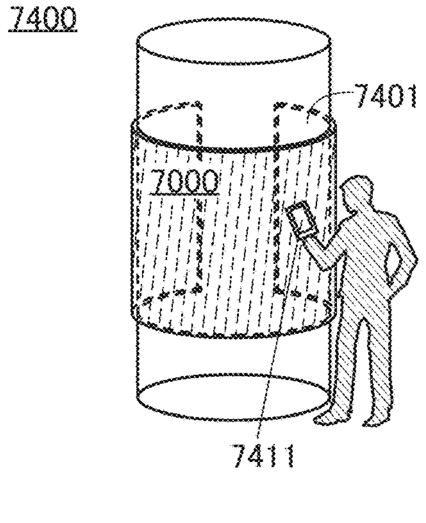

FIG. 33E and FIG. 33F illustrate examples of digital signage.

Digital signage 7300 illustrated in FIG. 33E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 33F is digital signage 7400 attached to a cylindrical pillar 7401. The digital signage 7400 includes the display portion 7000 provided along a curved surface of the pillar 7401.

The display panel of one embodiment of the present invention can be used for the display portion 7000 illustrated in each of FIG. 33E and FIG. 33F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 33E and FIG. 33F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 34A to FIG. 34G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display device of one embodiment of the present invention can be used for the display portion 9001 in FIG. 34A to FIG. 34G.

The electronic devices illustrated in FIG. 34A to FIG. 34G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 34A to FIG. 34G are described below.

Figure 34A:
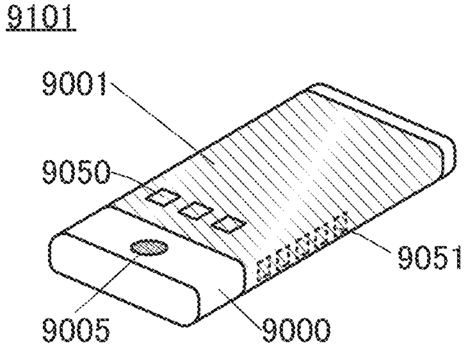
FIG. 34A to FIG. 34G are diagrams illustrating examples of electronic devices.

FIG. 34A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 34A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 34B:
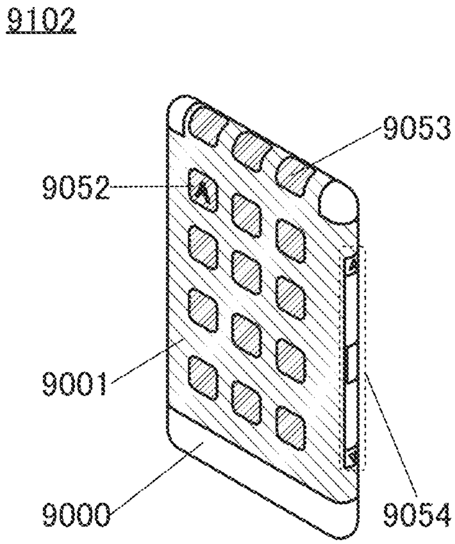

FIG. 34B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer the call, for example.

Figure 34C:
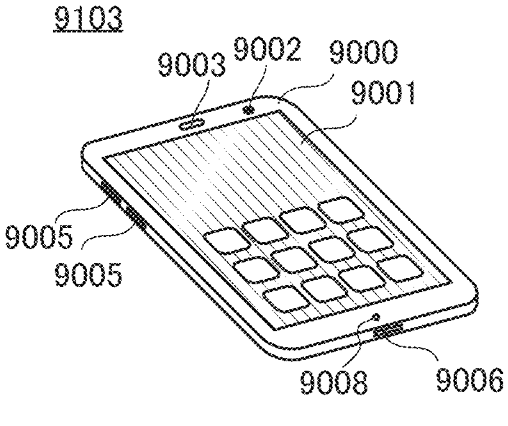

FIG. 34C is a perspective view illustrating a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 34D:
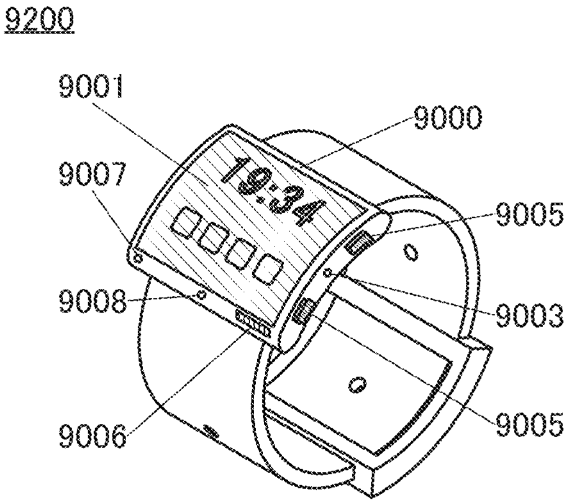

FIG. 34D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 34E:
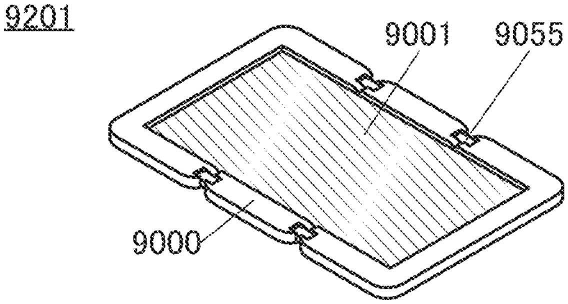
Figure 34F:
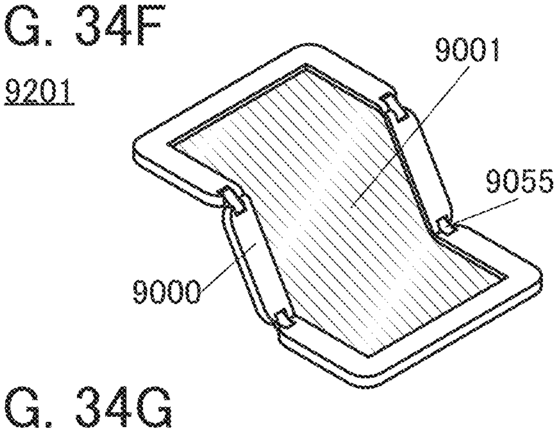
Figure 34G:
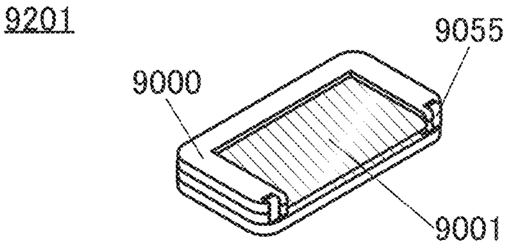

FIG. 34E to FIG. 34G are perspective views illustrating a foldable portable information terminal 9201. FIG. 34E is a perspective view of an opened state of the portable information terminal 9201, FIG. 34G is a perspective view of a folded state thereof, and FIG. 34F is a perspective view of a state in the middle of change from one of FIG. 34E and FIG. 34G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with any of the other embodiments as appropriate.

REFERENCE NUMERALS

AL: wiring, CL: wiring, GL: wiring, PS: subpixel, RL: wiring, SL: wiring, SLB: wiring, SLG: wiring, SLR: wiring, 10: display system, 11: server, 12: network, 20*a*: user, 20*b*: user, 20*c*: user, 20*d*: user, 20*e*: user, 20: user, 21A: terminal, 21*a*: terminal, 21B: terminal, 21*b*: terminal, 21C: terminal, 21*c*: terminal, 21*d*: terminal, 21*e*: terminal, 21*x*: terminal, 21: terminal, 22A: display device, 22*a*: display device, 22*b*: display device, 22*c*: display device, 22*d*: display device, 22*e*: display device, 22: display device, 25: avatars, 26: object, 31: communication portion, 32: communication portion, 41: display portion, 42: communication portion, 50: display portion, 51: housing, 52: communication portion, 53: band, 54: control portion, 55: camera portion, 56: power supply portion, 58: sensor portion, 59: second communication portion, 60: display portion, 61: housing, 62: communication portion, 63: wearing portion, 64: control portion, 65: camera portion, 66: power supply portion, 67: earphone, 68: sensor portion, 69: headphone portion, 70L: left hand, 70R: right hand, 100A: display panel, 100B: display panel, 100C: display panel, 100D: display panel, 100E: display panel, 100F: display panel, 100G: display panel, 100H: display panel, 100J: display panel, 100: display panel, 101: layer including transistor, 110*a*: subpixel, 110B: subpixel, 110*b*: subpixel, 110*c*: subpixel, 110*d*: subpixel, 110G: subpixel, 110R: subpixel, 110: pixel, 111*a*: pixel electrode, 111*b*: pixel electrode, 111*c*: pixel electrode, 111*d*: pixel electrode, 111: pixel electrode, 112*a*: conductive layer, 112*b*: conductive layer, 112*c*: conductive layer, 112*d*: conductive layer, 113*a*: first light-emitting unit, 113*b*: charge-generation layer, 113*c*: second light-emitting unit, 113: EL layer, 114: common layer, 115: common electrode, 117: light-blocking layer, 118*a*: sacrificial layer, 118*b*: sacrificial layer, 118: sacrificial layer, 120: substrate, 121: insulating layer, 122: resin layer, 123: conductive layer, 124*a*: pixel, 124*b*: pixel, 125: insulating layer, 126*a*: conductive layer, 126*b*: conductive layer, 126*c*: conductive layer, 126*d*: conductive layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131: protective layer, 132B: coloring layer, 132G: coloring layer, 132R: coloring layer, 133: lens array, 134: insulating layer, 135: space, 139: region, 140: connection portion, 142: adhesive layer, 150: light-receiving device, 151: substrate, 152: substrate, 153: insulating layer, 155: layer, 162: display portion, 164: circuit, 165: wiring, 166: conductive layer, 172: FPC, 173: IC, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 400: display panel, 401: substrate, 402: driver circuit portion, 403: driver circuit portion, 404: display portion, 405B: subpixel, 405G: subpixel, 405R: subpixel, 405: pixel, 410*a*: transistor, 410: transistor, 411*i*: channel formation region, 411*n*: low-resistance region, 411: semiconductor layer, 412: insulating layer, 413: conductive layer, 414*a*: conductive layer, 414*b*: conductive layer, 415: conductive layer, 416: insulating layer, 421: insulating layer, 422: insulating layer, 423: insulating layer, 426: insulating layer, 430: pixel, 431: conductive layer, 450*a*: transistor, 450: transistor, 451: semiconductor layer, 452: insulating layer, 453: conductive layer, 454*a*: conductive layer, 454*b*: conductive layer, 455: conductive layer, 700A: electronic device, 700B: electronic device, 721: housing, 723: wearing portion, 727: earphone portion, 750: earphone, 751: display panel, 753: optical member, 756: display region, 757: frame, 758: nose pad, 772: lower electrode, 785: layer, 786*a*: EL layer, 786*b*: EL layer, 786: EL layer, 788: upper electrode, 800A: electronic device, 800B: electronic device, 820: display portion, 821: housing, 822: communication portion, 823: wearing portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display device comprising a display portion, a first communication portion, and a wearing portion,
- wherein the wearing portion is configured to be worn on a head,
- wherein the first communication portion has a wireless communication function,
- wherein the display portion is capable of full-color display,
- wherein the display portion comprises a first subpixel,
- wherein the first subpixel comprises a first light-emitting device and a first coloring layer transmitting blue light,
- wherein the first light-emitting device comprises a first pixel electrode, a first EL layer over the first pixel electrode, and a common electrode over the first EL layer,
- wherein the first EL layer comprises a first light-emitting material emitting blue light and a second light-emitting material emitting light having a longer wavelength than blue light,
- wherein the first EL layer comprises a first light-emitting unit over the first pixel electrode, a charge-generation layer over the first light-emitting unit, and a second light-emitting unit over the charge-generation layer,
- wherein in an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5, and
- wherein the first luminance is any value higher than 0 $cd/m^2$ and lower than 1 $cd/m^2$.

2. The display device according to claim 1,
- wherein the display portion comprises a second subpixel,
- wherein the second subpixel comprises a second light-emitting device and a second coloring layer transmitting light having a different color from the first coloring layer transmitting blue light,
- wherein the second light-emitting device comprises a second pixel electrode, a second EL layer over the second pixel electrode, and the common electrode over the second EL layer,
- wherein the first EL layer has the same structure as the second EL layer, and
- wherein the first EL layer and the second EL layer are separated from each other.

3. A display device comprising a display portion, a first communication portion, and a wearing portion,
- wherein the wearing portion configured to be worn on a head,
- wherein the first communication portion has a wireless communication function,
- wherein the display portion is capable of full-color display,
- wherein the display portion comprises a first subpixel and a second subpixel,
- wherein the first subpixel comprises a first light-emitting device and a first coloring layer transmitting blue light,
- wherein the second subpixel comprises a second light-emitting device and a second coloring layer transmitting light having a different color from the first coloring layer transmitting blue light,
- wherein the first light-emitting device comprises a first pixel electrode, a first EL layer over the first pixel electrode, and a common electrode over the first EL layer,
- wherein the second light-emitting device comprises a second pixel electrode, the first EL layer over the second pixel electrode, and the common electrode over the first EL layer,
- wherein the first EL layer comprises a first light-emitting unit over the first pixel electrode, a charge-generation layer over the first light-emitting unit, and a second light-emitting unit over the charge-generation layer,
- wherein in an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5, and
- wherein the first luminance is any value higher than 0 $cd/m^2$ and lower than 1 $cd/m^2$.

4. A display device comprising a display portion, a first communication portion, and a wearing portion,
- wherein the wearing portion is configured to be worn on a head, wherein the first communication portion has a wireless communication function, wherein the display portion is capable of full-color display, wherein the display portion comprises a first subpixel and a second subpixel, wherein the first subpixel comprises a first light-emitting device and a first coloring layer transmitting blue light, wherein the second subpixel comprises a second light-emitting device and a second coloring layer transmitting light of a different color from the first coloring layer transmitting blue light, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the first EL layer has the same structure as the second EL layer, wherein the first EL layer and the second EL layer are separated from each other, wherein the first EL layer comprises a first light-emitting unit over the first pixel electrode, a charge-generation layer over the first light-emitting unit, and a second light-emitting unit over the charge-generation layer, wherein in an emission spectrum obtained with the display portion performing blue display at a first luminance, when an intensity of a first emission peak at a wavelength higher than or equal to 400 nm and lower than 500 nm is regarded as 1, an intensity of a second emission peak at a wavelength higher than or equal to 500 nm and lower than or equal to 700 nm in the emission spectrum is lower than or equal to 0.5, and wherein the first luminance is any value higher than 0 $cd/m^2$ and lower than 1 $cd/m^2$.

5. The display device according to claim 4, wherein the first light-emitting device comprises a common layer between the first EL layer and the common electrode, wherein the second light-emitting device comprises the common layer between the second EL layer and the common electrode, and wherein the common layer comprises at least one of a hole-injection layer, a hole-transport layer, a hole-blocking layer, an electron-blocking layer, an electron-transport layer, and an electron-injection layer.

6. The display device according to claim 4, wherein the display portion comprises a first insulating layer, wherein the first insulating layer covers a side surface of the first EL layer and a side surface of the second EL layer, and wherein the common electrode is positioned over the first insulating layer.

7. The display device according to claim 6, wherein the display portion comprises a second insulating layer, wherein the first insulating layer comprises an inorganic material, and wherein the second insulating layer comprises an organic material and overlaps with the side surface of the first EL layer and the side surface of the second EL layer with the first insulating layer therebetween.

8. The display device according to claim 1, wherein the display portion has a resolution of 1000 ppi or more.

9. The display device according to claim 1, wherein the first subpixel comprises a lens overlapping with the first light-emitting device and the first coloring layer transmitting blue light.

10. The display device according to claim 1, wherein the first pixel electrode comprises a material reflecting visible light.

11. The display device according to claim 1, wherein the first subpixel comprises a reflective layer, wherein the first pixel electrode comprises a material transmitting visible light, and wherein the first pixel electrode is positioned between the reflective layer and the first EL layer.

12. The display device according to claim 1, wherein an end portion of the first pixel electrode has a tapered shape.

13. The display device according to claim 1, wherein the first EL layer covers an end portion of the first pixel electrode.

14. A display system comprising a server, a terminal, and the display device according to claim 1, wherein the terminal comprises a second communication portion and a third communication portion, wherein the second communication portion is configured to execute communication with the server through a network, and wherein the third communication portion is configured to execute communication with the first communication portion.

15. The display device according to claim 3, wherein the display portion has a resolution of 1000 ppi or more.

16. The display device according to claim 3, wherein the first subpixel comprises a lens overlapping with the first light-emitting device and the first coloring layer transmitting blue light.

17. The display device according to claim 3, wherein the first pixel electrode comprises a material reflecting visible light.

18. The display device according to claim 3, wherein the first subpixel comprises a reflective layer, wherein the first pixel electrode comprises a material transmitting visible light, and wherein the first pixel electrode is positioned between the reflective layer and the first EL layer.

19. The display device according to claim 3, wherein an end portion of the first pixel electrode has a tapered shape.

20. The display device according to claim 3, wherein the first EL layer covers an end portion of the first pixel electrode.

21. A display system comprising a server, a terminal, and the display device according to claim 3, wherein the terminal comprises a second communication portion and a third communication portion, wherein the second communication portion is configured to execute communication with the server through a network, and wherein the third communication portion is configured to execute communication with the first communication portion.

* * * * *